US010078328B1

(12) United States Patent
Slater

(10) Patent No.: US 10,078,328 B1
(45) Date of Patent: Sep. 18, 2018

(54) SOLAR ARRAY REMOTE ACOUSTIC SENSING (SARAS)

(71) Applicant: Dan Slater, La Habra Heights, CA (US)

(72) Inventor: Dan Slater, La Habra Heights, CA (US)

(*) Notice: Subject to any disclaimer, the term of this patent is extended or adjusted under 35 U.S.C. 154(b) by 0 days.

(21) Appl. No.: 15/230,369

(22) Filed: Aug. 6, 2016

Related U.S. Application Data

(63) Continuation-in-part of application No. 14/463,221, filed on Aug. 19, 2014.

(51) Int. Cl.
| | |
|---|---|
| G05D 1/00 | (2006.01) |
| G01H 9/00 | (2006.01) |
| B64G 1/44 | (2006.01) |
| B64G 1/52 | (2006.01) |
| B64G 5/00 | (2006.01) |
| B64B 1/40 | (2006.01) |
| H02J 3/38 | (2006.01) |
| H02S 20/30 | (2014.01) |

(52) U.S. Cl.
CPC ............. *G05D 1/0022* (2013.01); *B64B 1/40* (2013.01); *B64G 1/443* (2013.01); *B64G 1/52* (2013.01); *B64G 5/00* (2013.01); *G01H 9/00* (2013.01); *H02J 3/383* (2013.01); *H02S 20/30* (2014.12); *B64D 2211/00* (2013.01)

(58) Field of Classification Search
CPC .... H04N 5/30; G01S 7/52023; G05D 1/0022; H02S 20/30; B64B 1/40; B64G 1/443; B64G 1/52; B64G 5/00; G01H 9/00; H02J 3/383; B64D 2211/00

USPC .......................................................... 348/163
See application file for complete search history.

(56) References Cited

U.S. PATENT DOCUMENTS

| | | | | |
|---|---|---|---|---|
| 3,311,748 A | * | 3/1967 | Volpe ...................... | G01S 3/783 250/203.4 |
| 2007/0121963 A1 | * | 5/2007 | Liu ......................... | G10L 25/69 381/98 |
| 2008/0151694 A1 | * | 6/2008 | Slater ....................... | G01H 9/00 367/178 |
| 2013/0260505 A1 | * | 10/2013 | Bedell ..................... | H01L 27/142 438/67 |
| 2015/0128733 A1 | * | 5/2015 | Taylor ...................... | H02J 7/025 73/865.8 |
| 2016/0146921 A1 | * | 5/2016 | Jeong ....................... | G01S 3/7861 250/203.4 |
| 2017/0291474 A1 | * | 10/2017 | Guo ....................... | B60H 1/3222 |

* cited by examiner

*Primary Examiner* — William C Vaughn, Jr.
*Assistant Examiner* — Jae N Noh
(74) *Attorney, Agent, or Firm* — Fitzsimmons IP Law

(57) ABSTRACT

Devices and method for obtaining or providing listening or detection of audio frequency modulated optical energy including, involving, utilizing, facilitating and/or providing an interface (including electronics) configured such that when operatively connected to individual or groups of elements of one or more solar arrays (or cells, photodetectors, or other optical sensor device), respectively, the interface and the solar array(s) together function, responsive to sensed audio-frequency light intensity fluctuations of an optical signal received by said solar array(s), as a remote acoustic sensor (RAS)-based device.

20 Claims, 25 Drawing Sheets

6 sided full sphere video camera
Add a 6 sided RAS for immersive audio

Cubesat with Solar arrays on all 6 sides

Solar concentrator array 35 x 24 x 2 cm (14"x10"x1")

Solar concentrator photovoltaic element

SOLAR ARRAY REMOTE ACOUSTIC SENSING (SARAS)

CROSS-REFERENCES TO RELATED APPLICATIONS

This application is related to U.S. patent application Ser. No. 11/644,374, entitled "Passive Long Range Acoustic Sensor", filed on Dec. 21, 2006 (now U.S. Pat. No. 7,551,519, issued on Jun. 23, 2009), which is hereby incorporated by reference.

This application is a continuation-in-part of U.S. patent application Ser. No. 14/463,221, entitled "Electrosound Camera", filed on Aug. 19, 2014, which is hereby incorporated by reference.

TECHNICAL FIELD

The invention relates generally to sensing technologies and, in particular, to systems, devices and methods for obtaining or providing acousto-optic signatures utilizing one or more solar arrays or cells, photodetectors, or other optical sensor device, mechanism, or capability.

BACKGROUND ART

There are circumstances when human senses are incapable of, or incompetent (e.g., impaired), obstructed, or vulnerable to interference (of various sorts) in relation to, acquiring information relevant to an environment or place at or near a person's location or, by way of another example, in relation to a tracked, projected or otherwise determined path along with the person is walking, driving, etc. Even with the aid of conventional listening devices (e.g., microphones, hearing aids) and viewing devices (e.g., cameras, corrective lenses), in some circumstances even persons without hearing or vision impairments are prevented from acquiring or at least timely acquiring such information, which in some instances may be of critical importance or interest to that person. For example, a person who is listening to music while driving, or walking or bicycling while wearing headphones, may not hear or see an emergency (or other motorized) vehicle approaching from around a sharp corner in the road in sufficient time or until it is too late to avoid a collision. Human senses and conventional listening and viewing devices alike, in some circumstances may not (or cannot) sense or detect objects, events or phenomena of actual or potential interest or concern to a person, or sounds or information associated with or related to such objects, events or phenomena, even if the person is attempting to hear or see (such objects, events or phenomena) utilizing all or various of such senses and conventional listening and viewing devices as may be available. In some environments and circumstances, one or more of the aforementioned human senses and conventional listening and viewing devices may not be suitable for sensing (or detecting) in relation to acquiring sounds or information associated with or related to such objects, events or phenomena.

It would be helpful to be able to provide a listening device, system or methodology that facilitates sensing (or detecting) of or in relation to such objects, events or phenomena, and obtaining or providing sounds or information associated with or related to such objects, events or phenomena.

It would be helpful to be able to provide a listening device or system that provides aural capability (e.g., short range aural capability, long range aural capability, or both) in a manner other than, and independent of whether the device or system utilizes, conventional acoustic or vibration sensing (or detecting) responsive to the movement of air or other molecules.

It would be helpful in some circumstances to be able to provide a listening device or system capable of operation in a vacuum or other environment entirely or substantially devoid of matter (or atmosphere).

It is contemplated and envisioned by the inventor(s) of the present invention(s) that it would be helpful in some circumstances to be able to provide a listening device or system (e.g., such as described herein) to a device or system that does not generate or otherwise provide or obtain a viewing output (e.g., captured images).

It is contemplated and envisioned by the inventor(s) of the present invention(s) that it would be helpful in some or other circumstances to be able to provide a listening device or system (e.g., such as described herein) to a device or system that is capable of or adaptable to be capable of generating or otherwise providing or obtaining a viewing output (e.g., captured images).

It is contemplated and envisioned by the inventor(s) of the present invention(s) that it would be helpful to be able to provide a listening device or system (e.g., such as described herein) to one or more of the following: a device or system for providing or obtaining viewing and/or listening outputs, signals, or content; a camera or other image capturing device or system; a device or system for providing, obtaining, utilizing, generating or reproducing sounds; hearing aids and hearing augmentation devices and systems; devices and systems facilitating or utilizing sensory enhancement and/or sensed feedback; headphones; wearable technology items or apparel; personal computing and/or communications devices or peripherals; warning or detection devices or systems; safety and other specialized devices or systems; detection or measurement (and analysis) devices and systems involving, for example, aerospace, diagnostic, medical, meteorological, military, security, or space applications.

In relation to the aerospace industry, for example, many interesting and potentially observable things can happen during an aerospace vehicle flight test. On board sensors provide a good view of the vehicle state assuming that radio telemetry links can be maintained or on board recorders can be recovered. Motion picture film cameras have been used onboard test and chase aircraft to provide visual records of flight test events. Recoverable film camera pods were sometimes carried on early space launch vehicles but use was limited by the technical complexities and expense of post flight film recovery. These camera pods observed rocket engine plume characteristics, staging, engine start and shutdown, propellant tank ullage, spacecraft deployment and other flight phenomena. Space launch vehicles now often carry non recoverable television cameras with real time video downlinks.

Additional flight test information can be remotely obtained using space, airborne, ship and ground based sensors. Space assets and aircraft to a lesser extent are difficult to access and very costly to use. In the past, ground based flight test sensors were primarily large tracking radars and long range optics. These systems are government owned with access being expensive and difficult or impossible to obtain for private use. Moreover, the high acquisition and operating costs and operational complexities of currently available long range telescopic camera systems frequently result in an undersampling of desired imagery and associated spatial, temporal and geometric data.

Cinema started in the late 1800's with the introduction of the moving picture. This was followed shortly thereafter with color movies. Next was the introduction of recorded sound with early experiments starting around 1900, major film studio interest by 1927 and becoming very popular by 1930. For a long time the sound recordings were monophonic until the production of the stereophonic Disney film "Fantasia", in 1947. By 1953 stereophonic sound was becoming commonplace and next was multichannel audio recording. Essentially all Hollywood feature films produced since 1930 include a sound track and now virtually all feature films include multichannel audio. Of great importance typically in modern cinema is the technical production of high resolution color imagery of excellent quality in addition to a high quality synchronized multichannel sound track.

In relation to a camera or other image capturing device or system having aural as well as visual capabilities, it would be helpful to be able to provide one or more of: improved sensor performance and/or utilization, better low light (imaging) sensitivity, and simplified associated electronics.

Electro-optical remote sensing satellites are increasingly able to provide high-resolution video observations of terrestrial activity. On orbit videos show the dynamic spatial and temporal characteristics of both cultural and natural activity. It would be interesting and/or useful if such satellites could also remotely sense (or provide or in some manner facilitate remote sensing of) associated terrestrial acoustic activity. The fusion of visual and aural observations would improve an overall understanding of a scene and provide a more cinema-like viewing experience. Remote Acoustic Sensing (RAS) technology potentially provides a pathway for obtaining/sensing acoustic observations of planetary surface activity from a satellite, spacecraft, or other space based vehicle or device.

As is well known, sound—the brain's interpretation of a modulated frequency sensed by the human ear with air particles being the carrier—does not propagate through a vacuum. In a vacuum, air is absent but photons can carry corresponding or equivalent information content. The ear cannot sense photons, but optical signals and their information content can be converted into an acoustic signal, (referred to herein as an "acousto-optic signature") that provides (e.g., facilitates obtaining or reproduction, or is otherwise representative, of) information content corresponding or equivalent to that of the optical signals.

Remote Acoustic Sensing (RAS) (e.g., applied to RASSat as described herein—see below) is a form of a distributed microphone system that separates an acoustic sensor into two (or more) spatially separated elements utilizes/involves, for example, a naturally formed in situ terrestrial acousto-optic modulator (AOM) and a remote readout sensor. In the case of a space-based remote readout sensor, an attempt to obtain acoustic observations (e.g., attempting to hear terrestrial sounds from an orbiting spacecraft) utilizing RAS would not require acoustic wave propagation in space but instead passively couples the AOM to the readout sensor over orbital distances using ambient light fields. Acoustic wave propagation is only required between the sound source and the in situ AOM and not to the readout sensor.

In the case of a space-based remote readout sensor, utilization of conventional RAS (as presently known) to obtain acoustic observations is problematic in respect to, among other things, the logistics, cost and intrusiveness of adding/integrating required/additional sensors and wiring to a spacecraft, for example, particularly on multiple spacecraft sides and locations. (See e.g., FIGS. 11 and 12 which show a six-sided full sphere video camera and a CubeSat with solar arrays on all six sides, respectively.)

It would be helpful to be able to provide devices and methods for obtaining or providing listening or detection of audio frequency modulated optical energy in relation to and/or facilitating one or more of methodologies/technologies described herein.

SUMMARY OF THE INVENTION

In example embodiments and implementations, one or more illuminated and/or luminous objects (e.g., including an object that is illuminated by ambient optical, microwave or radio wave electromagnetic energy and/or self-luminous) are sensed. In example embodiments and implementations, nearby vicinities or environments in relation to the objects(s) are additionally (or alternatively) sensed. The illuminated and/or luminous objects can be, or can include portions of, man made vehicles. For example, flight vehicles produce sounds and vibrations that modulate the local electromagnetic environment. These audio frequency modulations can be sensed in some circumstances by or utilizing passive optical and radio wave detectors. Acousto-optic sensing methods can be used, e.g., optical Remote Acoustic Sensing (RAS) can be used to detect launch vehicle acoustic emissions as described herein. In example and envisioned embodiments or implementations, acousto-optic and/or radioacoustic sensing technologies are utilized, for example, a radioacoustic sensor using passive micro-Doppler radar techniques. By way of another example, visual, aural and radar observations of a rocket launch can be utilized. The synchronized high resolution picture and sound combination produces a cinema like viewing and listening experience useful in various applications and industries such as, for example, aerospace and cinema.

Example embodiments described herein involve a device or system that provides aural capability (e.g., short range aural capability, long range aural capability, or both). In example implementations, such a device or system provides or facilitates aural capability in a manner other than, and independent of whether the device or system utilizes, conventional acoustic or vibration sensing (or detecting) responsive to the movement of air or other molecules. In example implementations, such a device or system includes or utilizes one or more electromagnetic signal (energy) detection-facilitated audio frequency modulation sensing (AFMS) devices and is capable of operation in a vacuum or other environment entirely or substantially devoid of matter (or atmosphere). Such sensing devices include, for example, both optical and radio frequency (RF) "acoustic sensing" devices which utilize detection of audio frequency modulated signals (e.g., passive reflections from a vehicle), and are also sometimes referred to herein as Remote Acoustic Sensing (RAS) devices. As discussed below in greater detail, radio frequency (RF) RAS devices can detect other types of modulations as well. In some implementations, one or more RAS devices can be utilized, or adapted to be utilized, as a "raw detector" directly providing a listening output that is not filtered or processed.

The term RAS as used herein is not intended to be associated with sensor performance or functionality that is necessarily preclusive of utilizing such a sensor at distances not considered to be remote, and to the extent those of skill in the art might understand or believe sensors referred to as "remote acoustic sensors" or "RAS" (or sensing referred to as "remote acoustic sensing") to be limited in use or sensing capabilities only to remote sensing, it is the express intent of the inventor(s) that this term not be so limited even if it is contrary to any such shared understanding or belief, commonly understood meaning, or ordinary usage.)

Some example embodiments described herein involve a device or system that provides long range aural capability. Such devices or systems can include or utilize, for example, one or more acoustic sensing device(s) and a telescopic lens, optics, or other optical component add-ons.

Not all embodiments of the invention(s) herein facilitate or utilize long range aural capability. A device or system that does not provide long range aural capability can include or utilize, for example, one or more acoustic sensing device(s) (e.g., a RAS detector with no telescopic or other optical component add-ons).

Not all embodiments of the invention(s) herein include or utilize a telescopic lens, optics, or other optical component add-ons. RAS sensors can additionally or alternatively be utilized with normal and wide angle lenses, or without any lenses.

In relation to human sensory observable viewing and listening, in example embodiments and implementations, a viewing output, a listening output, both, or only one or the other is generated or provided.

Example embodiments described herein involve a device or system that generates or provides a viewing output (e.g., images captured by one or more imaging sensors) and/or a listening output (e.g., sound and/or information extracted or otherwise obtained from sensed audio frequency modulated signals as described herein). For example, a means for presenting the viewing and listening outputs as a sound movie including time synchronized single or multichannel audio can be provided by or utilize one or more of the devices or systems referenced herein or components thereof. In example embodiments and implementations, one or more acoustic sensing devices (e.g., AFMS device(s) such as described herein) generate or facilitate providing a listening output. The one or more acoustic sensing devices include, for example: an acoustic sensing device including or adapted to utilize optical and/or radio wave detectors; one or more sensors, transducers, and/or other mechanisms responsive to energy in the optical and/or radio frequency electromagnetic spectral regions; and/or one or more sensing technologies that operate in optical and/or radio frequency electromagnetic spectral regions. In example embodiments and implementations, the one or more acoustic sensing devices include (or consist of) one or more multispectral sensing devices that facilitate sensing in multiple different electromagnetic spectral regions (e.g., in both optical and radio frequency (RF) electromagnetic spectral regions). In other example embodiments and implementations, the one or more acoustic sensing devices include (or consist of) sensing devices that facilitate sensing only in radio frequency (RF) electromagnetic spectral regions.

In an example embodiment, a method for obtaining or providing listening includes: utilizing one or more sensing devices (e.g., electromagnetic signal (energy) detection-facilitated audio frequency modulation sensing (AFMS) devices) to detect or obtain audio frequency modulated signals received from or associated with one or more illuminated and/or luminous objects; and generating or providing a listening output of the sensing device(s) (e.g., an audio signal), the listening output including signals and/or information indicating or providing a representation of a disturbance to an electromagnetic field or fields at or associated with at least one of said one or more objects, the disturbance being or including an audio frequency modulation of a signal from or associated with (e.g., received from) at least one of said one or more objects.

Example embodiments described herein involve or facilitate providing a listening device or system (e.g., such as described herein) to a device or system that does not generate or otherwise provide or obtain a viewing output (e.g., captured images).

Other example embodiments described herein involve or facilitate providing a listening device or system (e.g., such as described herein) to a device or system that is capable of or adaptable to be capable of generating or otherwise providing or obtaining a viewing output (e.g., captured images).

Example embodiments described herein involve or facilitate providing a listening device or system (e.g., such as described herein) to one or more of the following: a device or system for providing or obtaining viewing and/or listening outputs, signals, or content; a camera or other image capturing device or system; a device or system for providing, obtaining, utilizing, generating or reproducing sounds (e.g., listening devices, technologies utilized by musicians, composers, editors, or producers of music or soundtracks, in sound design, or involving audio media or listening outputs, signals, or content in general); hearing aids and hearing augmentation devices and systems; devices and systems facilitating or utilizing sensory enhancement and/or sensed feedback (e.g., a device or system for providing "extra-sensory" inputs/information to operators of vehicles); headphones; wearable technology items or apparel (e.g., wrist watches, head gear, articles of clothing); personal computing and/or communications devices or peripherals (e.g., laptop and notebook computers, tablets, smartphones); warning or detection devices or systems (e.g., an aircraft detection device or system); safety and other specialized devices or systems (e.g., potentially benefiting visually and/or hearing impaired persons); detection or measurement (and analysis) devices and systems involving, for example, aerospace, diagnostic, medical, meteorological, military, security, or space applications.

In an example embodiment, a device for obtaining or providing listening includes (or consists of): an element of (human or non-human) industry or manufacture including or adapted to utilize or operatively interface with one or more electromagnetic signal (energy) detection-facilitated audio frequency modulation sensing (AFMS) devices, said AFMS device(s) being adapted to obtain audio frequency modulated signals received from or associated with one or more illuminated and/or luminous objects (e.g., including an object that is illuminated by ambient optical, microwave or radio wave electromagnetic energy and/or self-luminous), said element and AFMS device(s) and associated electronics being adapted to generate or facilitate providing a listening output of the AFMS device(s), the listening output including signals and/or information indicating or providing a representation of a disturbance to an electromagnetic field or fields at or associated with at least one of said one or more objects, the disturbance being or including an audio frequency modulation of a signal from or associated with at least one of said one or more objects.

As previously indicated, example embodiments described herein can involve a device or system that generates or provides a viewing output (e.g., video) and a listening output (e.g., audio). Example embodiments described herein involve or facilitate an image capturing device or system adapted to capture images of one or more objects to provide video (and/or other forms of viewing content) and to obtain audio (and/or other forms of listening content) extracted from other images of, or sensor outputs in relation to, the object(s) and in time synchronization with the video images.

Viewing content is or can be provided utilizing visual media, for example, video, film, or another mechanism for viewing or presenting viewing content. Viewing content can include or utilize a sequence of images (e.g., video, film, digital, or other images).

The terms "video", "video output" and "viewing output" as used herein are not limited to any particular form of visual media be it video, film, or another mechanism for presenting viewing content. Nor are there terms limited in their meaning to viewing or viewing content that includes or utilizes any particular form of visual media. The term "viewing output" can mean, for example, "of, relating to, or involving images that are seen, shown, presented, reproduced, generated, broadcast, transmitted, recorded, captured, obtained, acquired, or perceived in a temporal sequence."

In example embodiments and implementations, the image capturing device and the AFMS device have or utilize separate independent sensors (or detectors), that is, the devices have separate independent sensors in respect to each other. Separate imaging and RAS sensors allow each sensor to be individually optimized for the best performance. A CCD sensor that acquires both images and RAS must operate at a very high frame rate whereas if the sensors are separate, the imaging sensor can operate at a much lower frame rate and have much better low light sensitivity. The support electronics are also simpler. Moreover, optics can be separately optimized for imaging and RAS. Individual RAS receivers can be operated in wavelength regions, with different field of views and sensitivities. In some devices and systems utilizing separate imaging and RAS sensors, the sensors are or can be boresight aligned.

In an example embodiment, a device for obtaining or providing listening includes: an image capturing device capable of capturing images of illuminated and/or luminous objects, including an object that is illuminated by ambient optical, microwave or radio wave electromagnetic energy and/or self-luminous, and an electromagnetic signal (energy) detection-facilitated audio frequency modulation sensing (AFMS) device having separate independent sensors, said devices and associated electronics being adapted to capture images of one or more illuminated and/or luminous objects and to obtain audio frequency modulated electromagnetic energy utilizing sensors of said AFMS device, and to generate or facilitate providing a listening output of the AFMS device (e.g., an audio signal) in time synchronization with a viewing output (e.g., video signal) including or utilizing images of said one or more objects captured by said image capturing device, the listening output including signals and/or information indicating or providing a representation of a disturbance to an electromagnetic field or fields at or associated with at least one of said one or more objects, the disturbance being or including an audio frequency modulation of a signal from or associated with (e.g., received from) at least one of said one or more objects.

In an example embodiment, a method for obtaining or providing listening includes: capturing and/or accessing (e.g., accessing captured) images (e.g., provided by imaging sensors) of one or more illuminated and/or luminous objects (e.g., an object that is illuminated by ambient optical, microwave or radio wave electromagnetic energy and/or self-luminous, or portions of said objects) as viewing content; extracting from other images provided by one or more separate independent sensors (or detectors) adapted to obtain audio frequency modulated electromagnetic energy from said other images signals and/or information facilitating the generation and provision of listening content including an audio representation or indication of a disturbance to an electromagnetic field or fields at or associated with at least one of said one or more objects; and providing a listening output (e.g., an audio signal) determined from the extracted signals and/or information and a viewing output (e.g., video signal) from or associated with the images.

In example embodiments and implementations, the viewing and/or listening outputs (are adapted to) facilitate, control, or initiate an action or process of (or involving) presenting, reproducing, transmitting, or otherwise communicating or making accessible the listening content in time synchronization with the viewing content or one or more portions or images thereof.

Technologies and methodologies described herein can be used to obtain or provide listening device acquired sound and/or information to images (e.g., video, film, digital, or other images). The images can be of an event/object/etc. contemporaneously captured (by a separate independent sensor as described herein, for example), or previously captured images (which are to be "post processed", for example). In either case, one or more additional/alternative acoustic sensing derived listening outputs can be utilized (e.g., listening outputs obtained contemporaneously at the same event but by other parties who, for example, may have been situated differently at the venue allowing them to obtain acoustic sensing perhaps more suitable for the extraction of better quality or more interesting sounds, or simply to obtain missing audio segments). As another example, it is contemplated that listening specialists could lend their expertly or meticulously obtained listening content (in relation to particular objects and/or nearby vicinity) to viewing content (of the same objects and/or nearby vicinity, or for that matter to similar or nearby objects and vicinities) obtained by someone else. One might apply the foregoing, for example, in relation to offering a service of adding an audio track of "alien sounds" to captured UFO video footage or other viewing content.

Example embodiments described herein involve or facilitate providing a listening device, system or methodology that facilitates sensing (or detecting) of or in relation to objects, events or phenomena of actual or potential interest or concern to a person, or sounds or information associated with or related to such objects, events or phenomena, and obtaining or providing sounds or information associated with or related to such objects, events or phenomena. Such objects, events or phenomena can include, by way of example: areas/sources of listening interest in nature or in relation to or involving vehicles or other man-made objects, fireworks or other pyrotechnics, and UFOs.

In an example embodiment, a method for obtaining or providing listening includes: capturing and/or accessing (e.g., previously captured) images provided by one or more imaging device sensors (or detectors) of one or more illuminated and/or luminous objects; utilizing one or more listening device sensors (or detectors) to obtain audio frequency modulated electromagnetic energy from other images of said one or more objects for and in relation to facilitating the generation or provision of sound and/or information in association with said images (e.g., an audio track for a video generated from the video images) including an audio representation or indication of a disturbance to an electromagnetic field or fields at or associated with at least one of said one or more objects; and providing viewing and/or listening content from or associated with the images with additional and/or replacement content including said sound and/or information (e.g., additional or replacement audio for one or more portions of the viewing content).

Technologies and methodologies described herein are suitable as well in relation to adapting, modifying, enhancing, or retrofitting an image capturing device to provide a listening device or mechanism for listening to object(s) and/or nearby vicinity.

In an example embodiment, a method for obtaining or providing listening includes: adapting an image capturing device that is capable of (or adaptable to be capable of) capturing images of illuminated and/or luminous objects (e.g., an object that is illuminated by ambient optical, microwave or radio wave electromagnetic energy and/or self-luminous) to utilize one or more separate independent sensor(s) including at least one electromagnetic signal detection-facilitated audio frequency modulation sensing (AFMS) device to obtain audio frequency modulated electromagnetic energy from other images captured by or otherwise obtained utilizing said separate independent sensor(s) and to generate or facilitate providing a listening output of the AFMS device in time synchronization with a viewing output including images of one or more illuminated and/or luminous objects, the listening output including signals and/or information indicating or providing a representation of a disturbance to an electromagnetic field or fields at or associated with at least one of said one or more objects, the disturbance being or including an audio frequency modulation of a signal from or associated with at least one of said one or more objects.

Example embodiments described herein relate to technologies and methodologies for providing a camera or other image capturing device or system with long range aural as well as visual capabilities. In reference to an example embodiment described herein, a portable, passive and covert telescopic sound camera is capable of producing high resolution sound movies of flight vehicles at >100 km distances. Imagery produced by the telescopic sound camera is capable of resolving and quantifying space launch vehicle events including plume formation, staging events and fairing separation dynamics (such as payload fairing jettison).

In an example embodiment, a device for obtaining or providing listening includes: an interface configured such that when operatively connected to individual or groups of elements of one or more solar arrays, respectively, the interface and the solar array(s) together function, responsive to sensed audio-frequency light intensity fluctuations of an optical signal received by said solar array(s), as a remote acoustic sensor (RAS)-based device.

In an example embodiment, a method for obtaining or providing listening includes: utilizing one or more solar arrays and a solar array interface operatively connected to individual or groups of elements of the solar array(s), respectively, the interface and the solar array(s) being configured to function, responsive to sensed audio-frequency light intensity fluctuations of an optical signal received by said solar array(s), together as a remote acoustic sensor (RAS)-based device.

In an example embodiment, a device for providing a backup command link to a spacecraft includes: for a spacecraft having one or more solar arrays, a solar array remote acoustic sensing (SARAS) interface configured such that when operatively connected to individual or groups of elements of said solar array(s), respectively, the SARAS interface and the solar array(s) together function, responsive to sensed audio-frequency light intensity fluctuations of an optical signal received by said solar array(s), as a lasercom receiver, the SARAS interface having a self-powered audio signal extractor and a command decoder configured respectively to extract and process command information from an optical command signal incident upon said solar array(s) to control the spacecraft independent of whether spacecraft power is available.

In an example embodiment, a device for providing a backup command link to a spacecraft includes: for a spacecraft having one or more solar arrays, a solar array remote acoustic sensing (SARAS) interface configured such that when operatively connected to individual or groups of elements of said solar array(s), respectively, the SARAS interface and the solar array(s) together function, responsive to sensed audio-frequency light intensity fluctuations of an optical signal received by said solar array(s), as a lasercom receiver, the SARAS interface having a self-powered audio signal extractor and a command decoder configured respectively to extract and process command information from an optical command signal incident upon said solar array(s) to control the spacecraft independent of whether spacecraft power is available.

In an example embodiment, a method of remotely commanding a spacecraft, the method includes: for a spacecraft having one or more solar arrays and a solar array remote acoustic sensing (SARAS) interface operatively connected to individual or groups of elements of the solar array(s), respectively, the SARAS interface and the solar array(s) being configured to function as a lasercom receiver responsive to sensed audio-frequency light intensity fluctuations of an optical signal received by said solar array(s), the SARAS interface having a self-powered multichannel audio signal extractor and a command decoder, commanding the spacecraft by directing a optical command signal incident upon said solar array(s), the optical command signal including command information extracted by the signal extractor and processed by the command decoder to control the spacecraft independent of whether spacecraft power is available.

In an example embodiment, a method for obtaining or providing listening or detection of audio frequency modulated optical energy includes: adapting a spacecraft or satellite or other solar array with an interface including electronics operatively connected to individual or groups of elements of the array to provide the solar array with remote acoustic sensing capability responsive to audio frequency modulation of an optical signal, the interface additionally being configured to generate outputs providing, or that facilitate obtaining, information content extracted from sensed audio frequency modulated optical signals, said information content corresponding to that of the sensed audio frequency modulated optical signals.

In an example embodiment, an apparatus for obtaining or providing listening or detection of audio frequency modulated optical energy includes: a detection/sensing device of a spacecraft or satellite, the detection/sensing device being configured to include or utilize a simple solar panel array, a telescope array or a RAS photodetector array to provide high sensitivity detection/sensing functionality in a small package.

In an example embodiment, an apparatus for obtaining or providing listening or detection of audio frequency modulated optical energy includes: a vehicle equipped with, modified, retrofitted or otherwise (re-)configured to include or utilize RAS and SARAS for listening to both local sounds and remote sounds, respectively.

In an example embodiment, a method for obtaining or providing listening, the method includes: for a solar power station including satellite and space variants having solar arrays, adapting one or more sub arrays of said solar arrays to include remote acoustic sensing capabilities by providing each of said sub array(s) with a solar array remote acoustic sensing (SARAS) interface having electronics operatively connected to individual elements of said sub array(s), respectively, responsive to and configured to detect audio frequency modulation of an optical signal, the SARAS interface(s) additionally being configured to generate outputs providing, or that facilitate obtaining, information content extracted from sensed audio frequency modulated optical signals, said information content corresponding to that of the sensed audio frequency modulated optical signals.

In an example embodiment, an apparatus for obtaining or providing listening or detection of audio frequency modulated optical energy includes: a microscopic or miniature detection device configured to be responsive to audio rate optical modulations caused by microfauna and/or other microscopic life.

DISCLOSURE OF INVENTION

Figure 1A:
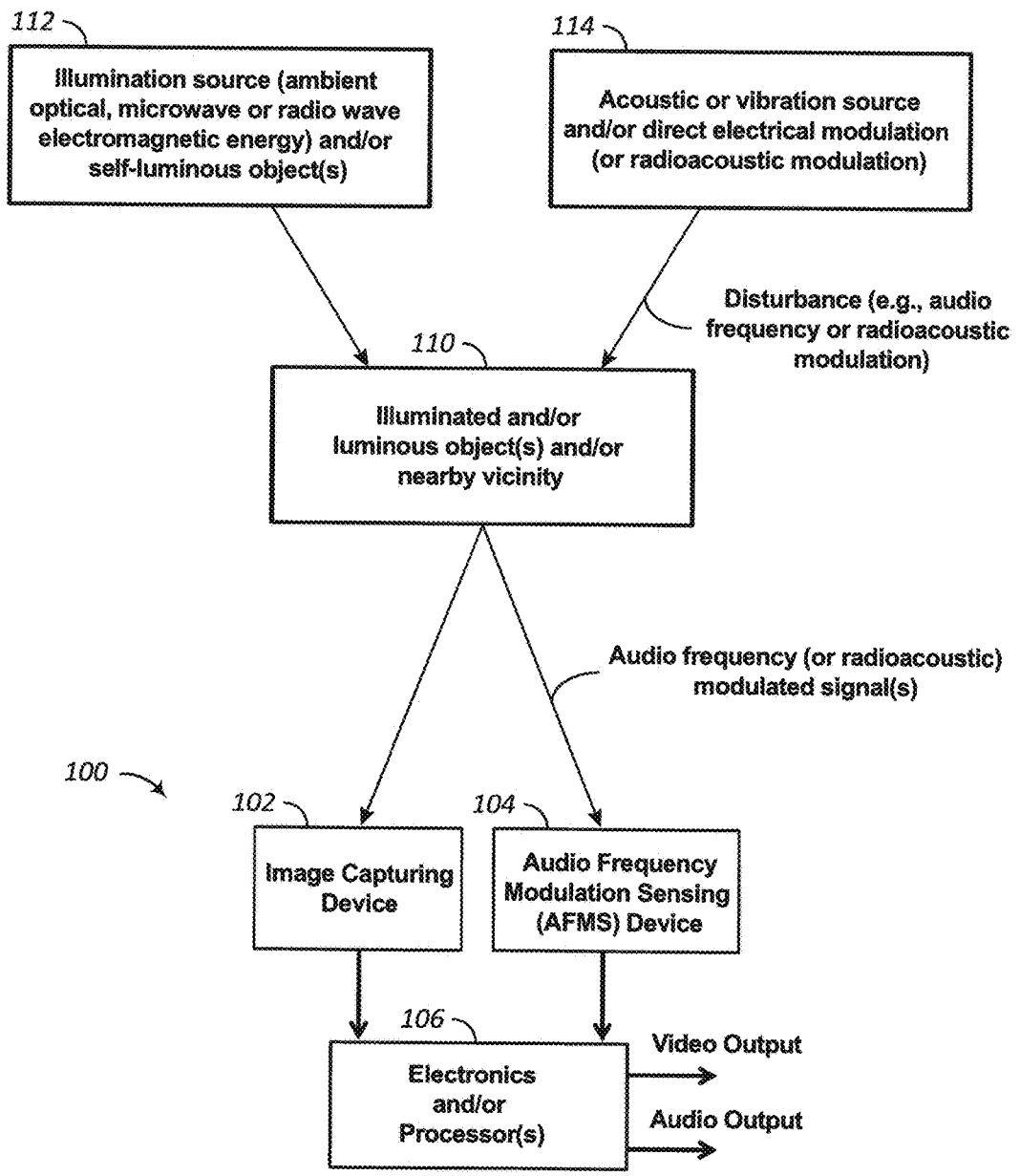
FIG. 1A shows an example embodiment of system for obtaining or providing listening, the system shown in operation sensing an audio frequency modulation of a signal from or associated with one or more illuminated and/or luminous objects.
Figure 1B:
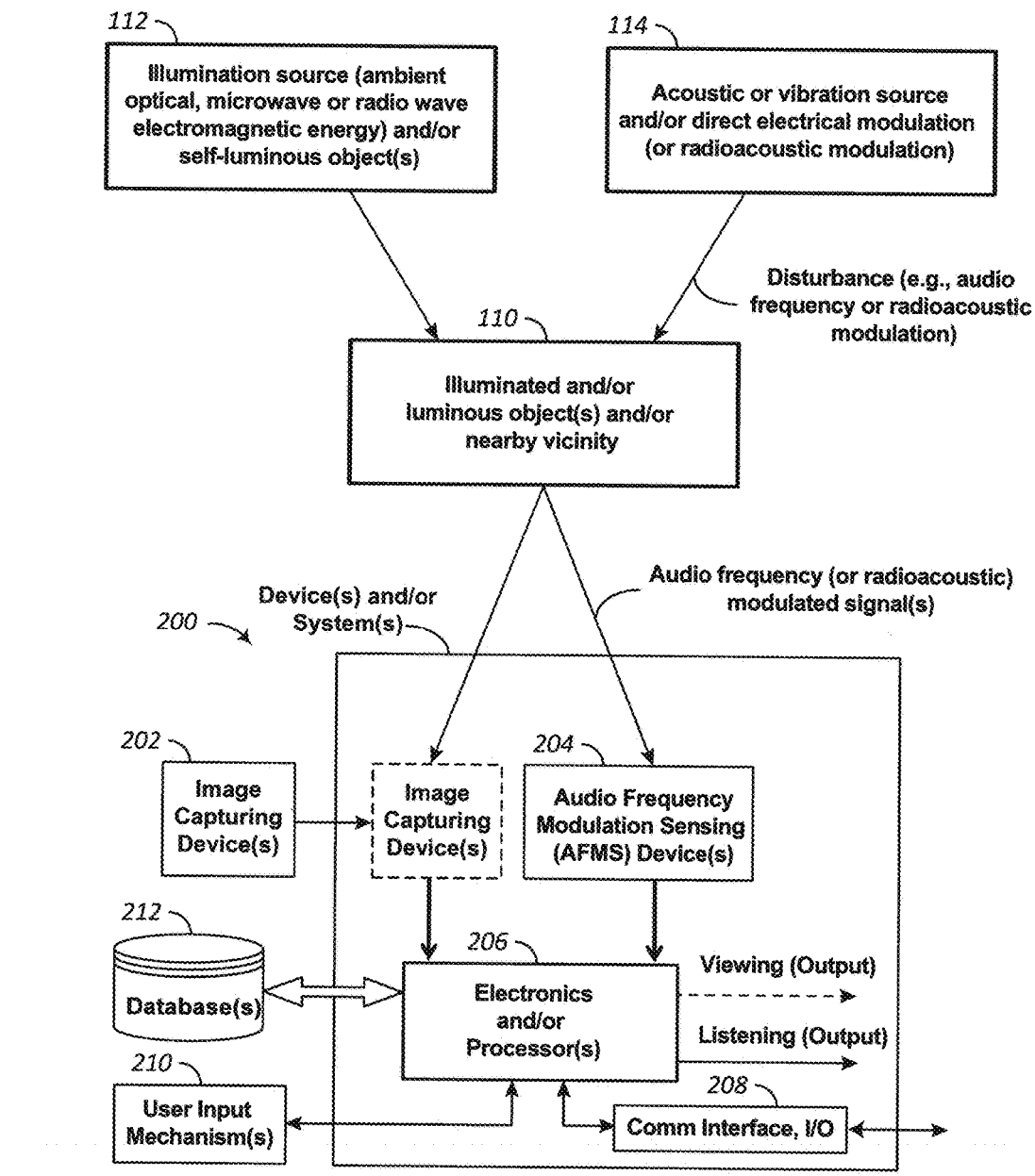
FIG. 1B shows another example embodiment of system for obtaining or providing listening according to the present invention.

The scope of the present invention(s) includes subject matter described herein and, as and if applicable, subject matter incorporated herein by reference, and it should be understood that any device or system not pictorially rendered as was done in the case of several example devices and systems (vehicles, illuminated and/or luminous objects, etc.) in the accompanying drawings is considered to be represented by the system diagrams in FIG. 1A, FIG. 1B, or both, as applicable and in relation to particular recitations of claimed subject matter.

Referring to FIG. 1A, in an example embodiment, a sound camera 100 includes an image capturing device 102, an electromagnetic signal (energy) detection-facilitated audio frequency modulation sensing (AFMS) device 104, and electronics and/or processor(s) 106 configured as shown. In example embodiments and implementations, the image capturing device 102 and the AFMS device 104 include or utilize independent sensors (or detectors), and the electronics and/or processor(s) 106 include electronics associated with one or more of the image capturing device 102 and the AFMS device 104. Referring again to FIG. 1A, in example embodiments and implementations, the image capturing device 102 and the AFMS device 104 and associated electronics are adapted to capture images of one or more illuminated and/or luminous objects 110 and to obtain audio frequency modulated electromagnetic energy utilizing (sensors of) the AFMS device 104 and in time synchronization with images captured by the image capturing device 102, and such that the image capturing device 102 and the AFMS device 104 provide viewing (e.g., video) and listening (e.g., audio), respectively, the audio output including signals and/or information indicating or providing a representation of a disturbance to an electromagnetic field or fields at or associated with at least one of the one or more objects, the disturbance being or including an audio frequency modulation of a signal from or associated with (e.g., received from) at least one of the one or more objects.

In example embodiments and implementations, one or more of the image capturing device 102, the AFMS device 104, and the associated electronics is adapted to provide (at the video output and the audio output) a synchronized high resolution picture and sound combination. In relation to example implementations (e.g., involving or facilitating the tracking of vehicles), a general goal of a long range telescopic tracking camera or system can be for example to record the vehicle exterior and nearby vicinity at a high spatial and temporal resolution, preferably in several spectral regions, preferably from multiple viewing angles and provide accurate vehicle Time Space Position Information (TSPI). By way of example, the image capturing device 102 is or includes one or more of: an imaging telescope, a telescopic camera, an imaging microscope, a microscopy camera, a video camera, a digital camera, a television camera, a tracking (camera) system/telescope (e.g., adapted to record the vehicle exterior and nearby vicinity at a high spatial and temporal resolution, in one or more spectral regions, and preferably from multiple viewing angles and with accurate vehicle Time Space Position Information (TSPI)), and (nonrecoverable or other) space-based sensors or other assets. The image capturing device 102 can be provided in the form of a cinema or other camera that includes or utilizes one or more (aerospace) photographic technologies selected from the group comprising: space-compatible photographic, long range imaging (e.g., suitable for observing distant objects, UFO's, or other objects of interest), atmospheric seeing compensation, and aerial platforms technologies. In example embodiments and implementations, the image capturing device 102 is or includes one or more of: a night vision camera, a full spectrum digital camera, a full spectrum motion camera, and an Infrared (IR) camera (or a camera adapted or modified to accept Infrared (IR) light).

Figure 2:
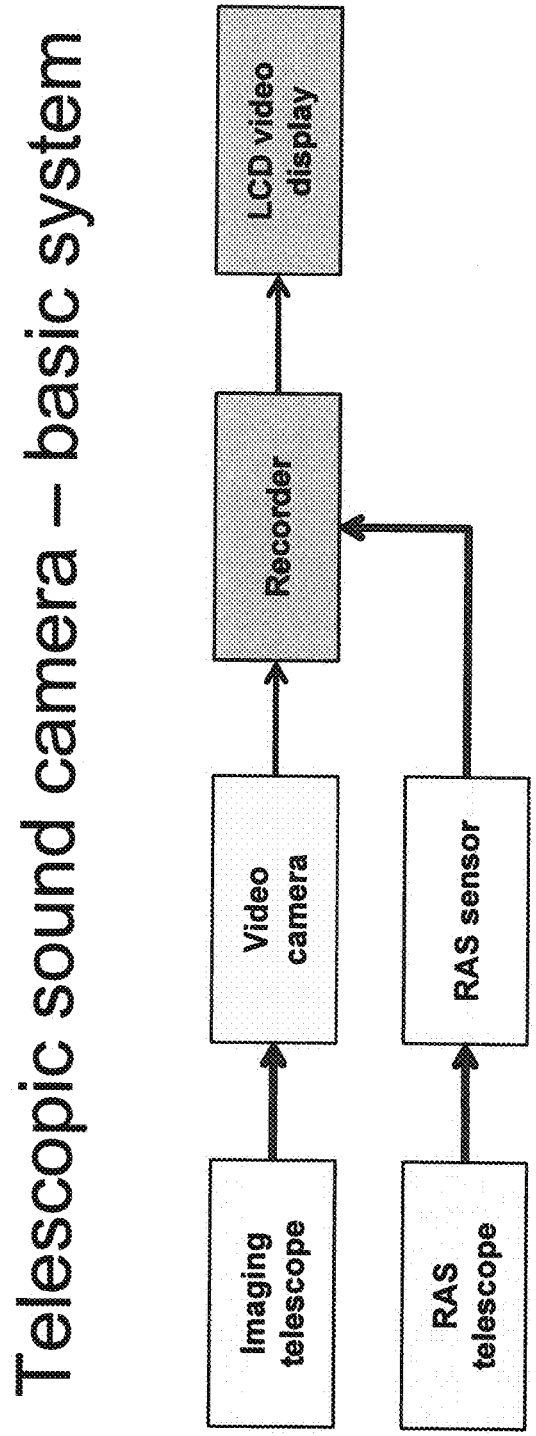
FIG. 2 is a diagram of an example telescopic sound camera system.
Figure 3:
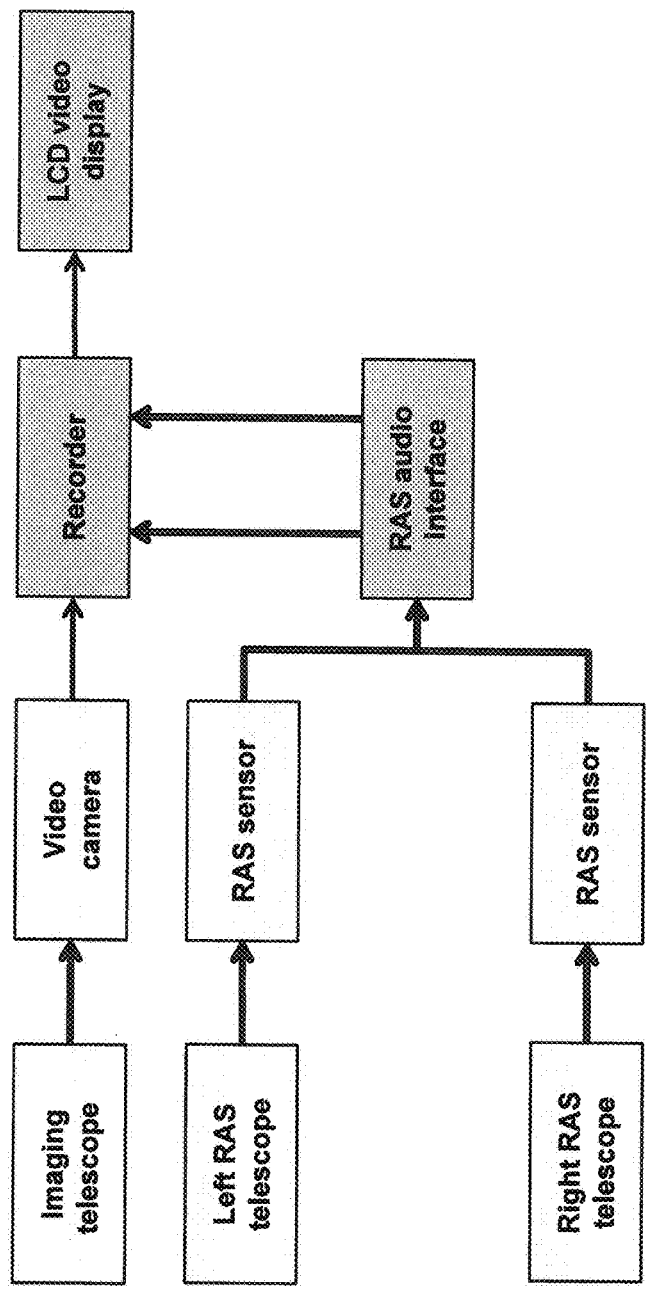
FIG. 3 is a diagram of an example telescopic sound camera system implemented to provide stereo remote audio sensing (RAS)
Figure 4:
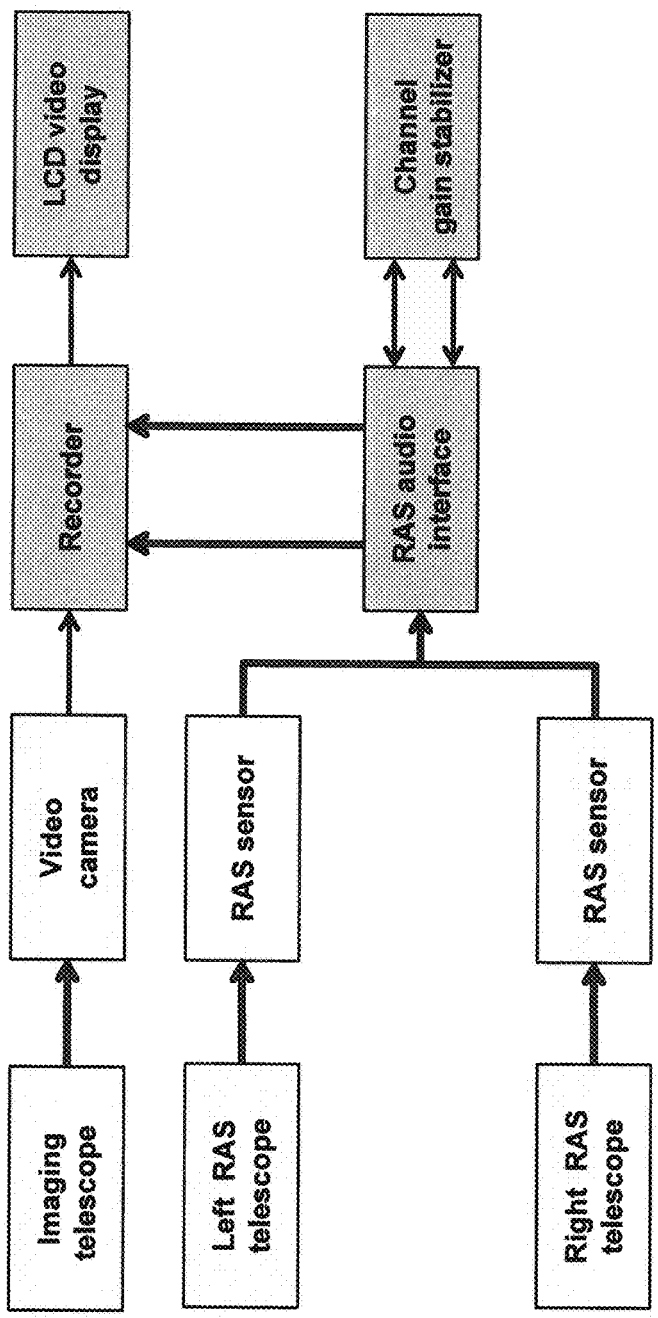
FIG. 4 is a diagram of an example telescopic sound camera system implemented to provide gain stabilized stereo RAS.
Figure 5:
FIG. 5 is a diagram of an example passive multistatic Doppler radar RAS implementation.

Further in relation to example implementations of technologies and methodologies described herein, FIG. 2 shows an example telescopic sound camera system that includes an imaging telescope, a RAS telescope, a video camera, a RAS sensor, a recorder, and a LCD video display configured as shown. FIG. 3 shows an example telescopic sound camera system implemented to provide stereo remote audio sensing (RAS), the camera system including an imaging telescope, left and right RAS telescopes, a video camera, left and right RAS sensors, a recorder, a RAS audio interface, and a LCD video display configured as shown. FIG. 4 shows an example telescopic sound camera system implemented to provide gain stabilized stereo RAS, the camera system including an imaging telescope, left and right RAS telescopes, a video camera, left and right RAS sensors, a recorder, a RAS audio interface, a LCD video display, and a channel gain stabilizer configured as shown. FIG. 5 shows an example passive multistatic Doppler radar RAS implementation that includes or utilizes a UHF antenna, a radar receiver, and a laptop (or other) computer configured as shown.

Remote Acoustic Sensor (RAS)

The telescopic sound camera uses long range Remote Acoustic Sensing (RAS) technology to recover audio frequency energy produced by a distant flight vehicle. RAS observable rocket vehicle sounds are primarily associated with skin membrane glints, aerodynamic wake turbulence and rocket engine activity. Propellers, rotors, turbines and other rotating components and flashing luminous beacons on more conventional aircraft also frequently provide strong acousto-optic signatures.

At the most basic level, audio frequency energy sources, acoustic and/or otherwise, modulate ambient electromagnetic fields near the flight vehicle. These modulated electromagnetic fields are telescopically observed by RAS which remotely recovers the ambient audio. RAS is completely passive and does not require any flight vehicle modifications. As such, this technology is compatible with non-cooperative and covert observations. The example embodiments and implementations provided herein are described in relation to two different RAS electromagnetic spectral regions, optical and radio frequency. Most of the RAS development and operation to date has been in the optical region which will be discussed first.

Optical RAS Overview

Optical RAS facilitates for example remotely sensing audio frequency intensity (amplitude) modulations of a distant luminous object. The object luminosity may be a glint illuminated by an external source such as the Sun, laser or a searchlight or alternately the object may be self-luminous. Examples of self-luminosity include rocket flames, thruster firings, exoatmospheric reentry, pyrotechnics, beacons and lights. Real world aerospace vehicles often are a combination of different sources.

Optical RAS relies on audio frequency modulation of the distant object luminosity. The audio frequency modulation may result from acoustic and vibration sources or may be non-acoustic resulting from direct electrical modulation. Combining internal or external illumination with acoustic or electrical modulation results in four distinct types of optically modulated audio sources (AOM, EOM, AME and EME). These are further described:

Reflective Acousto-Optic Modulator (AOM)

The reflective acousto-optic modulator is a modern day derivative of the Photophone as originally invented by Alexander Graham Bell in 1880. See: Bell, A. G., "On the Production and Reproduction of Sound by Light", American Journal of Sciences, Third Series, vol. XX, no. 118, October 1880, pp. 305-324; Bell, A. G., "Apparatus for Signaling and Communication, called Photophone", U.S. Pat. No. 235,199 (1880); Bell, A. G., "Photophone Transmitter", U.S. Pat. No. 235,496 (1880); Bell, A. G., "Photophone Receiver", U.S. Pat. No. 241,909 (1881); and Bell, A. G., "Transmitting and Recording Sounds by Radiant Energy", U.S. Pat. No. 341,213 (1886), which are hereby incorporated by reference. With reference to "Table 1: Flight vehicle optical RAS modulation mechanisms" (see below), RAS/AOM is essentially a very long range microphone implemented in the form of a passive non coherent tristatic optical vibrometer. The telescopic sound camera uses distant naturally occurring reflective and refractive acousto-optic modulators (AOM) to form very long range acousto-optic communication links.

Three free space propagation paths that converge at the AOM are required; an optical carrier illuminates the AOM, an acoustic source modulates the AOM and the AOM is read out by a distant RAS receiver. This tristatic approach is an extension of a more conventional bistatic radar link analysis. The AOM can be treated as an optical radar target with a specified optical cross section (OCS). The OCS is weakly modulated by the acoustic signal. See: Dan Slater, "Passive Long Range Acousto-optic Sensor", Proc. SPIE 6304, Free-Space Laser Communications VI, 63040E (Sep. 1, 2006); Dan Slater, "Passive Long Range Acoustic Sensor", U.S. Pat. No. 7,551,519 (Jun. 23, 2009); and Dan Slater and Sandy Shaw, "Remote Sensing with Passive Specular Probes", Proc. SPIE 6709, Free-Space Laser Communications VII, 67090 W (Sep. 25, 2007), which are hereby incorporated by reference.

The skin membrane of a flight vehicle is a good example of naturally formed, non-cooperative reflective acousto-optic modulator. The skin membrane forms a microphone diaphragm with a remote optical readout. Local acoustic sources such as vibrations and flutter cause weak mechanical deformations of the AOM membrane. When properly illuminated by the Sun, lasers, searchlights, landing lights or other illumination sources, the reflective AOM produces a bright specular reflection (glint) that is remotely observable from a long distance. The RAS receiver senses the weak optical intensity fluctuations to recover the distant audio signal. Aerospace flight vehicles frequently produce multiple spatially separated glints. Each glint can serve as a separate microphone to produce stereophonic or multichannel audio. There are also many terrestrial AOM/RAS examples. Id.

Reflective acousto-optic modulation may also result from spinning propellers, rotors, rotodomes, turbines and other rapidly moving devices on the flight vehicle. These rotary devices either mechanically chop the light at audio rates or cause glints to move across the surfaces of the rotary device such as a shaped aircraft propeller.

Refractive Acousto-Optic Modulator (AOM)

The wake turbulence of a moving vehicle can be observed acoustically as it passes in front of a glint illuminated by the Sun, a flight vehicle landing light or other source. In this case the acousto-optic modulation mechanism is refractive, the result of atmospheric refractivity variations produced by the vehicle wake. Sound waves are propagating pressure waves within a fluid such as the atmosphere. Localized acoustic pressure variations cause corresponding optical refractivity variations as a consequence of the ideal gas law. This phenomenology is also exploited by Schlieren cameras that form images of the atmospheric density variations. Naturally formed non cooperative refractive AOMs in front of glints are generally associated with vehicle aerodynamic wake turbulence or as an unwanted noise source in the form of the intervening turbulent atmospheric propagation path to the RAS receiver. Practical experience has shown that wake turbulence modulating solar glints on aircraft and rocket vehicles does produce RAS observable audio.

Acoustically Modulated Emitter (AME)

Large rocket engines along with their exhaust plumes are powerful acoustically modulated optical emitters. The RAS audio is somewhat similar to typical rocket sounds but with region specific variations. It appears that the acousto-optic modulation results from a combination of combustion flow turbulence, instabilities, pressure variations and shock waves. It is thought that main engine throttling and partial stage shutdowns should be readily detectable but so far this has only been partially demonstrated. Spatially scanned multichannel optical RAS data obtained during a recent Atlas V rocket launch shows that the plume audio frequency spectrum and amplitude both shift downward through the plume with increasing distance from the rocket. Future RAS tests with smaller field of view multichannel and multiwavelength sensors will be used to better localize the AME locations and understand the associated physics. Main rocket engine start and stop sequences have been observed for several different rocket vehicles and have consistently produced detailed and interesting RAS observable transient audio phenomena.

The smaller rocket attitude control thrusters likely produce similar rocket engine signatures but with lower signal intensities and pulse train start/stop sequences. Fireworks have been observed and typically produce pop and sizzle sounds. It is believed that an exoatmospheric entry by a spacecraft or meteor would likely produce similar sounds. Another AME acoustic source is an aircraft landing light with a vibrating filament.

AME involves two propagation paths; the acoustic source to the AME and the AME optical path to the RAS receiver. Often the AME and acoustic source is coincident requiring only the optical free space propagation path to the receiver.

Electro-Optic Modulator (EOM)

An EOM is an electrically modulated glint or retro reflector. Two free space propagation paths are required, illumination to the EOM, and the EOM to the RAS receiver. Cooperative laser illuminated passive modulated retroreflector data links fall into this category.

Electrically Modulated Emitter (EME)

These are various forms of intensity modulated lights, typically Xenon beacons, aircraft landing lights and modulated LEDs. Only a single free space propagation path is required; the EME to the RAS receiver. These are not known to have been observed on rocket vehicles.

Combinations of RAS Modulation Mechanisms

Audio frequency modulated emissions from the flight vehicle are the spatially distributed linear combinations of the modulated emissions modified by various additive and multiplicative noise sources. Daytime unpowered rocket flight is primarily refractive AOM with the audio resulting from vehicle wake turbulence corrupted by the atmospheric turbulence in the optical propagation path. Powered rocket flight adds strong sound levels from AME combustion turbulence flow and engine transient events.

Combinations of AOM (vibrations, wake turbulence, propellers and rotors) and EME (beacons and other lights) are commonly heard on conventional aircraft. Aircraft night flights are predominantly EME due to the lack of solar glint illumination although vehicle lights can also produce usable AOM audio modulated glints. Aircraft using propellers or rotors produce AOM sounds from modulated glints and reflectivity variations of the rotary components. Pyrotechnics, fireworks and exoatmospheric reentry phenomena produce AME acoustic emissions.

TABLE 1

Flight vehicle optical RAS modulation mechanisms

| Type | Links | Type | Illumination | Examples |
| --- | --- | --- | --- | --- |
| AOM | 3 | Reflective acousto-optic modulator | Solar, laser, other | Vehicle skin membranes, rotating devices |
| AOM | 3 | Refractive acousto-optic modulator | Solar, laser, other | Atmospheric turbulence (vehicle or propagation path) |
| AME | 2 | Acoustically modulated optical emitter | Self luminous | Rocket plumes, thrusters, exoatmospheric reentry |
| EOM | 2 | Electro-optic modulator | Laser | Modulated retroreflector |
| EME | 1 | Electrically modulated optical emitter | Self luminous | Xenon beacons, landing lights, modulated LEDs |

Noise and Sensitivity in Remote Acoustic Sensing (RAS) Systems

RAS noise sources and sensitivity will only be briefly discussed here. The primary noise sources fall into two categories; additive and multiplicative. Additive thermal and shot noise occurs in the RAS detector and limits the sensitivity to weak audio signals. Multiplicative noise results when the Kolmogorov atmospheric turbulence refractivity cascade modulates optical path between the acousto-optic emitter and RAS detector.

Stereophonic and Multichannel Remote Acoustic Sensing (RAS)

The scene frequently includes multiple spatially dispersed acousto-optic emitters. Examples include the numerous simultaneously visible automobile windshield glints in a parking lot, an array of building windows and even the wave driven glints on the ocean surface. In the case of aerospace vehicles, multiple glints occur on engine nacelles, curved wing and body sections, cockpits, and other shiny rounded surfaces. See FIGS. 6 and 7 which show illuminated and/or luminous surfaces/portions of a rocket (in this illustrated example—the curved payload and other body sections of the rocket, the rocket engine, the rocket plume, and the radio transponder antenna carried by the rocket), an airplane (in this illustrated example—the curved wing and body sections of the airplane, the flashing beacon and landing light of the airplane, the rotating propeller of the airplane, and the radio transponder antenna carried by the rocket), and additionally a race car (in this illustrated example—the curved body sections and cockpit of the race car, and the brake light and exhaust port of the race car), pyrotechnics, and a UFO. Each individual glint or emitter has the potential to form an individual spatially separated RAS microphone and transmitter.

Figure 8:
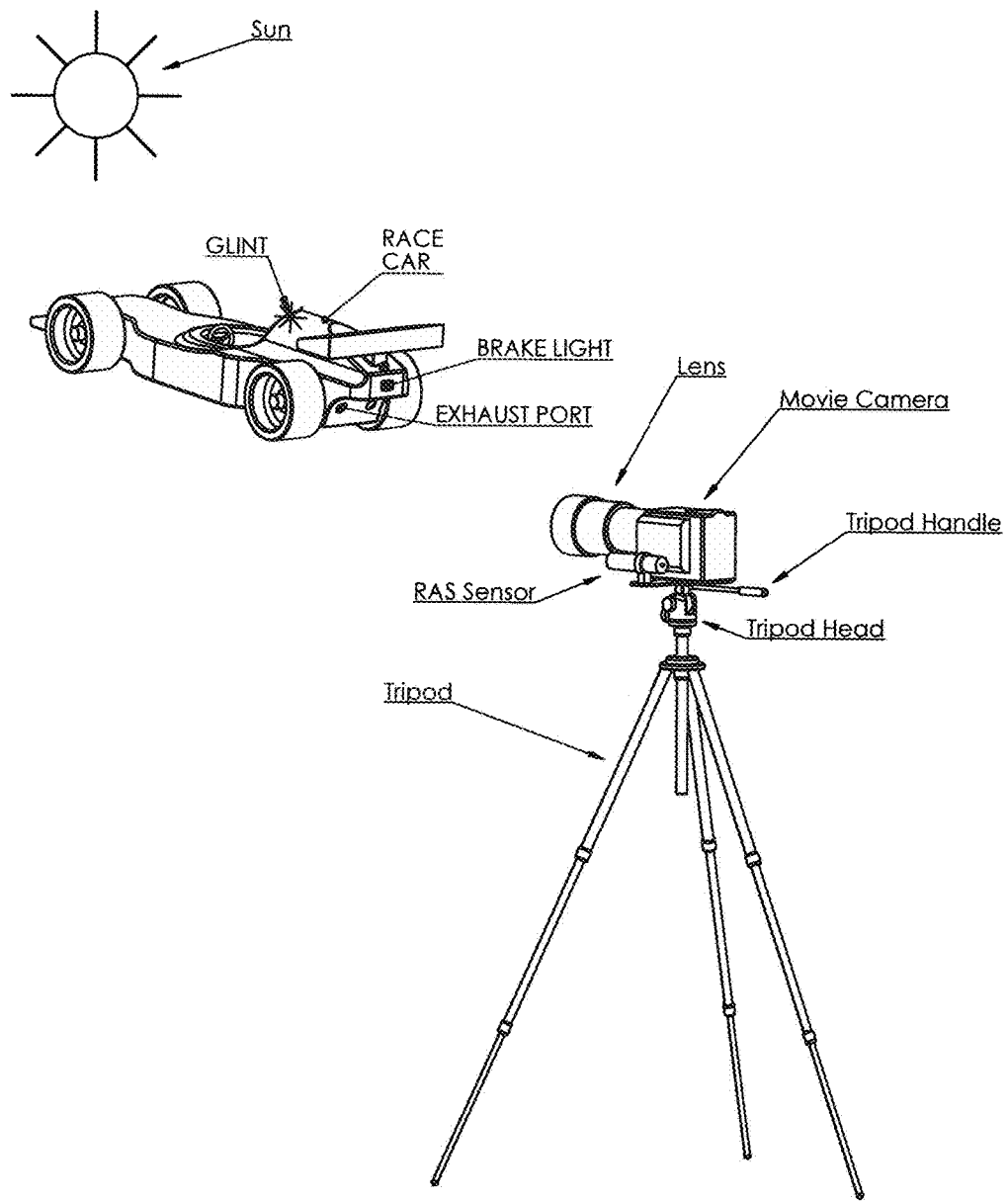
FIG. 8 is an illustration depicting an example monophonic RAS sound camera implementation.
Figure 9:
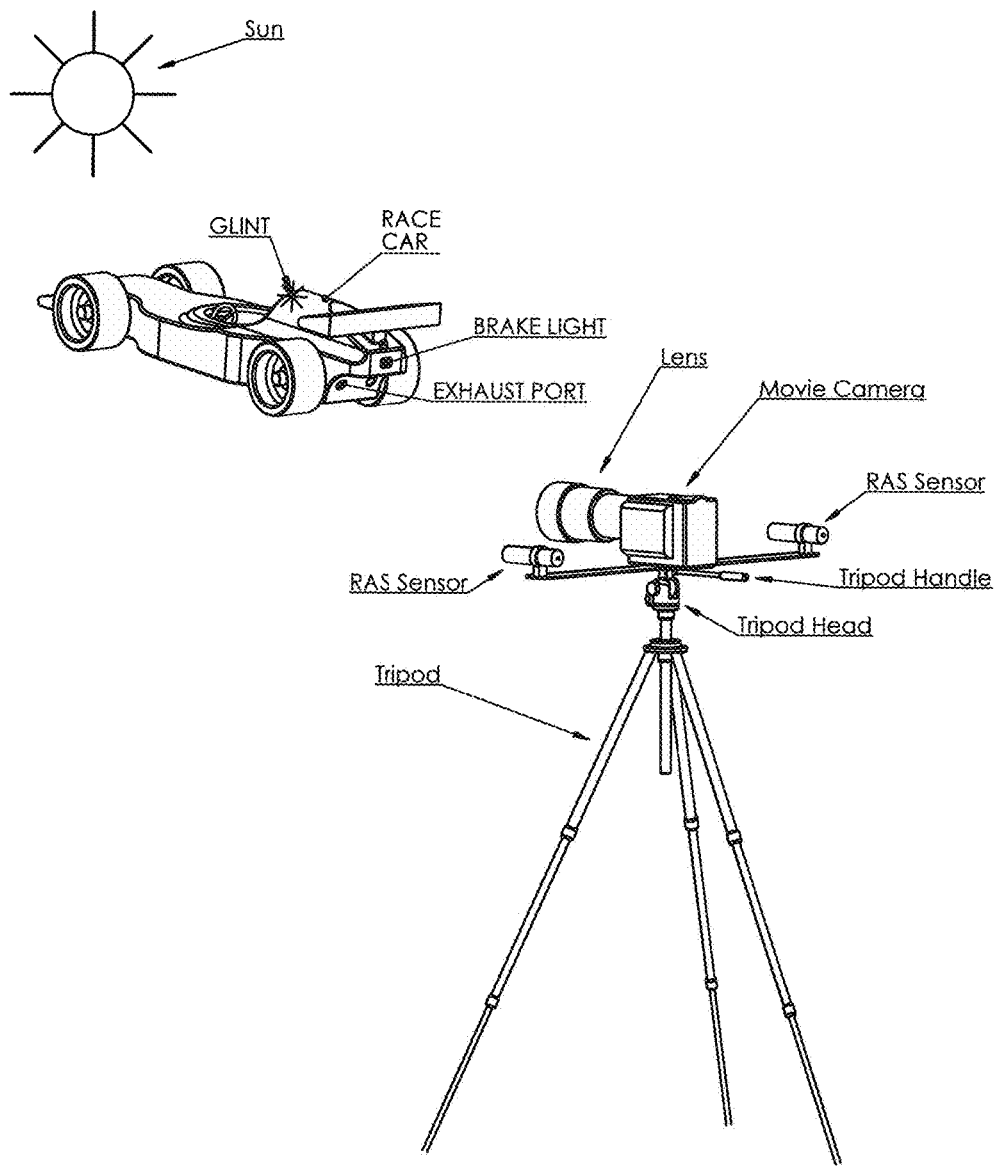
FIG. 9 is an illustration depicting an example stereophonic RAS sound camera implementation.
Figure 10:
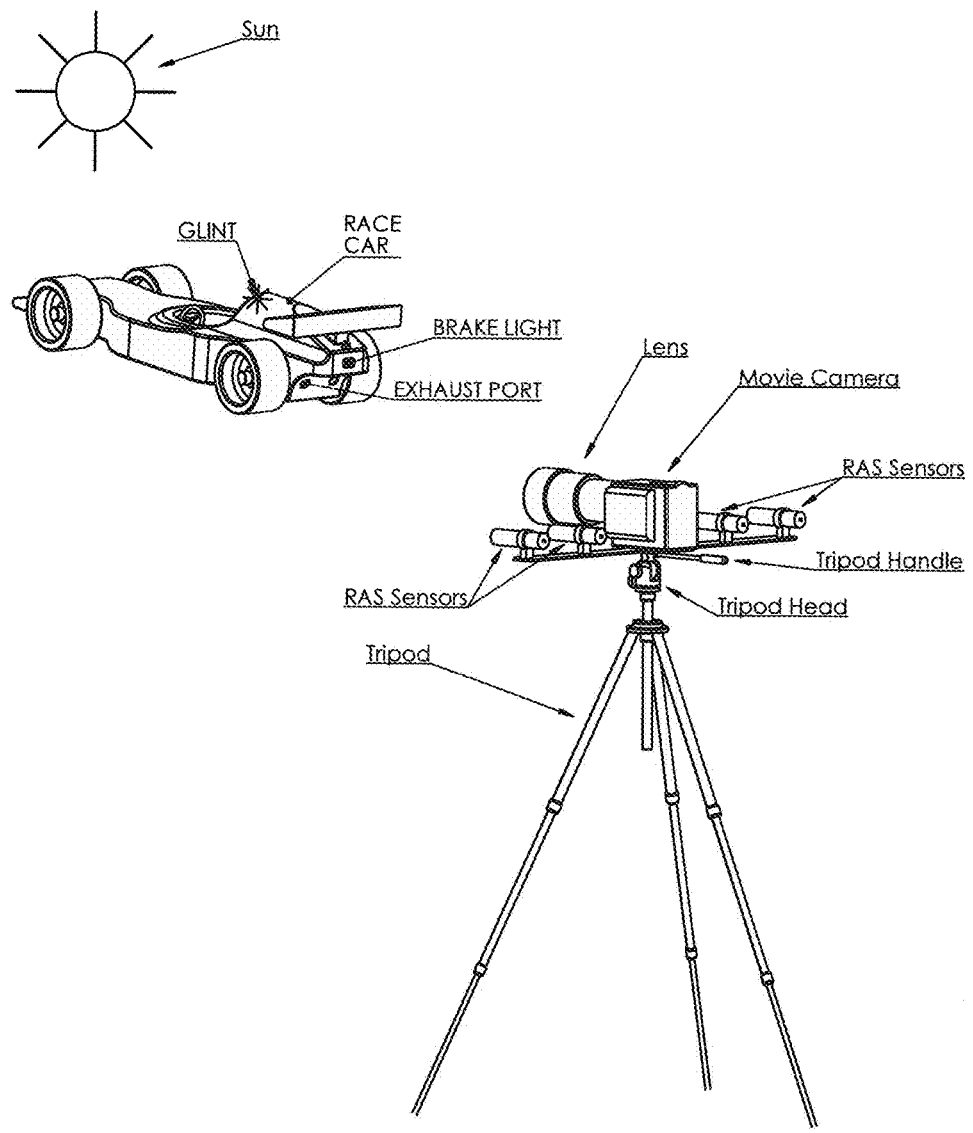
FIG. 10 is an illustration depicting an example multichannel RAS sound camera implementation.
Figure 11:
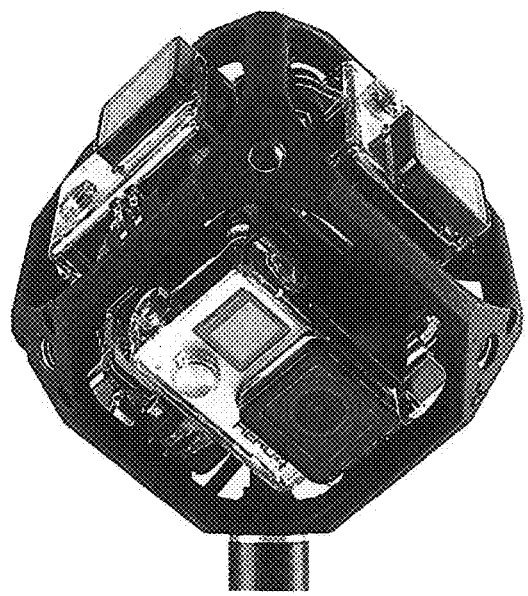
FIG. 11 shows a six-sided full sphere video camera and a CubeSat with solar arrays on all six sides.
Figure 12:
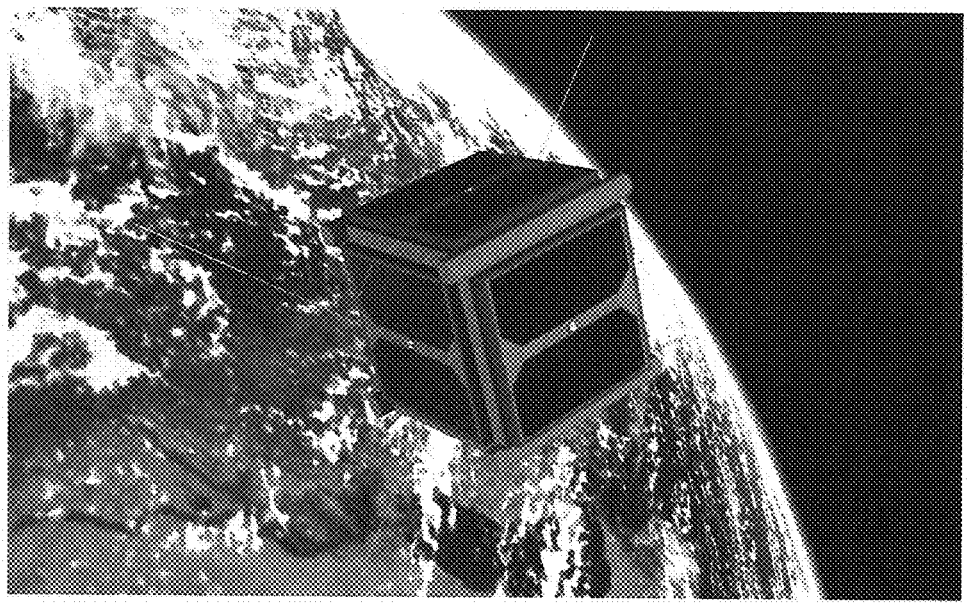
FIG. 12 shows a CubeSat with solar arrays on all six sides.

FIGS. 8, 9 and 10 respectively show example monophonic, stereophonic and multichannel RAS sound camera implementations. Stereophonic sound requires the addition of a second RAS detector that observes a second spatially separated AOM or optical emitter. Either a pair of telescopes can be used or a single telescope can be used with a spatially sensitive photodetector. Acoustic intensity provides a stereophonic amplitude localization cue. Acoustic source propagation delays to the different AOM or AME regions produce stereophonic time delay localization cues. Other types of RAS stereophonic sound sensing are possible using different RAS field of views, observing locations, spectral regions or optical polarizations.

Stereophonic RAS can be readily extended to multichannel sound recording and acoustic beam forming by adding additional RAS detector channels. See: Dan Slater, "Passive long range acousto-optic sensor", Proc. SPIE 6304, Free-Space Laser Communications VI, 63040E (Sep. 1, 2006); Dan Slater, "Passive long range acoustic sensor", U.S. Pat. No. 7,551,519 (Jun. 23, 2009). One interesting implementation option is a high frame rate camera with a sample rate sufficient for the desired audio bandwidth. Each pixel then corresponds to a separate RAS detector. The camera would typically need to operate >5000 frames per second to provide an adequate audio bandwidth while being sensitive to weak optical modulation levels. If this camera is also high resolution, it could simultaneously produce the visual component. This type of camera is currently quite expensive but cost will likely continue to fall in the future. At the other extreme, a very cost effective multichannel RAS detector is an optical flow sensor.

Optical Remote Acoustic Sensing Hardware

In example implementations inclusive of but not limited to long range (far distance) acoustic sensing, an optical RAS receiver may consist of a telescope, a photo detector and the associated support electronics. The RAS telescope aperture and focal length are a function of the illumination, the object being viewed, the viewing distance, atmospheric conditions and detector characteristics. Small wide angle and fisheye RAS detectors can be useful as acquisition aids but most RAS detectors are telescopic. Practical RAS telescope apertures have ranged in size from less than 5 cm (2 inches) to more than 45 cm (18 inches). The larger telescope apertures provide advantages of improved low light sensitivity and reduction of optical scintillation by aperture averaging. Scintillation noise is further reduced by operating at longer wavelengths. The RAS receiver can share the imaging telescope aperture or use one or more separate apertures. The shared aperture simplifies targeting and boresight alignment. The separate RAS aperture(s) simplify the imaging optical path.

The RAS detector measures weak optical intensity fluctuations that are often masked by the bright background illumination. Additionally, the RAS system should have a very wide dynamic range and high sensitivity. The detector output is passed to a signal processor which provides amplification, filtering and other functions.

Specular Probes

RAS is a subset of a more general type of remote sensing based on the concept of specular probes. A specular probe is a distant glinting object that is optically modulated by the local probe environment. See Dan Slater and Sandy Shaw, "Remote sensing with passive specular probes", Proc. SPIE 6709, Free-Space Laser Communications VII, 67090 W (Sep. 25, 2007). Remotely observable quantities include radiance, wavelength, directivity and polarization, all of which may be spatially and temporally varying. In example implementations, optical RAS only considers the temporal and spatial audio frequency amplitude modulation of a specular probe.

Radioacoustic Sensing with Passive Doppler Radar

The optical remote acoustic sensor detects audio frequency modulations of vehicle glints and self-luminosity. The same concept applies to other parts of the electromagnetic spectrum including radio frequencies. RF RAS requires a radio wave illumination source, radioacoustic modulation (RAM) and a radio wave receiver.

Flight Vehicle Audio Frequency Modulation of Radio Sources

There are RF analogs of the optical AOM, AME, EOM and EME modulation mechanisms. With reference to "Table 2: Flight vehicle radioacoustic modulation mechanisms" (see below), RAM and RAME are externally and vehicle RF illuminated radioacoustic modulators that correspond to optical AOM and EOM. Radioelectric modulation using vehicle RF carriers (REME) corresponds to normally occurring vehicle transmissions that include non-acoustic, audio frequency components. As in the case of the optical domain, RF specular probes sensitive to parameters other than audio frequency modulations are also possible. Id.

Radioacoustic Modulation (RAM) of Ambient Radio Illumination Sources

The RF equivalent to acousto-optic modulation (AOM) is reflective and refractive radioacoustic modulation (RAM). RF remote acoustic sensing is conceptually related to the radioacoustic sounding system (RASS) methods used for remote measurement of atmospheric vertical temperature profiles and aircraft wake turbulence. See P. Dekker and S. Fraiser, "Radio Acoustic Sounding with a UHF Volume Imaging Radar", Journal of Atmospheric and Ocean Technology, vol. 21 (2003); J. Hanson and F. Marcotte, "Aircraft Wake Vortex Detection Using Continuous-Wave Radar", Johns Hopkins APL Technical Digest, vol. 18, num. 3 (1997), which are hereby incorporated by reference. RASS consists of (or utilizes) a CW or pulsed bistatic radar along with a pulsed or CW acoustic source that view a common atmospheric region. The acoustic source frequency is selected to produce a Bragg grating that effectively reflects the microwave energy. Measurements of the acoustically induced RF Doppler shift produce a measurement of the acoustic propagation speed which is a function of atmospheric temperature.

For the aerospace vehicle radioacoustic sensing experiment, television broadcast signals were used as the transmitter, the vehicle and plume formed the radioacoustic modulator (RAM) and passive Doppler radar receivers are believed to be suitable in relation to a process of detecting acoustically modulated vehicle echoes and extracting the micro-Doppler audio modulation components from vehicle radar echoes received.

Radioacoustic Modulation of Vehicle Carried Radio Emitter (RAME)

The RF equivalent of an acoustically modulated optical emitter (AME) is a radioacoustic modulated emitter (RAME). The radio wave illumination source may be a vehicle carried radio transmitter that includes a CW spectral component. Rocket plume attenuation of rocket telemetry, beacon and other RF sources is a well-known phenomenon. See Anon, "Terminology and Assessment Methods of Solid Propellant Rocket Exhaust Signatures", AGARD Advisory Report AR-287 (1993), which is hereby incorporated by reference. Associated with the plume attenuation is the introduction of noise. See R. Lee, et. al., "Studies of Plasma Properties in Rocket Plumes", Aerospace Corporation Report SD-TR82-44 (1982), which is hereby incorporated by reference. This is the result of a multiplicative modulation of the RF signal by the turbulent plume.

Radioelectric Modulation (REM)

The nearest RF equivalent to electro-optic modulation (EOM) is a modulated radar retroreflector or radar beacon transponder.

Radioelectric Modulated Radio Emitter (REME)

The RF equivalent to an electrically modulated optical emitter (EME) is a radio transmitter that includes audio frequency modulation components. These are plentiful on aerospace vehicles as the normal voice, telemetry and other radio transmissions.

Combinations of Optical and Radio Wave Remote Acoustic Sensing

Optical and RF RAS methods can be used simultaneously. Audio frequency modulated emissions from the flight vehicle are the spatially distributed linear combinations of the modulated emissions modified by various additive and multiplicative noise sources. There are two significant differences between optical and RF RAS. Optical RAS is limited to intensity measurements whereas RF RAS can use both intensity and RF phase information. The second difference is that RF RAS detectors generally do not have sufficient angular resolution to detect spatially separated stereophonic signals on the flight vehicle. Other types of RF stereophonic listening are possible including multiple transmit and receive sites, RF frequency, polarization, etc.

TABLE 2

Flight vehicle radioacoustic modulation mechanisms

| Optical | RF | Links | Type | Illumination | Examples |
|---------|------|-------|------|--------------|----------|
| AOM | RAM | 3 | Reflective radioacoustic modulator | RF transmitter | Vehicle skin membranes, rotating devices |
| AOM | RAM | 3 | Refractive radioacoustic modulator | RF transmitter | Rocket flame attenuation & scattering |
| AME | RAME | 2 | Radioacoustic modulated emitter | Vehicle RF transmitter | Rocket flame attenuation, vehicle voice transmissions |
| EOM | REM | 2 | Radioelectric modulator | Distant radar transmitter | Radar beacon transponder |
| EME | REME | 1 | Radioelectric modulated emitter | Vehicle RF transmitter | Vehicle telemetry and other radio transmissions |

Passive Multistatic Radar

Several experimental passive VHF & UHF Doppler radars were built in an attempt to detect vehicle induced audio frequency modulations. Radar echoes have been consistently received from flight vehicles, and are believed to be suitable in respect to envisioned implementations involving and/or facilitating long range RF based vehicle remote acoustic sensing.

In an example experimental radar, two independent passive multistatic CW Doppler radars were utilized. Both radars provided multistatic velocity information but no range information. Both passive Doppler radars used constant frequency, constant amplitude ATSC pilot signals produced by existing VHF and UHF broadcast television transmitters to illuminate the flight vehicle. The use of preexisting radio transmissions eliminated the need to provide any radar transmitting hardware along with the associated FCC frequency allocation and licensing issues.

Television broadcast signals typically follow several different propagation paths to a radar receiver. The direct path from the transmitter to the receiver is the most common but is not always present due to terrain blockage. The direct path signal appears at a constant frequency in the radar spectrum display and can be used to produce a phase reference. The radar propagation path of most interest is a bistatic path, first from the television broadcast transmitter to the flight vehicle and then scattered energy from the flight vehicle to the radar receiver. The flight vehicle motion causes a Doppler frequency shift corresponding to the changing bistatic path length.

Geographically distributed ATSC television transmitters serving different communities often share the same television broadcast channel producing several closely spaced pilot signals. The geographic separation and terrain blockage are sufficient to prevent terrestrial co-channel interference. High altitude flight vehicles are often illuminated simultaneously by several geographically distributed television transmitters resulting in multiple bistatic radar returns. Different frequency shifts are observed for each bistatic path because of the differing bistatic geometries resulting in a multistatic radar system.

Rockets moving at high speeds produce large Doppler frequency shifts. Aircraft produce similar signatures but with much smaller Doppler frequency shifts. In relation to observing a launch event for example, broadcast television transmitters in multiple different locations (e.g., in three different cities) can be utilized and radar receivers collocated with a telescopic sound camera in another location (e.g., in a fourth city).

Differential vehicle motion, vehicle vibrations and acoustic energy all produce a spectral broadening of the Doppler signal, sometimes called micro-Doppler. The differential vehicle motion can be used to produce vehicle images using inverse synthetic aperture radar (ISAR) techniques. Remote Acoustic Sensing (RAS) using RF illuminated glints is believed to be suitable for implementation by and/or utilizing amplitude, phase or other demodulation. Multistatic radar geometries require additional processing to separate the geometries that correspond to different stereophonic or multi-channel audio signals.

Passive Multistatic Radar Hardware

A passive multistatic Doppler radar can be implemented with little more than a suitable antenna, a low cost Software Defined Radio (SDR) receiver and appropriate software. Better performance requires better hardware with high gain antennas, higher sensitivity and advanced signal processing. In some implementations or environments (e.g., such as those involving a flight vehicle), suitable radars operate, for example, in the VHF and UHF television broadcast spectrum.

The sensitivity of the radar can be analyzed using standard bistatic radar equations. The ATSC transmission includes the actual television signal which appears as broadband noise about 50 dBc below the pilot signal level when using a 1 Hz bandwidth. The SNR is decreased when multiple ATSC transmitters are contributing to the vehicle Doppler signal due to the broad band data signal. In other example and/or contemplated implementations, the main television signal can be used to obtain range information and further improve the radar sensitivity.

Referring to FIG. 1B and as previously indicated, example embodiments described herein involve or facilitate providing a listening device or system (e.g., such as described herein) to an element 200, which can include one or more device(s) and/or system(s) (e.g., such as one or more of the devices or systems referenced herein). In FIG. 1B, the image capturing device(s) 202 is(are) depicted with dashed/broken lines symbolizing that some example embodiments of the present invention do not include or utilize an image capturing device. The image capturing device(s) 202 additionally is(are) depicted (in FIG. 1B) with solid lines symbolizing that some example embodiments of the present invention do include or utilize an image capturing device. In example embodiments and implementations (e.g., those in which the element 200 includes or utilizes one or more image capturing devices), the image capturing device(s) 202 and the AFMS device(s) 204 include or utilize independent sensors (or detectors), and the electronics and/or processor(s) 206 include electronics associated with one or more of the image capturing device(s) 202 and the AFMS device(s) 204. In example embodiments and implementations, the element 200 also includes or operatively interfaces with a communications interface, I/O 208, user input mechanism(s) 210, and/or database(s) 212.

In example embodiments and implementations, the image capturing device(s) 202 and the AFMS device(s) 204 and associated electronics are adapted to capture images of one or more illuminated and/or luminous objects 110 and to obtain audio frequency modulated electromagnetic energy utilizing (sensors of) the AFMS device(s) 204 and in time synchronization with images captured by the image capturing device(s) 202, and such that the image capturing device(s) 202 and the AFMS device(s) 204 provide viewing and listening (outputs), respectively, the listening output including signals and/or information indicating or providing a representation of a disturbance to an electromagnetic field or fields at or associated with at least one of the one or more objects, the disturbance being or including an audio frequency modulation of a signal from or associated with (e.g., received from) at least one of the one or more objects.

In example embodiments and implementations, and with reference also to FIG. 1A (as applicable), the AFMS device 104, or AFMS device(s) 204, can include one or more (time synchronized) optically based audio frequency modulation sensors. The AFMS device(s) 104, 204 can include or utilize, for example, a Model 2001 photoreceiver commercially available from Newport Corporation of Irvine, Calif.

In example embodiments and implementations, the AFMS device 104, or AFMS device(s) 204, can include one or more (time synchronized) RF based sensing devices. The AFMS device(s) 104, 204 can include or utilize, for example, UHF radar consisting of a 400 MHz to 1000 MHz log periodic antenna as input to a FunCube Dongle+ SDR receiver connected to and controlled by a laptop computer. In example and envisioned embodiments or implementations, the AFMS device(s) 104, 204 includes one or more optical detectors, one or more radio frequency (RF) detectors, or a combination of optical and RF detectors. Other sensors or detectors can also be utilized.

In some embodiments and implementations, the electronics and/or processor(s) 106, 206 are adapted (e.g., programmed) to obtain audio frequency modulated electromagnetic energy from images captured by (or otherwise obtained utilizing) sensors of the AFMS device(s) 104, 204 and in time synchronization with images captured by the image capturing device(s) 102, 202. In some embodiments and implementations, the AFMS device(s) 104, 204 is adapted to sense audio frequency (and/or radioacoustic) modulated signal(s) from or associated with (e.g., received from) one or more illuminated and/or luminous object(s) and/or nearby vicinity 110. In example embodiments and implementations, one or more objects sensed by the AFMS device(s) 104, 204 are illuminated by an illumination source 112 (ambient optical, microwave or radio wave electromagnetic energy) and/or are self-luminous. The listening (e.g., audio) output including signals and/or information indicating or providing a representation of a disturbance (e.g., audio frequency or radioacoustic modulation), effected by an acoustic or vibration source and/or direct electrical modulation (or radioacoustic modulation) 114, to an electromagnetic field or fields at or associated with at least one of the one or more objects.

In example embodiments and implementations, the electronics and/or processor(s) 106, 206 are adapted to extract the signals and/or information from images captured only by the AFMS device(s) 104, 204. One or more techniques can be utilized (to extract or otherwise obtain the signals and/or information) involving, for example, amplitude demodulation of optical or RF signals. In this case, the audio frequency modulation changes the intensity of the optical or RF signal as would be caused by the changing curvature (gain) of a vibrating membrane. The audio signal is recovered by detecting the received optical or RF power. Another approach, one that is used in ISAR and micro-Doppler, is to look at the RF phase or frequency modulation independent of the received signal power. Audio frequency phase modulation is the result of changes in the RF path length at audio rates, such as would be caused by a radio wave reflecting from a vibrating surface. The signal can be phase demodulated in a number of ways such as those which would be known and understood by one of skill in the art and/or that are described in published technical literature. Other techniques and implementation particulars can be utilized as appropriate, such as those described in Dan Slater, "Passive Long Range Acoustic Sensor", U.S. Pat. No. 7,551,519 (Jun. 23, 2009), which is incorporated herein by reference in its entirety. In example implementations, the audio output generated by the electronics and/or processor(s) 106 includes audio modulation components extracted from signals received from or associated with at least one illuminated and/or luminous object(s) and/or nearby vicinity.

Thus, in example embodiments and implementations, a device for obtaining or providing listening includes: an image capturing device capable of capturing images of illuminated and/or luminous objects, including an object that is illuminated by ambient optical, microwave or radio wave electromagnetic energy and/or self-luminous, and an electromagnetic signal (energy) detection-facilitated audio frequency modulation sensing (AFMS) device having separate independent sensors, said devices and associated electronics being adapted to capture images of one or more illuminated and/or luminous objects and to obtain audio frequency modulated electromagnetic energy utilizing sensors of said AFMS device, and to generate or facilitate providing a listening output of the AFMS device (e.g., an audio signal) in time synchronization with a viewing output (e.g., video signal) including or utilizing images of said one or more objects captured by said image capturing device, the listening output including signals and/or information indicating or providing a representation of a disturbance to an electromagnetic field or fields at or associated with at least one of said one or more objects, the disturbance being or including an audio frequency modulation of a signal from or associated with (e.g., received from) at least one of said one or more objects.

In example embodiments and implementations, at least one of said separate independent sensors is optically based. In other example embodiments and implementations, at least one of said separate independent sensors implements or is adapted to utilize one or more radio frequency (RF) demodulation or detection technologies. The AFMS device can include, for example, one or more optically based audio frequency modulation sensors. In example embodiments and implementations, the AFMS device includes multiple (e.g., optical) detectors with spatially separated views, said AFMS device and associated electronics being adapted to facilitate stereophonic or multichannel audio frequency sensing. In example embodiments and implementations, the AFMS device includes multiple detectors with observing site separation, polarization separation or wavelength separation, said AFMS device and associated electronics being adapted to facilitate stereophonic or multichannel sound sensing. In example embodiments and implementations, the AFMS device includes multiple radio frequency (RF) receivers with observing site separation, said AFMS device and associated electronics being adapted to facilitate stereophonic or multichannel sound sensing. In example embodiments and implementations, the AFMS device includes one or more optical detectors with or adapted to provide polarization separation, said AFMS device and associated electronics being adapted to facilitate stereophonic or multichannel sound sensing. In example embodiments and implementations, the AFMS device includes one or more radio frequency (RF) detectors with or adapted to provide polarization separation (e.g., vertical and horizontal polarization), the AFMS device and associated electronics being adapted to facilitate stereophonic or multichannel sound sensing.

The one or more illuminated and/or luminous objects include, for example, an object (or a portion of an object) that is illuminated by ambient optical, microwave or radio wave electromagnetic energy and/or self-luminous. In example embodiments and implementations, the one or more illuminated and/or luminous objects include an object (or a portion of an object) that is self-fluctuating. The one or more illuminated and/or luminous objects include, by way of example, an object (or a portion of an object) that is an emissive object, a glinting object, or a combination thereof. In example embodiments and implementations, the one or more illuminated and/or luminous objects include one or more portions of a rocket, a spacecraft, or other (man-made) vehicle.

The disturbance can include an audio frequency modulation of a local optical or radio frequency environment in relation to at least one of said one or more objects. By way of example, the disturbance includes audio frequency modulations of local optical and radio frequency environments in relation to said one or more objects. In example embodiments and implementations, the disturbance includes an audio frequency modulation of an optical illumination source. In example embodiments and implementations, the disturbance includes an audio frequency modulation of the luminosity of at least one of said one or more objects and/or nearby vicinity in relation to said object(s). In example embodiments and implementations, the disturbance includes an audio frequency modulation of the intensity of an optical signal from or associated with (e.g., received from) at least one of said one or more objects. In example embodiments and implementations, the disturbance is or includes an audio frequency modulation resulting from one or more of: an acoustic source, a vibration source, and a direct electrical modulation. In example embodiments and implementations, the disturbance is or includes an audio frequency modulation resulting from one or more of: an acoustic or vibration source and a direct electrical modulation. By way of example, the disturbance is or includes an audio frequency modulation resulting from an acoustic or vibration source, or from a direct electrical modulation. In example embodiments and implementations, the disturbance is or includes an acoustic or vibration modulation of a signal from or associated with (e.g., received from) at least one of said one or more objects. In example embodiments and implementations, the disturbance is or includes an audio frequency non-acoustic modulation of a signal from or associated with (e.g., received from) at least one of said one or more objects. In example embodiments and implementations, the disturbance further includes a radioacoustic modulation of a radio wave illumination source. By way of example, the disturbance further includes a radioacoustic modulation of a (modulated) luminance mechanism associated with at least one of said one or more objects. In example embodiments and implementations, the disturbance (e.g., radioacoustic modulation) causes a spectral broadening of a Doppler signal from or associated with (e.g., echoed from) at least one of said one or more objects. In example embodiments and implementations, the disturbance further comprises one or more of a phase modulation and a frequency modulation of a radio frequency (RF) signal. In example embodiments and implementations, the disturbance (further) includes an audio frequency and/or phase modulation of a signal from or associated with (e.g., received from) at least one of said one or more objects.

In example embodiments and implementations, the element 200 (e.g., a sound camera) includes (and/or utilizes) electronics and/or processor(s) adapted to extract said signals and/or information from images (of at least one of said one or more objects) captured by one or more of the image capturing device and the AFMS device, or alternately, the electronics are adapted to extract said signals and/or information from energy sensed (e.g., images captured) only by the AFMS device. In example embodiments and implementations, one or more of the image capturing device and the AFMS device is or includes one or more sensors, transducers, and/or other mechanisms responsive to energy in the optical and/or radio frequency electromagnetic spectral regions. By way of example, one or more of the image capturing device and the AFMS device includes or is adapted to utilize optical and/or radio wave detectors. In example embodiments and implementations, one or more of the image capturing device and the AFMS device includes or is adapted to utilize one or more sensing technologies that operate in optical and/or radio frequency electromagnetic spectral regions.

In example embodiments and implementations, one or more of the image capturing device and the AFMS device includes or is adapted to simultaneously utilize radio frequency (RF) and optical AFMS sensing techniques.

In example embodiments and implementations, one or more of the image capturing device and the AFMS device includes multiple sensors adapted to detect (or sense) spatiotemporal audio frequency amplitude modulations in (optical) signals from or associated with (e.g., received from) at least one of said one or more objects.

In example embodiments and implementations, one or more of the image capturing device and the AFMS device is adapted to detect (or sense) observable quantities including one or more of radiance, wavelength, directivity and polarization in signals from or associated with (e.g., received from) at least one of said one or more objects.

In example embodiments and implementations, one or more of the image capturing device and the AFMS device is adapted to detect (or sense) polarization in optical signals from or associated with (e.g., received from) at least one of said one or more objects. By way of example, one or more of the image capturing device and the AFMS device is adapted to detect (or sense) polarization (e.g., vertical and horizontal polarization) in radio frequency (RF) signals from or associated with (e.g., received from) at least one of said one or more objects.

In example embodiments and implementations, one or more of the image capturing device and the AFMS device includes or is adapted to utilize multiple sensors adapted to facilitate multichannel sound recording and/or acoustic beam forming (in relation to at least one of said one or more objects).

In example embodiments and implementations, one or more of the image capturing device, the AFMS device, and the associated electronics includes or is adapted to utilize an antenna and/or a radio receiver. In example embodiments and implementations, the image capturing device (and/or associated electronics) is adapted to utilize radar signals (e.g., echoes) from or associated with (e.g., received from) at least one of said one or more objects and (one or more) inverse synthetic aperture radar (ISAR) techniques to produce images (e.g., vehicle images). In example embodiments and implementations, the image capturing device (and/or associated electronics) is adapted to (receive/detect/) utilize radar signals (e.g., echoes) including or providing information involving detected differential (e.g., vehicle) motion to provide or facilitate generation of images (e.g., vehicle images).

As previously indicated, one or more sensing devices (e.g., AFMS device(s) such as described herein) can be used to generate or facilitate providing a listening output.

Thus, in example embodiments and implementations, a method for obtaining or providing listening includes: utilizing one or more sensing devices (e.g., electromagnetic signal (energy) detection-facilitated audio frequency modulation sensing (AFMS) devices) to detect or obtain audio frequency modulated signals received from or associated with one or more illuminated and/or luminous objects; and generating or providing a listening output of the sensing device(s) (e.g., an audio signal), the listening output including signals and/or information indicating or providing a representation of a disturbance to an electromagnetic field or fields at or associated with at least one of said one or more objects, the disturbance being or including an audio frequency modulation of a signal from or associated with (e.g., received from) at least one of said one or more objects.

In example embodiments and implementations, the listening output facilitates, controls, or initiates an action or process of presenting, reproducing, transmitting, or otherwise communicating or making accessible the listening content. The listening output includes, for example, single or multichannel listening content. In a method for obtaining or providing listening, a listening output is generated or provided, for example, utilizing one or more audio monitors or speakers (to present or reproduce the listening output) or a pair of headphone (e.g., to generate multichannel listening content provided by RF RAS devices).

In example embodiments and implementations, a method for obtaining or providing listening includes utilizing one or more indicator devices to generate human (or machine) perceivable aural, visual and/or vibration outputs responsive to or determined from the listening output. In a method for obtaining or providing listening, a listening output is generated or provided, for example, utilizing an indicator device of a safety or assistive device (within which the sensor(s) are located in some implementations) to generate aural, visual and/or vibration outputs responsive to or determined from the listening output or detection thereof. By way of example, the safety or assistive device can include a vibration mechanism operatively connected to a controller that generates a vibration actuation signal or the like responsive to the listening output.

In an example method for obtaining or providing listening, an action or process of generating or providing a listening output includes facilitating an aural sensory input utilizing one or more of the following devices: headphones, earbuds, a hearing aid, a car stereo, a radio, a personal communications and/or computing device, a smartphone, a wearable technology item, a wristwatch, or a media presentation device. (See also FIGS. 6 and 7.) In example embodiments and implementations, the audio frequency modulated signals (detected or obtained by said sensing device(s)) include electromagnetic energy in the radio frequency (RF) spectral region. In example embodiments and implementations, the audio frequency modulated signals (detected or obtained by said sensing device(s)) include electromagnetic energy in multiple different (e.g., optical and radio frequency) electromagnetic spectral regions.

Example embodiments described herein involve a device for obtaining or providing listening that includes an element of industry or manufacture, the element including or being adapted to utilize or operatively interface with one or more AFMS devices and/or other sensing devices. The element can be of human or non-human industry or manufacture, and can include devices and systems outside the realm of industry and manufacture. For example, the AFMS device(s) are adapted to obtain audio frequency modulated signals received from or associated with one or more illuminated and/or luminous objects (e.g., including an object that is illuminated by ambient optical, microwave or radio wave electromagnetic energy and/or self-luminous) and the element and AFMS device(s) and associated electronics being adapted to generate or facilitate providing a listening output of the AFMS device(s), the listening output including signals and/or information indicating or providing a representation of a disturbance to an electromagnetic field or fields at or associated with at least one of said one or more objects, the disturbance being or including an audio frequency modulation of a signal from or associated with at least one of said one or more objects.

With reference to FIG. 1B, in example embodiments and implementations, the element 200 (FIG. 1B) includes or is adapted to utilize or operatively interface with the AFMS device(s) 204. In example embodiments and implementations, the element does not include or utilize an optical imaging device. In example embodiments and implementations, the AFMS device(s) include (or consist of) sensing devices that facilitate sensing only in radio frequency (RF) electromagnetic spectral regions. In example embodiments and implementations, the AFMS device(s) include sensing devices that are responsive to and facilitate sensing of energy in multiple different (e.g., optical and radio frequency) electromagnetic spectral regions.

The element 200 can be, for example, a device or system for providing or obtaining viewing and/or listening outputs, signals, or content obtained utilizing an acoustic or vibration sensing device responsive to the movement of air or other molecules. In example embodiments and implementations, the element is a listening device or system, said element 200 and AFMS device(s) 204 and associated electronics being adapted to provide aural capability (e.g., short range aural capability, long range aural capability, or both) in a manner other than, and independent of whether the device or system utilizes, an acoustic or vibration sensing (or detecting) device responsive to the movement of air or other molecules.

In example embodiments and implementations, the element 200 includes or utilizes an optical imaging device adapted to provide or obtain a viewing output.

In example embodiments and implementations, the element 200 is: a device or system for providing, obtaining, utilizing, generating or reproducing sounds (e.g., embodying one or more technologies utilized by musicians, composers, editors, or producers of music or soundtracks, in sound design, or involving audio media or listening outputs, signals, or content in general); a hearing aid or hearing augmentation device or system; a pair of headphones; a wrist watch, head gear, an article of clothing, or wearable technology item or apparel; a personal computing and/or communications device or peripheral device thereof; a warning or detection device or system; or an aircraft or other vehicle detection device or system.

In example embodiments and implementations, the element 200 and the AFMS device(s) 204 and associated electronics are (further) adapted to utilize sensor outputs of said AFMS device(s) to facilitate, control, or initiate an action or process performed by or involving said element. For example, one or more electronic display or other devices and systems can be controlled in relation to effect at least a portion of the action or process.

The action or process (performed by or involving said element) includes, for example: characterizing airflow and atmospheric turbulence (e.g., wind shear); or sensing waves on a self-luminous vibrating liquid surface.

In example embodiments and implementations, the element 200 is an atmospheric seeing monitor and the action or process includes astronomical seeing.

In example embodiments and implementations, the AFMS device(s) 204 include one or more multispectral sensing devices and the action or process includes sensing surfaces or other objects that emit or reflect at different wavelengths.

In example embodiments and implementations, the AFMS device(s) 204 include one or more multispectral sensing devices and the action or process involves sensing (e.g., and utilizing different wavelength filters on two different telescopes respectively) to derive or obtain stereophonic information. Such listening outputs can be provided one to each ear using a pair of RAS headphones, for example, utilizing visible light and shortwave IR channels to provide multispectral stereophonic listening (see also FIG. 6).

In example embodiments and implementations, the AFMS device(s) 204 include one or more multispectral sensing devices and the action or process involves or effects communications (e.g., facilitates a communications function or process such, for example, obtaining or providing stereophonic listening and/or information).

In example embodiments and implementations, the element 200 is a device or system for facilitating or utilizing sensory enhancement and/or sensed feedback and the action or process includes providing at least or only the listening output for and in relation to providing extra-sensory inputs and/or information.

In example embodiments and implementations, the element 200 is a device or system for facilitating or utilizing sensory enhancement and/or sensed feedback and the action or process includes providing extra-sensory inputs and/or information to an operator of a vehicle. For example, early cues to race car drivers pertinent to location and movements of competing drivers' vehicles and/or mode of, or changes in engine, transmission, and other vehicles' components operation.

In example embodiments and implementations, the element 200 is a device or system for facilitating or utilizing sensory enhancement and/or sensed feedback and the action or process includes providing or obtaining a viewing output of said one or more objects, and generating or providing the listening output in time synchronization with the viewing output.

In example embodiments and implementations, the element 200 is a device or system for facilitating or utilizing sensory enhancement and/or sensed feedback and the action or process includes providing at least the listening output for and in relation to locating at least one of said object(s).

In example embodiments and implementations, the element 200 is a device or system for facilitating or utilizing sensory enhancement and/or sensed feedback and the action or process includes providing at least the listening output for and in relation to locating or tracking at least one of said object(s).

In example embodiments and implementations, the element 200 is an object locating and/or tracking device or system, the viewing output being provided by a moveable imaging device, and the action or process includes providing the listening output in conjunction with the viewing output to look for said object(s), the outputs being mutually informing to an operator repositioning the imaging device in search of said object(s) when said object(s) is(are) observable, that is, perceived or perceivable by the operator, from both the viewing output and the listening output. A viewing output is supplemented with a listening output obtained or provided by one or more electromagnetic signal (energy) detection-facilitated audio frequency modulation sensing devices thereby providing an optical-acoustic location device.

In example embodiments and implementations, the element 200 is a laser device or system (e.g., a laser guide star, a laser pointer, or other device or system including or utilizing lasers, for example, to provide a laser light show) and the action or process includes or involves RAS facilitated detection of aircraft and/or other vehicles (e.g., for which there are actual or potential vulnerabilities or concerns in relation to laser exposure) (and, in some implementations, transmitting or otherwise providing a warning to the detected aircraft or other vehicle and/or facilitating, controlling, or initiating other actions or processes to eliminate or decrease the risk of laser exposure).

In example embodiments and implementations, the element 200 is a microwave device or system (e.g., a microwave antenna) and the action or process includes or involves RAS facilitated detection of aircraft and/or other vehicles (e.g., for which there are actual or potential vulnerabilities or concerns in relation to microwave exposure) (and, in some implementations, transmitting or otherwise providing a warning to the detected aircraft or other vehicle and/or facilitating, controlling, or initiating other actions or processes to eliminate or decrease the risk of microwave exposure).

In example embodiments and implementations, the element 200 is a vehicle-based or vehicle-interfaced device or system (e.g., a radio) and the action or process includes utilizing said device or system to provide an indication or warning in relation to: detection of flashing strobes indicating an emergency vehicle; detection of Xenon headlights indicating an approaching vehicle; detection of LED brake lights indicating a decelerating vehicle; detection of alternator or other vehicle component induced modulations of taillights indicating a particular vehicle type or model (e.g., operational characteristics of different types or models of vehicles being identifiable by their respective listening device observable "aural signatures"); or detection of a LED modulation of and indicating that an automatic license-plate recognition (ALPR) camera is in use. (See also FIG. 7.)

As to providing an indication or warning in relation to the ALPR camera being in use, a device or system can be provided or adapted to produce RAS sound responsive to detection (by an acoustic sensor) of a modulation—for example, detection of the 3 level LED modulation in a P372 Spike+ ALPR camera, available from PIPS Technology Inc. of Knoxville, Tenn.

In example embodiments and implementations, the element 200 is a safety (or assistive) device or system for visually and/or hearing impaired persons (e.g., a walking cane provided with a RF AFMS device, associated electronics and power source, and an indicator such as for example, a vibration device and/or a speaker or wifi transmitter adapted to generate a warning in the form of one or more indicators suitable for perception by a blind or visually impaired person and, in some implementations, accommodating a person who is hearing impaired as well) and the action or process includes utilizing said device or system to provide an indication or warning in relation to detection of RAS activity in relation to a vehicle (e.g., detection of nearby RAS activity such as shiny spinning hubcaps on cars or flashing beacons on emergency vehicles).

In example embodiments and implementations, the element 200 is a detection or measurement device or system and the action or process includes capturing or otherwise obtaining: aerospace imagery, telescopic imagery, microscopy imagery, diagnostic imagery, medical imagery, meteorological imagery, military imagery, security imagery, or space imagery. By way of example, such a detection or measurement device or system is capable of capturing or otherwise obtaining (and/or adapted to utilize special purpose computers, software, and/or databases that facilitate specialized detection, measurement, and/or analysis functions, features or processes in relation to): aerospace imagery, telescopic imagery, microscopy imagery, diagnostic imagery, medical imagery, meteorological imagery, military imagery, security imagery, or space imagery.

In example embodiments and implementations, the element 200 is: a device or system for providing extra-sensory inputs/information to an operator of a vehicle or a machine; or a device or system providing or facilitating a RAS-enhanced virtual reality experience or other RAS-enhanced observing.

Thus, in example embodiments and implementations, a device for obtaining or providing listening includes (or consists of): an element of (human or non-human) industry or manufacture including or adapted to utilize or operatively interface with one or more electromagnetic signal (energy) detection-facilitated audio frequency modulation sensing (AFMS) devices, said AFMS device(s) being adapted to obtain audio frequency modulated signals received from or associated with one or more illuminated and/or luminous objects (e.g., including an object that is illuminated by ambient optical, microwave or radio wave electromagnetic energy and/or self-luminous), said element and AFMS device(s) and associated electronics being adapted to generate or facilitate providing a listening output of the AFMS device(s), the listening output including signals and/or information indicating or providing a representation of a disturbance to an electromagnetic field or fields at or associated with at least one of said one or more objects, the disturbance being or including an audio frequency modulation of a signal from or associated with at least one of said one or more objects.

Example embodiments described herein involve a method for obtaining or providing listening that includes capturing and/or accessing images (e.g., provided by imaging sensors) of one or more illuminated and/or luminous objects as viewing content, and extracting from other images (provided by one or more separate independent sensors or detectors) signals and/or information facilitating the generation and provision of listening content. In example embodiments and implementations, the method involves sensing utilizing one or more separate independent sensors (or detectors) adapted to obtain audio frequency modulated electromagnetic energy from said other images. The method includes, for example, extracting signals and/or information from said other images, and providing a listening output (e.g., an audio signal) determined from the extracted signals and/or information and a viewing output (e.g., video signal) from or associated with the images.

Thus, in example embodiments and implementations, a method for obtaining or providing listening includes: capturing and/or accessing (e.g., accessing captured) images (e.g., provided by imaging sensors) of one or more illuminated and/or luminous objects (e.g., an object that is illuminated by ambient optical, microwave or radio wave electromagnetic energy and/or self-luminous, or portions of said objects) as viewing content; extracting from other images provided by one or more separate independent sensors (or detectors) adapted to obtain audio frequency modulated electromagnetic energy from said other images signals and/or information facilitating the generation and provision of listening content including an audio representation or indication of a disturbance to an electromagnetic field or fields at or associated with at least one of said one or more objects; and providing a listening output (e.g., an audio signal) determined from the extracted signals and/or information and a viewing output (e.g., video signal) from or associated with the images.

In example embodiments and implementations, the viewing and/or listening outputs (are adapted to) facilitate, control, or initiate an action or process of (or involving) presenting, reproducing, transmitting, or otherwise communicating or making accessible the listening content in time synchronization with the viewing content or one or more portions or images thereof. The listening output includes, for example, single or multichannel listening content time synchronized with said viewing content.

Multiple different "versions" of viewing content (e.g., selections or arrangements of; cuts, edits, revisions or corrections to; visual or special effects or other image processing applied to; coding, metadata or other information added to) can be made or provided from the same sequence, collection or group of captured images. Multiple different viewing outputs can be provided in relation to and/or facilitating access to particular viewing and/or listening content—such as, for example, an output that is required in relation to generating or providing the viewing (and/or listening) content, or a pair of viewing and listening outputs.

In relation to any particular viewing content or output, in some implementations, multiple different "versions" of listening content can or may also be provided. For example, multiple different "versions" of listening content can be made or provided utilizing various selections of (as well as different mixes, filtering, modifications, corrections, mastering, and audio signal processing of and/or coding, metadata or other information added to) sounds and/or other sensed or detected information obtained by one or more of, for example: one or more separate independent sensors (or detectors) adapted to obtain electromagnetically audio frequency modulated electromagnetic energy; one or more electromagnetic signal (energy) detection-facilitated audio frequency modulation sensing (AFMS) devices; an acoustic sensing device that includes or is adapted to utilize optical and/or radio wave detectors; one or more sensors, transducers, and/or other mechanisms responsive to energy in the optical and/or radio frequency electromagnetic spectral regions; one or more sensing technologies that operate in optical and/or radio frequency electromagnetic spectral regions; an acoustic sensing device that includes or is adapted to simultaneously utilize radio frequency (RF) and optical acoustic sensing techniques; one or more acoustic sensing devices responsive to energy in multiple different (e.g., optical and radio frequency) electromagnetic spectral regions; acoustic sensing devices respectively directed toward different objects; multiple spatially separated acoustic sensing devices; multiple sensors (or detectors) adapted to detect spatiotemporal audio frequency amplitude modulations in signals; an acoustic sensing device adapted to detect observable quantities including one or more of radiance, wavelength, directivity and polarization in signals; an acoustic sensing device adapted to detect polarization in optical signals; an acoustic sensing device adapted to detect polarization in radio frequency (RF) signals; and an acoustic sensing device that includes or is adapted to utilize multiple sensors adapted to facilitate multichannel sound recording and/or acoustic beam forming. Multiple different listening outputs can be provided in relation to and/or facilitating access to particular viewing and/or listening content—such as, for example, an output that is required in relation to generating or providing the (viewing and/or) listening content, or a pair of viewing and listening outputs.

Example embodiments described herein involve a method for obtaining or providing listening that includes extracting or otherwise obtaining from sensing device obtained energy or other outputs (e.g., provided by one or more separate independent sensors or detectors) signals and/or information facilitating the generation and provision of listening content. In a method for obtaining or providing listening (e.g., that involves extracting signals and/or information, and/or obtaining one or more optical signals), a listening output can be generated or provided, for example, by processing or filtering an optical signal from or associated with at least one of said one or more objects to obtain or determine an audio frequency modulation of the intensity of the optical signal (e.g., to observe pyrotechnics, UFO, plume dynamics of rocket). In a method for obtaining or providing listening (e.g., that involves extracting signals and/or information, and/or obtaining one or more RF signals), a listening output can be generated or provided, for example, by processing a radio frequency (RF) signal from or associated with at least one of said one or more objects to obtain measurements of acoustically induced RF Doppler shift (e.g., caused by flight vehicle motion).

Example embodiments described herein involve a method for obtaining or providing listening that includes extracting or otherwise obtaining signals and/or information from sensing device obtained energy or other outputs provided by one or more separate independent sensors (or detectors). In example embodiments and implementations, the method (further) includes utilizing the signals and/or information to facilitate the generation and/or provision of listening content. In example embodiments and implementations, said one or more separate independent sensors include (or consist of) one or more electromagnetic signal (energy) detection-facilitated audio frequency modulation sensing (AFMS) devices.

In example embodiments of the devices and methods for obtaining or providing listening described herein, the AFMS device(s) include, for example: an acoustic sensing device that includes or is adapted to utilize optical and/or radio wave detectors; one or more sensors, transducers, and/or other mechanisms responsive to energy in the optical and/or radio frequency electromagnetic spectral regions; one or more sensing technologies that operate in optical and/or radio frequency electromagnetic spectral regions; an acoustic sensing device that includes or is adapted to simultaneously utilize radio frequency (RF) and optical acoustic sensing techniques; one or more acoustic sensing devices responsive to energy in multiple different electromagnetic spectral regions; acoustic sensing devices respectively directed toward different objects; multiple spatially separated acoustic sensing devices; multiple sensors adapted to detect spatiotemporal audio frequency amplitude modulations in signals; an acoustic sensing device adapted to detect observable quantities including one or more of radiance, wavelength, directivity and polarization in signals; an acoustic sensing device adapted to detect polarization in optical signals; an acoustic sensing device adapted to detect polarization in radio frequency (RF) signals; or an acoustic sensing device that includes or is adapted to utilize multiple sensors adapted to facilitate multichannel sound recording and/or acoustic beam forming.

Example embodiments described herein involve obtaining or providing both viewing and listening (e.g., devices, systems, and methods involving or utilizing images provided by imaging sensor(s) of an image capturing device).

In example embodiments and implementations, a method for obtaining or providing listening (further) includes utilizing electronics associated with, and/or utilizing software or computer executable program(s) to process signals or other outputs of one or more of said imaging device sensor(s) and said listening device sensor(s) for and in relation to providing the sound and/or information to, and/or to control an electronic display or user interface of, or an action or process performed by or involving: one or more of the devices, systems, or elements described herein (the descriptions thereof, being incorporated here by reference).

In example embodiments and implementations, a method for obtaining or providing listening (further) includes utilizing electronics associated with, and/or utilizing software or computer executable program(s) to process signals or other outputs of one or more of said imaging sensor(s) and said one or more separate independent sensors for and in relation to providing the listening output to, and/or to control an electronic display or user interface of, or an action or process performed by or involving: a camera or other image capturing device or system (e.g., including suitable optics, electronics and/or processors, communications and I/O interfaces, and user input mechanisms, as applicable); a device or system for providing, obtaining, utilizing, generating or reproducing sounds (e.g., listening devices, technologies utilized by musicians, composers, editors, or producers of music or soundtracks, in sound design, or involving audio media or listening outputs, signals, or content in general); a hearing aid or hearing augmentation device or system; a safety or assistive device or system for visually and/or hearing impaired persons; headphones, earbuds, a car stereo, a radio, a personal communications and/or computing device, a smartphone, a wearable technology item, a wristwatch, or a media presentation device; a warning or detection device or system, or an aircraft or other vehicle detection device or system; a detection or measurement device or system; a device or system facilitating or utilizing sensory enhancement and/or sensed feedback; a device or system for providing extra-sensory inputs/information to an operator of a vehicle or a machine; or a device or system providing or facilitating a RAS-enhanced virtual reality experience or other RAS-enhanced observing.

Devices and systems and interfaces (e.g., of or provided or utilized by one or more of the devices or systems referenced herein) can be adapted in various ways to provide or facilitate providing sensory inputs. In example implementations, human sensory based inputs are provide or facilitated either alone or in combination with one or more physiological interface provided inputs. For example, one or more devices such as headphones, earbuds, hearing aids and the like, or a car stereo, portable radio, personal communications device (e.g., smartphone), wearable technology item (e.g., wristwatch), or media presentation devices generally can be utilized or adapted to provide listening outputs (e.g., such as described herein) as aural sensory inputs. In some implementations, one or more electronic displays (e.g., of or provided or utilized by one or more of the devices or systems referenced herein), a vehicle-based or -provided display (e.g., head up display), personal communications device (e.g., smartphone), or media presentation devices generally can be utilized or adapted to provide viewing outputs (e.g., such as described herein) as visual sensory inputs. Electronically or otherwise applied or induced inputs can also be provided as part of a sensory interface, and one or more of the aforementioned inputs can be utilized to facilitate, initiate or control one or more functions or components of a sensory interface. A sensory interface can include or be provided in whole or in part by one or more of the various devices or systems herein, and may also include or involve remotely located and/or distributed or shared components (and associated communications devices/mechanisms) as well as simulated, virtual or diagnostic inputs. A sensory interface can include or be provided in whole or in part by one or more sensory augmentation devices or systems, which can include computer or executable program controlled components or elements.

Example embodiments described herein involve or facilitate human sensory augmentation, or more generally, human sensory devices and systems. Such devices and systems can involve or facilitate, for example: physiological and neurological interfaces with one or more human sensory organs, or at or facilitating a neurological situs of, or operational interface provided for, one or more removed or missing sensory organs; sensory organ-replacement and/or -augmentation devices or systems; body part-replacement and/or -augmentation devices or systems; processing modules and/or interfaces and controllers (for the above); or a combination thereof.

In example implementations, outputs of the AFMS device(s) are filtered and/or processed to provide the listing output (which can include sounds and/or information). For example, received signals as detected can indicate that a vehicle is approaching or other RAS activity. Outputs of the AFMS device(s) can be filtered and/or processed, by way of example, utilizing one or more filters or no filter (e.g., in relation to one or more sensor output signals of the AFMS device(s)), multiple filters, different types of filters (e.g., high-pass, low-pass, different wavelength filters, bandpass, dual- or multi-band, dual- or multi-mode, and other filters and, as applicable, utilizing various parameters and coupling structures), adjustable, adaptive, or synthesized filters, and utilizing filter and/or processor inputs including but not limited to: user inputs, processor determined inputs, interrupts, communications device, or other device generated inputs. For example, one or more of the sensors can provide an input utilized in relation to filtering and/or processing. Filter or processor inputs can also be obtained or provided from one or more databases, or in some implementations received from remotely located or other providers of information, inputs, telemetry, commands, control signals, and the like.

In relation to the listening output, for example, a filtering (or signal processing) input, parameter, configuration, or mode of operation can be adjusted responsive to a provided input such as, for example, a user adjustable input in relation to or effecting one or more types of modulation detection and/or in relation to (e.g., electromagnetic spectrum-specific) electronics and/or processing resources (e.g., available to a particular device or system and, in some implementations, user or otherwise selectable) for extracting signal and/or information from sensed electromagnetic energy. Such an input can be determined and/or provided during or as a result of sensing in multiple different (e.g., optical and radio frequency) electromagnetic spectral regions, in consideration of for example a user's preferences, perceptions, and/or performance in relation to content of the respective spectral regions.

For example, such an input can relate to one or more types of modulation, or contrast (e.g., as perceived by a particular user). By way of example, an input determined from or representing a particular combination of inputs (e.g., a preferred combination as indicated by a particular user, or by analysis of the user's performance, for example, in detecting objects with different and/or varying inputs applied) can be provided. By way of another example, a user input derived of or representing a user's perception of (e.g., preferences in relation to) mutually informing viewing and listening outputs can provided.

Figure 6:
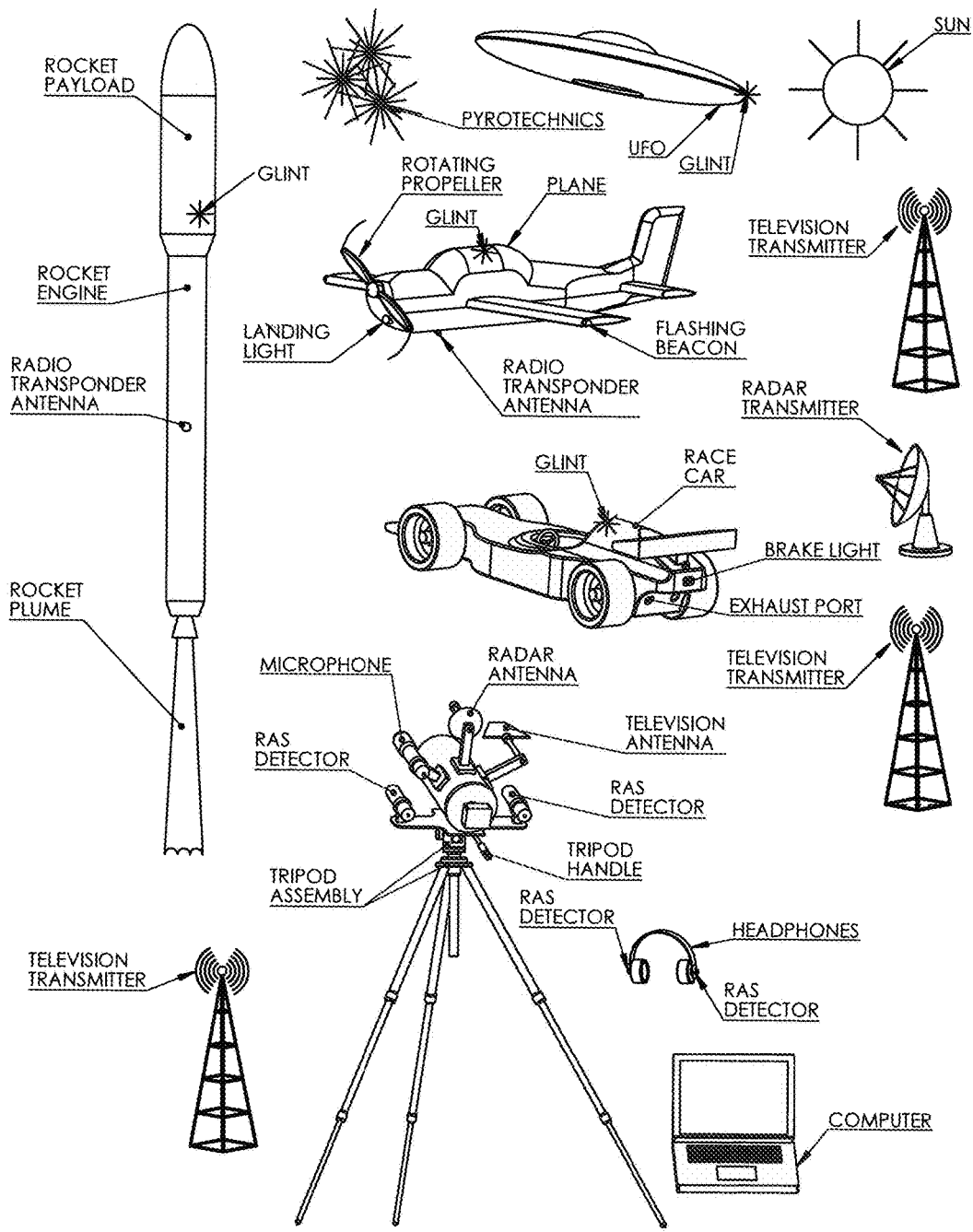
FIG. 6 is an illustration showing an example sound camera, examples of illuminated and/or luminous objects, and example illumination sources.
Figure 7:
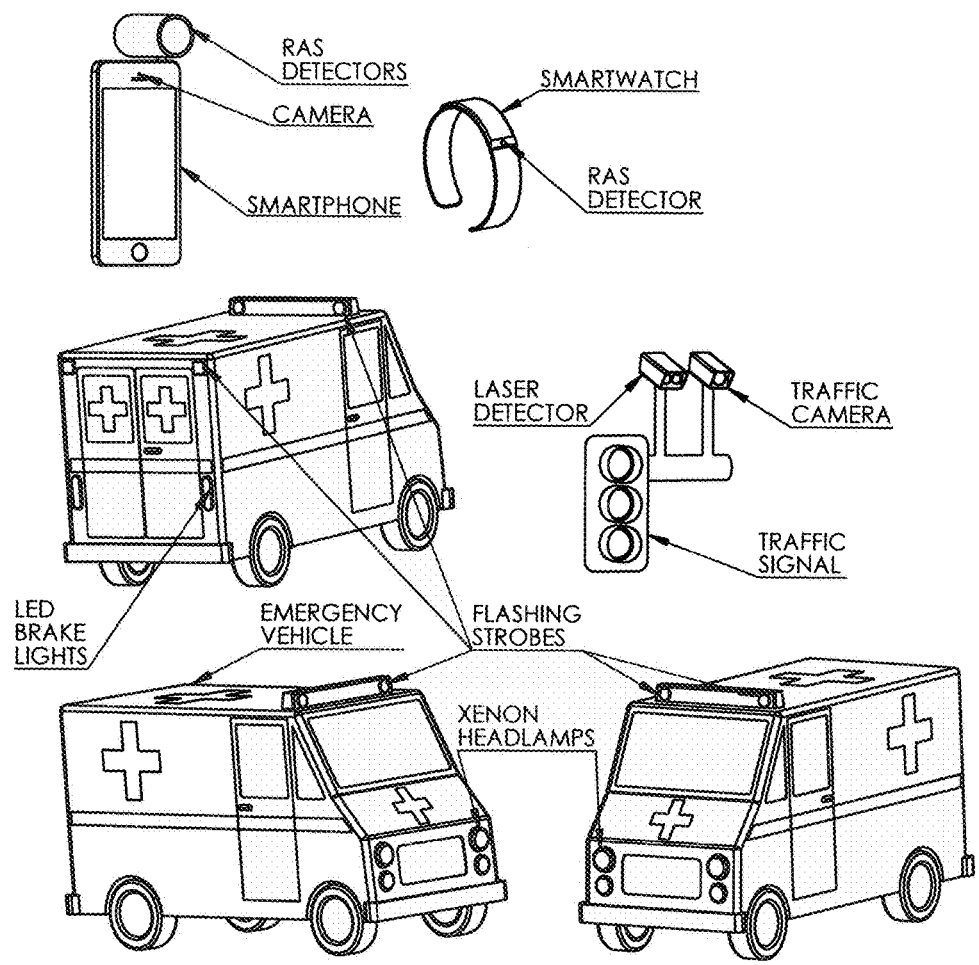
FIG. 7 is an illustration showing additional examples of illuminated and/or luminous objects and illumination sources.

Referring additionally to FIG. 6, example embodiments and implementations described herein involve or facilitate sensing (or detecting) of or in relation to objects, events or phenomena (e.g., areas/sources of actual or potential listening interest to a person or entity and/or in relation to a warning or detection, safety, measuring and analysis, safety, security, monitoring, or other observing). By way of further example, potential areas/sources of listening interest are inter alia discoverable in nature or in relation to or involving vehicles or other man-made objects, fireworks or other pyrotechnics, UFOs and other at least observable objects, events and phenomena.

Example embodiments described herein involve sensing of and in relation to objects, events or phenomena and/or the aforementioned as well as other areas/sources of actual or potential listening interest.

Thus, in example embodiments and implementations, a method for obtaining or providing listening includes: capturing and/or accessing (e.g., previously captured) images provided by one or more imaging device sensors (or detectors) of one or more illuminated and/or luminous objects; utilizing one or more listening device sensors (or detectors) to obtain audio frequency modulated electromagnetic energy from other images of said one or more objects for and in relation to facilitating the generation or provision of sound and/or information in association with said images (e.g., an audio track for a video generated from the video images) including an audio representation or indication of a disturbance to an electromagnetic field or fields at or associated with at least one of said one or more objects; and providing viewing and/or listening content from or associated with the images with additional and/or replacement content including said sound and/or information (e.g., additional or replacement audio for one or more portions of the viewing content). In example embodiments and implementations, a method for obtaining or providing listening (further) includes generating or providing viewing and listening outputs adapted to facilitate, control, or initiate an action or process of (or involving) presenting, reproducing, transmitting, or otherwise communicating or making accessible the additional and/or replacement content (including said sound and/or information) in time synchronization with the viewing and/or listening content or one or more portions or images thereof. In example embodiments and implementations, the sound and/or information is generated or provided in association, and in time synchronization, with said images. In example embodiments and implementations, said one or more listening device sensors (or detectors) are separate and independent from said imaging device sensors—and, in some implementations (e.g., multichannel), separate and independent from each other as well.

In example embodiments and implementations, a method for obtaining or providing listening (further) includes utilizing electronics associated with, and/or utilizing software or computer executable program(s) to process signals or other outputs of one or more of said imaging device sensor(s) and said listening device sensor(s) for and in relation to providing the sound and/or information to, and/or to control an electronic display or user interface of, or an action or process performed by or involving: one or more of the devices, systems, or elements described herein (the descriptions thereof, being incorporated here by reference).

Technologies and methodologies described herein are suitable as well in relation to adapting, modifying, enhancing, or retrofitting an image capturing device to provide a device or mechanism for listening to illuminated and/or luminous objects(s) and/or nearby vicinity.

Example embodiments described herein involve a method for obtaining or providing listening that includes adapting an image capturing device that is capable of (or adaptable to be capable of) capturing images of illuminated and/or luminous objects (e.g., an object that is illuminated by ambient optical, microwave or radio wave electromagnetic energy and/or self-luminous) to obtain audio frequency modulated electromagnetic energy from other images and to generate or facilitate providing a listening output.

Example embodiments described herein involve a method for obtaining or providing listening that includes adapting an image capturing device to utilize one or more separate independent sensor(s) to generate or facilitate providing a listening output of the AFMS device (e.g., in time synchronization) with a viewing output.

Thus, in example embodiments and implementations, a method for obtaining or providing listening includes: adapting an image capturing device that is capable of (or adaptable to be capable of) capturing images of illuminated and/or luminous objects (e.g., an object that is illuminated by ambient optical, microwave or radio wave electromagnetic energy and/or self-luminous) to utilize one or more separate independent sensor(s) including at least one electromagnetic signal detection-facilitated audio frequency modulation sensing (AFMS) device to obtain audio frequency modulated electromagnetic energy from other images captured by or otherwise obtained utilizing said separate independent sensor(s) and to generate or facilitate providing a listening output of the AFMS device in time synchronization with a viewing output including images of one or more illuminated and/or luminous objects, the listening output including signals and/or information indicating or providing a representation of a disturbance to an electromagnetic field or fields at or associated with at least one of said one or more objects, the disturbance being or including an audio frequency modulation of a signal from or associated with at least one of said one or more objects.

In example embodiments and implementations, said step of adapting an image capturing device includes modifying, enhancing, and/or retrofitting the image capturing device integrating or operatively interfacing the image capturing, AFMS device(s) and associated electronics. In example embodiments and implementations, said step of adapting an image capturing device includes providing one or more of the AFMS device(s) as a peripheral of the image capturing device, or as a modular (e.g., internal or external) component or add-on thereof.

In example embodiments and implementations of a method for obtaining or providing listening, the image capturing device is included in or provided as part of: a device or system including, utilizing or involving a hearing aid or hearing augmentation, headphones, earbuds, a car stereo, or a radio; a personal communications and/or computing device or peripheral device thereof, a laptop or notebook computer or tablet, a smartphone, a wearable technology item, a wristwatch, or a media presentation device; a device or system including, utilizing or involving an eye or ear; or one or more of the devices, systems, or elements described herein (the descriptions thereof, being incorporated here by reference).

The image capturing device is, for example, included in or provided as part of a device or system that is capable of capturing or otherwise obtaining, and/or adapted to utilize special purpose computers, software, and/or databases that facilitate specialized detection, measurement, and/or analysis functions, features or processes in relation to: aerospace imagery, telescopic imagery, microscopy imagery, diagnostic imagery, medical imagery, meteorological imagery, military imagery, security imagery, or space imagery.

In example embodiments and implementations, a method for obtaining or providing listening (further) includes adapting electronics associated with, and/or software or computer executable program(s) or a mobile app to process signals or other outputs of, one or more of said imaging capturing device and said AFMS device for and in relation to generating or providing the listening output.

In example embodiments and implementations of a method for obtaining or providing listening, the image capturing device is included in or provided as part of an element including one or more device(s) and/or system(s) (e.g., such as one or more of the devices or systems referenced herein), and the method further includes: adapting electronics associated with and/or software or computer executable program(s) or a mobile app to process signals or other outputs of one or more of said imaging capturing device and said AFMS device for and in relation to providing the listening output to, and/or to control an electronic display or user interface of, or an action or process performed by or involving at least one of said device(s) and/or system(s).

With reference to FIGS. 1A and 1B, in example embodiments and implementations, the AFMS device(s) 104, 204 include or utilize one or more optical detectors or sensors such as, for example: one or more solar arrays or cells, photodetectors, or other optical sensor devices or mechanisms. With reference to FIG. 1B, in example embodiments and implementations, the element 200 (FIG. 1B) includes or is adapted to utilize or operatively interface with the aforementioned one or more optical detectors or sensors; and the element 200 (and/or the one or more optical detectors or sensors) and associated electronics are (further) adapted to utilize sensor outputs of said one or more optical detectors or sensors to facilitate, control, or initiate an action or process performed by or involving said element. In example embodiments and implementations, the element 200 is or includes one or more device(s) and/or system(s) such as, for example: space-based assets (e.g., one or more solar arrays of a spacecraft or satellite); electronics (e.g., power scavenging circuitry); a detection/sensing device of a (small-sized) spacecraft or satellite equipped with a telescope array (e.g., photovoltaic concentrator array) or a RAS photodetector array; a spacecraft or satellite equipped with a SARAS interface and audio downlink; high altitude balloon canopies or (satellite) solar sails configured as large microphone diaphragms in combination with solar array sensors (or conventional RAS photoreceivers); solar arrays (e.g., planetary rover solar arrays) configured to provide detection/sensor devices having (and in some embodiments/implementations radiation-tolerant) telescope functionality; and a microscopic implementation of a solar cell or photodetector that detects audio rate optical modulations caused by microfauna/for detecting microscopic life.

Example embodiments described herein involve utilization (configuring of) spacecraft solar arrays as detectors/sensors, for example, as RAS detectors for detection of planetary emissions (lightning, hum from city lights, etc.) along with nearby rendezvous proximity operations (RPO), nearby inspector satellite detection and self-generated noise (thruster firings, momentum wheel vibrations, etc.).

Example embodiments described herein involve utilization (configuring of) spacecraft solar arrays (of a pico satellite, for example) as a low data rate lasercom receiver for spacecraft commanding and for self-powered zombie satellite recovery. Zombie satellites, for purposes of this description, are those that do not have an operational command uplink capability, either due to a failure of the RF command receiver or a computer latch up or failure. Currently, some known spacecraft use periodic forced flight computer restarts to try to regain control. The self-powered SARAS provides an alternate command link/reboot source that is independent of the other spacecraft systems.

Example embodiments described herein involve utilizing/configuring a solar array to power electronics (e.g., SARAS electronics).

Example embodiments described herein involve technologies and methodologies for providing high sensitivity to a detection/sensing device of a (small-sized) spacecraft or satellite (e.g., CubeSat). By way of example, a detection/sensing device of a small-sized spacecraft or satellite is equipped with (e.g., modified, retrofitted or otherwise (re-) configured to include or utilize) a simple solar panel array, a telescope array (e.g., photovoltaic concentrator array) or a RAS photodetector array (and additional interfaces as described herein) to provide high sensitivity detection/sensing functionality in a small package (that is, notwithstanding the relatively small scale of the spacecraft or satellite).

Example embodiments described herein involve utilizing/configuring a spacecraft (e.g., a satellite) with a SARAS interface and audio downlink for providing (additional) acoustic information in an audio bandwidth downlink channel (of the spacecraft). Such information can also be stored on the spacecraft or further processed, e.g., such as the zombie case (further discussed below).

Example embodiments described herein involve technologies and methodologies for providing detection capabilities utilizing high altitude balloon canopies and (satellite) solar sails as (creating, what are in effect) large microphone diaphragms in combination with solar array (SARAS) sensors (or conventional RAS photoreceivers). It is envisioned that the balloon canopy microphone would be capable of detecting wind turbulence, balloon vibrations, launch and flight termination activity and probably infrasonic sounds in the atmosphere. The satellite solar sails microphone facilitates detection of (for example) deployment activity, thruster firings, gyro and motor vibrations, debris shedding, micrometeorites, space debris, and atmospheric drag and reentry sounds. In both cases, RAS can be multichannel with the optical detectors for example looking at different quadrants of the high altitude balloon or solar sail.

Example embodiments described herein involve adapting/configuring solar arrays (e.g., planetary rover solar arrays) to provide detection/sensor devices having (and in some embodiments/implementations radiation-tolerant) telescope functionality for detection of (for example) weather phenomena, winds, lighting, dust devils, aurora, etc.

Example embodiments described herein involve technologies and methodologies for providing a microscopic implementation of a solar cell or photodetector (e.g., configuring planetary landers with microscopic RAS technology) that detects audio rate optical modulations, which may prove useful for the detection and characterization of life on—or in—other worlds.

Sounds of other worlds may include Martian dust devils and surface flows of boiling water, Jovian lightning storms and aurorae, Io volcano plumes, Saturn ring motions along with geysers on moons, Neptunian volcanos and Sun glints off Titan's hydrocarbon lakes. Thus, both macro scale and microscopic RAS may prove useful on planetary landers. Planetary rovers augmented with RAS and SARAS could listen to weather conditions including wind flow and turbulence, twisters, lightning, aurorae, rain and fluid sounds as well as locally generated rover sounds caused by locomotion, gimbal drive motions, vortex shedding and sample acquisition operations.

Remote Acoustic Sensing (RAS) can be implemented in a variety of ways. But in general RAS relies on an (a preexisting) acoustically or mechanically excited object modulating light or other electromagnetic energy which is then remotely sensed. In one form of optical RAS (Bell, A.G. supra), a membrane, illuminated by both the Sun and the speaker's voice, is an acousto-optic modulator (AOM).

Example embodiments of the methodologies and technologies described herein primarily involve/utilize low pixel-count photoelectric readout sensors with a very wide dynamic range (up to 24 bits) and very high sample rates (up to 48 KHz) and, in some example embodiments/implementations, in combination with a diversity of optics and AOM methods. The methodologies and technologies described herein seek to provide improvements and innovations, and in various ways, in respect to "listening" to observables—not ordinarily capable of being listened to due to distance, environment, limitations of the human ears, etc.—that often include (but are not limited to) naturally formed/occurring AOMS, and sometimes more than 1 photosensor and sometimes more than one optical receiver location or orientation are utilized, for example SARAS (further discussed below) may use 6 different sensing surfaces on a CubeSat, all of which are sensitive to different viewing directions. The following portions (of this detailed description) relate to optical implementations.

Methodologies and technologies described herein involve/utilize, for example, naturally existing in situ membrane AOMs such as preexisting windows, thin shiny surfaces and vehicle skins. Two optical and one acoustic propagation links (AOM illumination source, AOM acoustic source and AOM-to-optical receiver) are simultaneously required for some RAS variants to work. RAS can also be extended to stereophonic and multichannel sound by using multiple distributed in situ AOMs, and when combined with high-definition video it holds the potential to provide a cinema-like immersive viewing experience.

The term "RASSat" (RASSat=RAS Satellite) refers to methodologies and technologies, such as example embodiments and implementations described herein, that utilize advanced optical sensors to view and recover audio from distant objects that have weak optical modulations produced by local sound and vibration sources; modulated light sources and the RAS sensor are passively coupled at the speed of light, yielding a variety of interesting sounds across the entire human auditory range, such as terrestrial sound sources observable from LEO, along with associated acousto-optic modulation mechanisms. RASSat sensitivity is such that both day and night strong, easily detectable terrestrial acousto-optic emitters abound, and applications to Space Situational Awareness, Rendezvous and Proximity Operations and planetary exploration are also evident. The following provides an overview of the RAS measurement methodologies and technologies as described herein, and highlights key RASSat design features, performance capabilities and applications.

Example embodiments described herein involve/utilize a RAS methodology that facilitates listening to planetary surface acoustic activity from an orbiting spacecraft. Below, system requirements for RASSat are summarized, followed by a discussion of some of the easier-to-observe terrestrial acoustic sources along with the associated acousto-optic modulation mechanisms. Also described are results from a ground-based simulation system using scaled optics to observe nearby terrestrial scenes with suitably attenuated signal levels that correspond to on-orbit views, and a RAS technology demonstrator payload and how to integrate it into the 3U RASSat.

An understanding of a (particular, relevant, or simply of interest) range of observable RAS targets is informative of technical/implementation details, especially the design and performance requirements for the RAS payload module and various spacecraft subsystems. Fortunately, much can be learned in this regard from ground-based situations which simulate LEO-based performance.

The RASSat Payload Simulator

To better understand terrestrial acoustic observability from an orbiting spacecraft, a RAS Simulator (RASSIM) was fabricated. The simulator used baseline visual and aural RASSat sensor hardware but with a much smaller optical aperture and focal length to reduce the received optical signal to what it would be at RASSat orbital distances. The aperture and focal length scaling produces fields of view and signal levels at 5- to 20-km distances comparable to those observable from a RASSat in a 400-km LEO orbit.

RASSIM includes both full focal length and scaled aperture and focal length imagers and RAS detectors. The full focal length imager and RAS detector is intended to view scaled test objects and also supports RASSat optics development. The full focal length imaging telescope operates at 500 mm f/6.2. The scaled focal length imager and RAS detector views full scale objects from scaled orbital distances and is used to evaluate on-orbit observability. The scaled focal length imaging telescope operates at 25 mm f/6.2 to reduce the viewing distance by a factor of 20. In other words, viewing an object at a distance of 20 km with the scaled optics would be equivalent to an on orbit observation from a 400-km viewing distance. Other scaled lens focal lengths and apertures are also used to change the observing scale factor as appropriate.

RASSIM uses a small-aperture RAS receiver with lens entrance pupil diameter scaled by the test view to orbital-view distance. For example, according to the inverse-square law, observing a scene with a 0.8-mm aperture telescope at a 16-km distance would produce a similar signal level as an 80 mm aperture telescope at a 1600-km distance. The 81 mm aperture RASSat telescope uses a 500-mm focal length. The simulator uses a 25-mm focal length variable aperture lens.

A variety of natural and cultural scenes of opportunity are observable with the RASSIM under both day and night conditions. Examples of naturally occurring phenomena include lightning, water/air surface interactions (wave heights and surface roughness), erupting volcanos, ice flows, etc. Cultural phenomena include various types of lighting, flames and flares, etc.

When possible, the scene distance was determined and the RAS signal quality recorded (or generally noted). Using these two parameters, an on-orbit RAS observability table was created as shown in Table 3 (below). The results are approximate but regardless suggest that some terrestrial acoustic observations would be viable from LEO. The strongest terrestrial signals generally involve flames, pyrotechnics, fireworks and lightning. It should be noted that these observations were primarily horizontal, while satellite observations are generally downward (vertical). Additionally, optical emissions from vehicle lights, beacons and many other light sources are generally directed at low elevation angles; accordingly, detectability for such emissions would likely be worse than shown here.

TABLE 3

On-orbit RASSat observability based on variable-aperture RASSIM terrestrial observations.

| Scene | Scene Distance | Day | Night | Notes |
|---|---|---|---|---|
| Lightning storms | 14 km/80 km | 560 km (strong) | 3200 km (strong) | Very strong RAS emitter |
| Fireworks | 16 km/16 km | 640 km (strong at dusk) | 640 km (strong) | Very strong RAS emitter |
| City lights | 6 km/20 km | 240 km (weak) | 800 km (strong) | Strong 50/60 Hz and harmonics |
| Stadium lights | 18 km/18 km | 720 km (weak) | 720 km (strong) | Anaheim stadium, dusk |
| Radio tower beacon | 11 km/11 km | 440 km (strong) | 440 km (strong) | KFI radio tower (large beacon) |
| Aircraft in flight | 2 km/25 km | 80 km (strong) | 1000 km (moderate) | Xenon beacons, lights, solar glints |
| Automobiles | 3 km/6 km | 120 km (weak) | 240 km (moderate) | Headlights, tail lights, solar glints |
| Emergency vehicles | /4 km | Possible | 160 km (weak) | Assumes upward emission |
| Large LED sign | /18 km | ? | 252 km (weak) | Sounds change with picture |
| Forest & building fires | 6 km | 7 km (brush fire-weak) | ? | Flames are strong RAS emitters |

The small RASSat CubeSat acoustic sensitivity is relatively low but there are strong easily detectable terrestrial acoustic emitters, both day and night. The strongest acoustic signals typically are associated with high energy acousto-optic emissions such as, for example, lightning, rocket plumes, flames and fireworks displays. Solar glinting objects provide another potentially observable acousto-optic modulation mechanism. Additionally there are interesting non-acoustic yet audio frequency-modulated optical emitters observable from orbital distances including city AC lighting and aircraft beacons. RASSat could also observe vibrations and acoustic energy produced by itself, the launcher and other glinting spacecraft such as the International Space Station (ISS).

Figure 13:
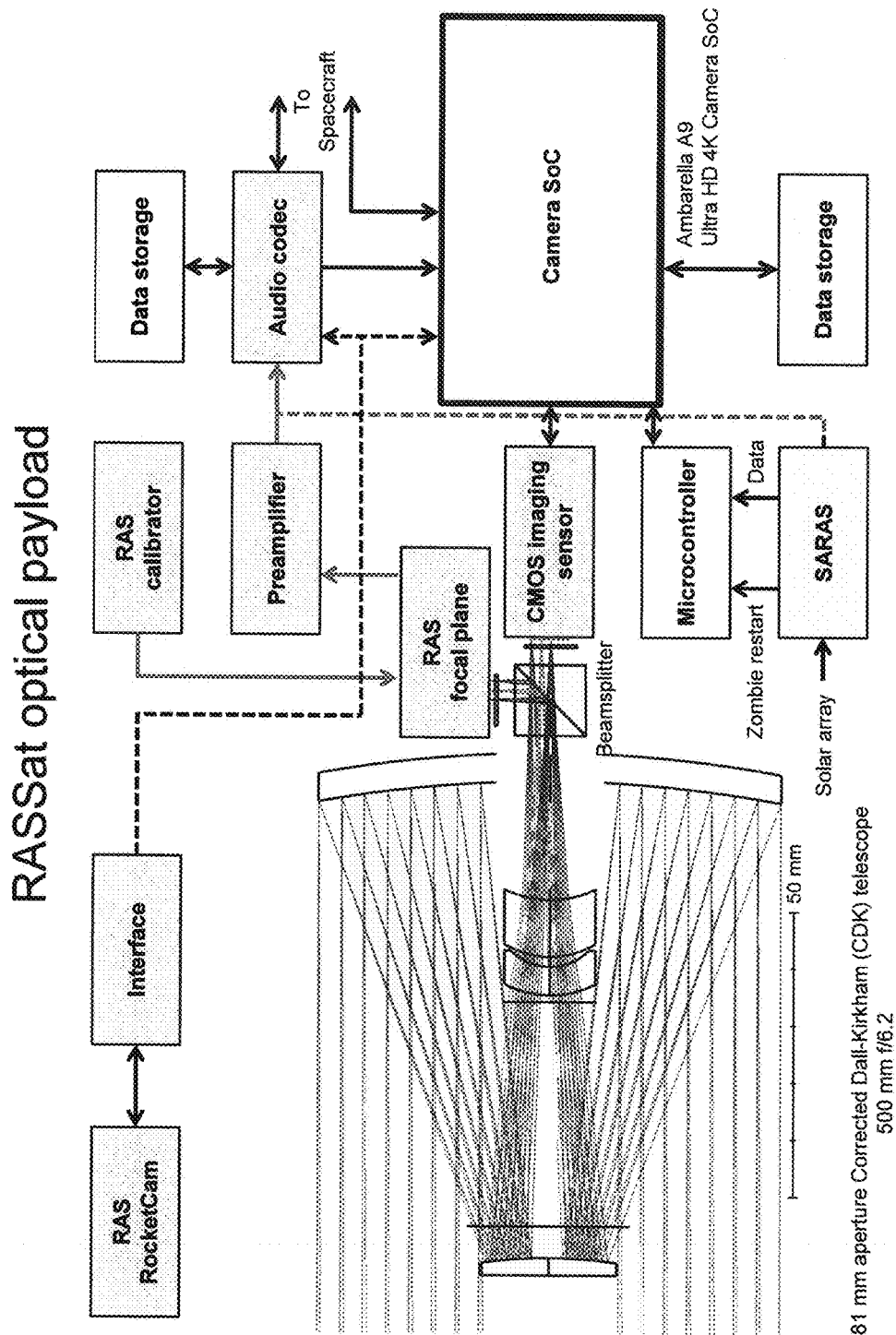
FIG. 13 is a block diagram of RASSat optical payload.

At the top level, RASSat is generally similar to other small remote-sensing satellites such as the Planet Labs Dove series but with the addition of acoustic detection capability. Several RAS payload sensor architectures were evaluated before selecting a shared-aperture telescope using separate imaging and acoustic readout sensors, as discussed below. See also RASSat optical payload (FIG. 13), which is discussed (in sections below and herein).

RASSat Sensor Payload

In example embodiments/implementations of a RASSat spacecraft, the sensor payload can include (or consist) of a variety of RAS-based sensors rather than just one, plus an imaging device (or devices) that facilitate a quality imaging capability to provide context for the RAS observations. The sensor payload can also include, or be provided with or configured to utilize, an intermediate RAS demonstrator sensor package (e.g., onboard a spacecraft such as the ISS, either in series with or parallel to the RASSat project). Ideally, the overall optical design and packaging of this (the aforementioned) ISS version should be close to that planned for RASSat. Finally, to keep costs low it is desirable/preferable, to the extent practical, to employ commercially available optical equipment and particularly in respect to ground-based lab and field work.

Overall Telescope Design

RASSat is a remote sensing satellite that views the Earth both visually and aurally at moderate resolution. In example embodiments and implementations, RASSat includes a telescope with various focal plane sensors, for example, a CMOS imager (for the context imaging) and several RAS detectors. Several RAS sensor payload architectures were evaluated before selecting a shared-aperture telescope design using separate imaging and opto-acoustic sensors. The imaging performance for such a system is in the range of <10-m Ground Sample Distance (GSD). In respect to telescope design requirements, by way of example, the RASSat telescope includes an aperture at least 80 mm in diameter (or as needed) to achieve the desired ~10-m ground resolution (but <100 mm so it can fit comfortably within the 1U cross section) and a focal length that provides optimal spatial sampling, high-quality imagery along with visible and NIR spectral compatibility (while still fitting comfortably within a 3U length).

Starting with the end goal of space-grade optics, two telescope options were considered: one employing a space-modified Commercial Off-The-Shelf (COTS) lens (two variants were assessed) and an alternative design incorporating a custom low-mass, radiation-tolerant telescope design. The COTS telescopes provide high-quality imagery; and the alternative design is configured to provide even better optical performance. These three options are compared in Table 4 (below).

TABLE 4

Small telescopes suitable for use in remote-sensing CubeSats. This table compares a Nikon 500-mm type-N COTS mirror lens with the proposed custom RASSat telescope lens. Also shown is a high-quality Questar telescope as used by the first-and second-generation Planet Labs Dove CubeSats. Note: The Nikon lens is capable of 42-mm image circle but with reduced performance.

| Parameter | Nikon COTS | RASSat custom | Questar |
|---|---|---|---|
| Aperture | 81 mm (measured) | 81 mm (specification) | 89 mm (specification) |
| Central obscuration | 38 mm (measured) | 24 mm (design) | 31 mm (measured) |
| Focal length | 500 mm (specification) | 500 mm (specification) | 1140 mm (Dove ref) |
| f-number | 6.2 (calculated) | 6.2 (calculated) | 12.5 (calculated) |
| t-number | 8 (specification) | | |

TABLE 4-continued

Small telescopes suitable for use in remote-sensing CubeSats. This table compares a Nikon 500-mm type-N COTS mirror lens with the proposed custom RASSat telescope lens. Also shown is a high-quality Questar telescope as used by the first- and second-generation Planet Labs Dove CubeSats. Note: The Nikon lens is capable of 42-mm image circle but with reduced performance.

| Parameter | Nikon COTS | RASSat custom | Questar |
|---|---|---|---|
| Focal region diameter | 8 mm (RASSat requirement) | 8 mm (specification) | >8 mm |
| Wavelength | Visible/near infrared | 400-900 nm (specification) | Visible/near infrared |
| Resolution | Near diffraction limited (measured/calculated) | Diffraction limited | Diffraction limited |
| Illumination uniformity | >98% (calculated) | >97% (calculated) | |
| Geometric distortion | <0.4% (calculated) | <0.5% (calculated) | |
| Thermal control | None (refocus is needed) | Athermalized design | Cervit/Invar/composites |
| Radiation environment | Several months LEO (estimated) | 8 years LEO (estimated) | >3 year LEO mission |
| Maximum mechanical diameter | 90 mm (measured) | 90 mm (estimated) | |
| Optical length (front vertex to focal plane) | 142 mm (calculated) | 113 mm (calculated) | 320 mm (Dove ref) |

In respect to the COTS options, the closest suitable in terms of performance readily available CubeSat-sized space telescope assembly is the high quality 89-mm aperture space-rated Questar Maksutov telescope, as was used by the original Planet Labs Dove 3U CubeSats and also by other rocket and space-based systems. Tsitas, S. R. and J. Kingston, "6U CubeSat Design for Earth Observation with 6.5 m GSD, Five Spectral Bands and 14 Mbps Downlink," The Aeronautical Journal, November 2010, vol. 114 no. 1161 689; Verdone, P., "A Telescope Suitable for Rocket-Borne Instrumentation," NASA Goddard Space Flight Center, November 1966. The Dove Questar telescope uses a combination of a Cervit primary mirror and either an Invar housing or a composite truss to provide focus stability. The Dove satellites provide imagery in the 3- to 5-m resolution class. See Boshuizen, C. R., J Mason, P. Klupar and S. Spanhake, "Results from the Planet Labs Flock Constellation," 28th Annual AIAA/USU Conference on Small Satellites, Logan, Utah (2014), which is hereby incorporated by reference. One disadvantage of the Questar telescope is its length, taking up much of a 3U CubeSat volume.

Figure 14:
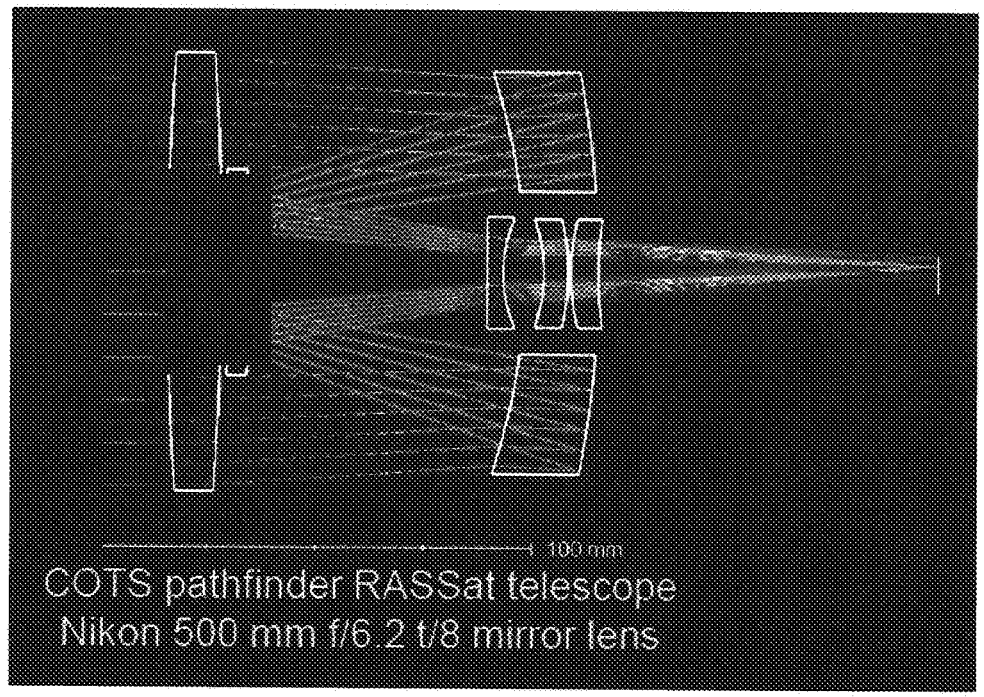
FIG. 14 shows a COTS pathfinder RASSat telescope.

Referring to FIG. 14, which shows a COTS pathfinder RASSat telescope, for RASSat, the telescope was designed around a commercial off-the-shelf (COTS) lens instead: a Nikon 500-mm f/8 N mirror lens with an 81-mm aperture was selected. Although this particular Nikon mirror lens is no longer made it is high-quality and easy to find in the used camera marketplace. Even though the lens is specified as f/8 it actually is an f/6.2 optical design although with a t/8 light loss. The f/6.2 aperture provides good spatial sampling (2.5-m GSD at 400-km range) when using a 1.55-micron pixel size sensor typical of GoPro and many other small modern imaging sensors. The optical performance of this lens is excellent when using only the central 8-mm diameter region of the 42-mm diameter focal plane. The optical model for this lens is described in U.S. Pat. No. 4,666,259, which is hereby incorporated by reference. The aforementioned optical model was then mathematically modeled using Zemax optical-design software. Actual imagery acquired using this lens coupled to a modified GoPro camera was evaluated and found to perform close to the predicted performance expectations. Various low-cost, readily available COTS telescopes can be used for RAS sensor and support equipment development, RASSat breadboard development, and if sufficiently modified e.g., as described herein, also for ISS-based experiments and possibly in a CubeSat design.

Figure 15:
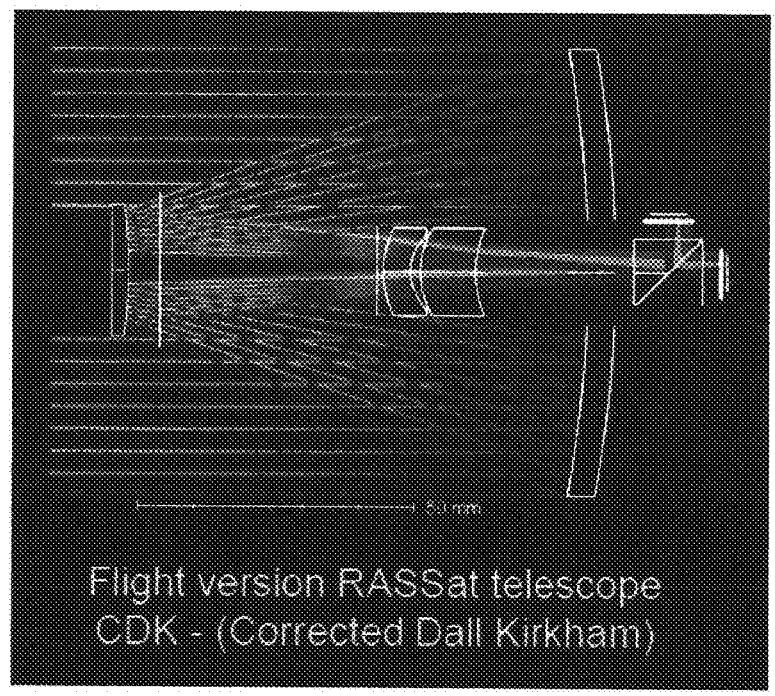
FIG. 15 shows a (flight version) CDK RASSat telescope.

Referring to FIG. 15, which shows a (flight version) CDK RASSat telescope, for the custom RASSat option, a Corrected Dall Kirkham (CDK) design was selected; most performance metrics for this option are better than the COTS design with the penalty of longer development schedule and higher cost. The basic Dall Kirkam telescope uses an elliptical primary mirror with a spherical secondary mirror, and provides excellent on-axis performance but degrades elsewhere. The spherical secondary mirror simplifies manufacturing while also improving mechanical stability and alignment ease. The addition of a two-element refractive optical corrector using radiation-tolerant glasses corrects the off-axis performance to provide a fully diffraction-limited focal plane. In pursuit of optimizing the optical design, size, mass and thermal sensitivity were minimized (to the extent possible or permitted by other requirements) while providing diffraction limited performance. This custom telescope design has an identical aperture and focal length to the COTS telescopes but with a smaller overall envelope, less mass, better optical performance and mechanical stability, and it is radiation tolerant (to space-radiation effects).

For most ground uses and ISS interior operation, telescopes such as these can be readily refocused when needed. But focusing the telescope in a CubeSat is more difficult. If the focus drift is fast and large, it is not practical to keep the telescope in focus. A better approach is to athermalize the telescope using a combination of optical material selection, structure design and active and/or passive temperature control. The Questar space telescopes use low coefficient of thermal expansion (low-CTE) materials including Cervit, Fused Silica and Invar (carbon fiber and titanium in later versions). For the space-grade COTS and custom CDK telescope designs, low-CTE reflectors and structural materials would be used, combined with passive thermal focus compensation and control. Having a mechanical focus trim capability is also prudent. The COTS Nikon telescope is, and custom telescope options can be (for example), at Technology Readiness Level (TRL) 3; athermalization can also be provided. In respect to TRL, see generally: https://en.wikipedia.org/wiki/Technology_readiness_level.

Optical Design and Sensor Layout

Referring again to FIGs. CC, the telescope output passes as shown through a visible/near infra-red (NIR) dichroic cube beamsplitter to a pair of focal regions. The custom RASSat telescope design compensates for the spherical aberration that a cube beam splitter would normally introduce into the telescope output beam. A 12.5 mm cube beamsplitter (e.g., a COTS 12.5 mm beamsplitter cube) was selected over a thin plate or pellicle beamsplitter for reasons of mechanical robustness and in the case of the thin plate easier to control optical aberrations.

The straight through beam is to the color 1/2.3" CMOS imaging sensor. The right angle near infrared beam passes to several remote acoustic sensors and LEDs. Key optical characteristics of the various sensors and detectors are summarized in Table 5 (below). Further with regard to FIG. 13, in this example embodiment, the RASSat optical payload 1300 includes the CDK RASSat telescope 1310 (see FIG. 15), a beamsplitter 1312, RAS focal plane 1314, a RAS calibrator 1316, a preamplifier 1318, a CMOS imaging sensor 1320, a microcontroller 1322, an interface 1330 (in this example, denoted "SARAS"—further discussed below) between the microcontroller and a solar array (not part of the payload), an audio codec 1340, a camera System on Chip (SoC) 1342 (e.g., Ambarella A9 Ultra HD 4K Camera SoC), data storage 1344, a system 1350 (in this example, denoted "RAS RocketCam"—further discussed below) and its interface 1352, configured as shown. In an example embodiment, Core to the design is an 81-mm aperture Corrected Dall-Kirkham (CDK) telescope with 500-mm focal length and f/6.2 lens, and the fully integrated payload module occupies a volume of ~1.5U.

As was the case with the telescope, a COTS imager was selected for RASSat that would be easy to use for the numerous ground support-related activities and for possible use in orbit. A modified GoPro camera is baselined. That is, a standard GoPro 4 black (GP4B) was modified by removing the original lens and adapting it to attach to the Nikon lens via a standard c-mount adapter. A useful ground-test version of the RASSat main telescope includes (or consists of nothing more than) the Nikon 500-mm mirror lens coupled directly to the modified GoPro camera.

GoPro cameras such as discussed herein provide a compact and fully self-contained imaging system including video capture, video image storage, RAS audio recording, LCD image viewing and configuration setup along with internal battery power storage. The GoPro can also simultaneously output standard-definition RS-170A and high-definition HDMI video with resolutions up to 4K at 30 frames per second. The GoPro camera is compatible with external remote control. At minimum, the modification requires removing the original fisheye lens. If baselined for use in space, significant additional mass, material, thermal and electromagnetic compatibility modifications are required. Ecliptic Enterprises Corporation has considerable experience with modifying COTS cameras for use in space (see Ecliptic's website, www.eclipticenterprises.com), so other options are also available.

TABLE 5

RASSat main telescope geometry. (Assumptions: 400 km slant range, D = 81-mm aperture diameter, f = 500-mm focal length, λ = 0.5-micron, 1/2.3" sensor.)

| Image format | 1080p wide | 1080p narrow | 4K | RAS |
|---|---|---|---|---|
| Horizontal pixels | 1920 = 5.952 mm | 1920 = 2.976 mm | 3840 = 5.952 mm | 2 = 2 mm |
| Horizontal field of view | 0.682° = 4762 m | 0.341° = 2381 m | 0.682° = 4762 m | 0.229° = 1600 m |
| Vertical pixels | 1080 = 3.348 mm | 1080 = 1.674 mm | 2160 = 3.348 mm | 2 = 2 mm |
| Vertical field of view | 0.384° = 2678 m | 0.192° = 1339 m | 0.384° = 2678 m | 0.229° = 1600 m |
| Diagonal field of view | 0.783° = 5463 m | 0.391° = 2731 m | 0.783° = 5463 m | 0.324° = 2263 m |
| Pixel size (d) | 3.10 μm | 1.55 μm | 1.55 μm | 1000 μm |
| Ground Sample Distance (GSD) | 6.2 μrad = 2.48 m | 3.1 μrad = 1.24 m | 3.1 μrad = 1.24 m | 1571 μrad = 800 m |
| FWHM (1.03λ/d) | 6.4 μrad = 2.5 m | 6.4 μrad = 2.5 m | 6.4 μrad = 2.5 m | 6.4 μrad = 2.5 m |
| Airy disk (2.44λ/d) | 15.1 μrad = 6.0 m | 15.1 μrad = 6.0 m | 15.1 μrad = 6.0 m | 15.1 μrad = 6.0 m |
| Sampling density (fλ/d) | 0.99 | 1.99 | 1.99 | 0.003 |

The right angle beam splitter port (see FIG. 13) illuminates several photosensors that provide the RAS capability. The primary RAS photodetector is a 2×2 pixel Silicon photodiode with 1-mm pixels centered in the focal plane. In example embodiments and implementations, additional and/or other RAS photosensors are also included in the focal plane. Compared to conventional imagers and radiometers, the RAS photoreceivers are optimized for detecting very weak low-level audio-frequency modulations present on a strong optical carrier. In example embodiments and implementations, an audio frequency-modulated focal plane LED with relatively high optical gain and directivity for simple downlink experiments is also provided. This would support simple low data-rate non-laser optical downlink capability/functionality.

RAS interface electronics (FIG. 13) provide signal conditioning and sensor calibration. A Sun protection shutter can also be added or included.

The RASSat payload, in this example embodiment, also include a system for capturing, controlling and managing data on remote platforms in extreme environments and/or for providing situational awareness (e.g., prior likelihood information), such as a small developmental version of an Ecliptic Enterprises Corporation RAS RocketCam™ a very compact wide angle video camera with stereophonic RAS capability. This provides a limited backup in case of failure of the main RASSat telescope. Other applications for this sensor include use as a star camera and for sensor space qualification in support of other projects. The camera is, for example, a Sony FCB-MA130 providing a 53° horizontal field of view with 1080p video and still images up to 13 Mpixel resolution. In an example embodiment/implementation, the RASSat payload includes a RAS RocketCam or like system configured to be operational Technology Readiness Level (TRL) 5 and a GoPro camera, such as, instead of the Sony FCB-MA130.

Solar Array Remote Acoustic Sensing (SARAS)

Figure 21A:
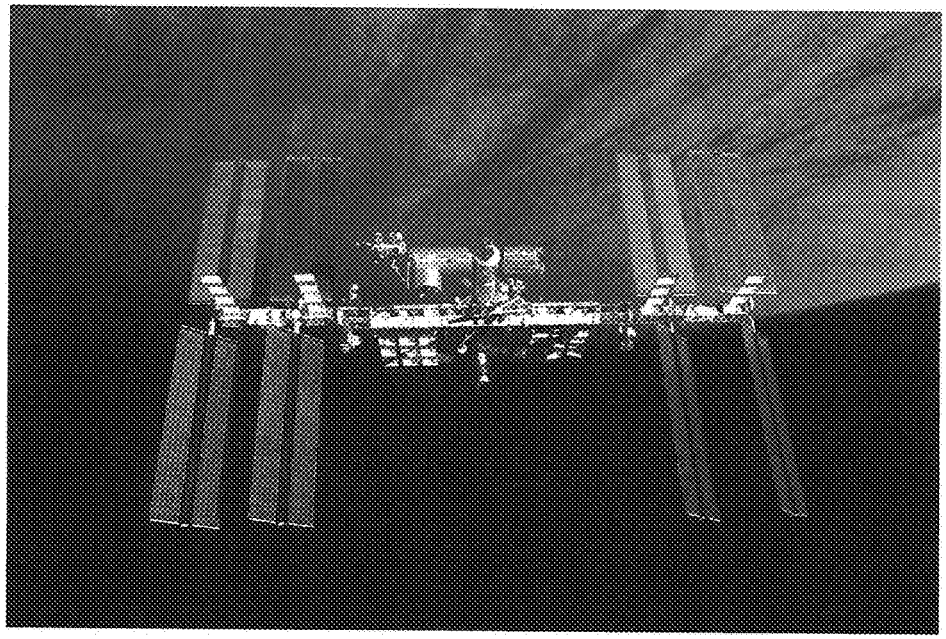
FIG. 21A shows an example of large spacecraft solar arrays.

Another important RAS-based technology is Solar Array Remote Acoustic Sensing (SARAS), which is isolated and separated from the primary RAS payload, which includes a self powered multichannel audio signal extractor and possibly a digital command decoder, possibly with zombie restart capability. Generally speaking, SARAS utilizes solar arrays (e.g., existing spacecraft solar power arrays—see e.g., FIGS. 21A and 21B) to form large-area RAS detectors. Though the solar array parasitic capacitance generally limits the frequency response to audio frequencies, the solar array otherwise can be quite sensitive to audio-frequency light intensity fluctuations. In an example embodiment, SARAS consists of power-scavenging electronic circuitry connected directly to the solar arrays along with electronics that extract the multichannel audio signals.

For SARAS, operational viability of Technology Readiness Level (TRL) 4 has been demonstrated using a 1 ft$^2$ spacecraft silicon solar array test panel with power scavenging, including audio-frequency transfer function measurements performed with both Silicon and multi junction solar cells.

Figure 16:
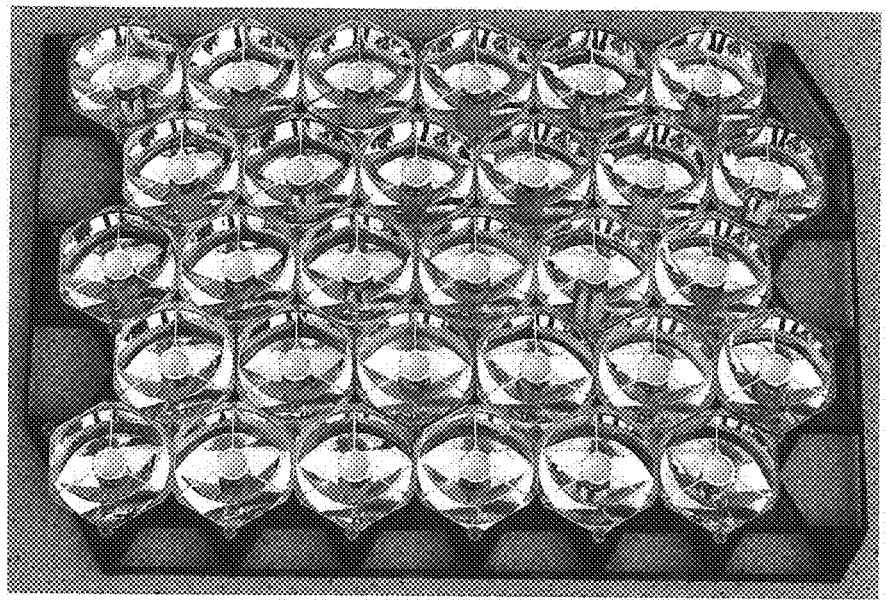
FIG. 16 shows a photovoltaic solar (optical) concentrator array.
Figure 17:
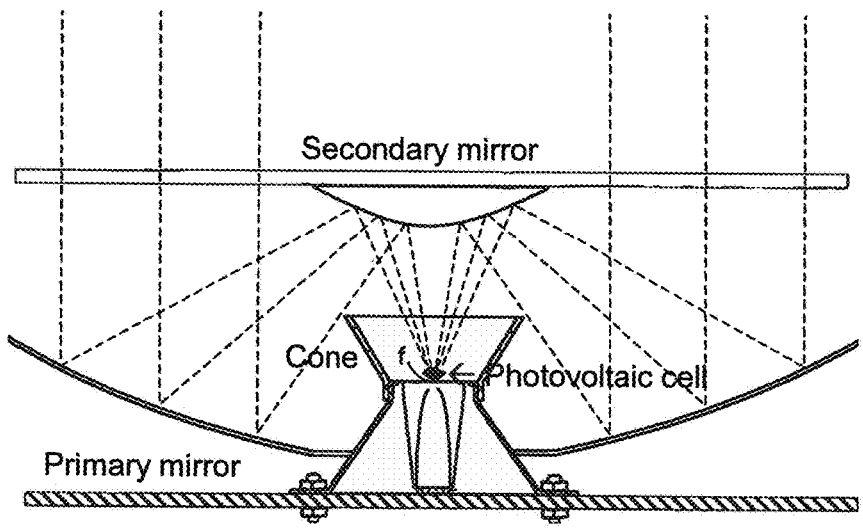
FIG. 17 is a cross-sectional view of a solar concentrator photovoltaic element (of the array shown in FIG. 16)

Example embodiments described herein involve technologies and methodologies for providing a detection/sensing device (e.g., of a small-sized spacecraft or satellite) with a telescope array (e.g., photovoltaic concentrator array). Such an array can be a photovoltaic solar (optical) concentrator array configured, for example, as shown in FIGS. 16 and 17. These figures show: Solar concentrator array 35×24×2 cm (14"×10"×1") used for SARAS test, which includes:

Individual photovoltaic collector
  4 mm (0.16 in) diameter GaAs photovoltaic cell
  1.1 vdc open circuit, 4 ma short circuit current
Optical concentrator photovoltaic module
  Cassegrain optics with 51 mm (2") primary mirror
  12 mm (0.5") secondary mirror, 6 mm (0.25") cone
  1.1 vdcopen circuit, 110 ma short circuit current
  Collector area is 0.00196 m$^2$. This is 28× current gain
2×15 element concentrator photovoltaic array
  16.5 volt open circuit, 0.22 amp short circuit current
  0.06 m$^2$ total collector area
  Equivalent to a 0.274 m (11 inch) aperture telescope By way of example, each solar concentrator photovoltaic element (FIG. 17) includes a photovoltaic cell, a cone, a primary mirror, and a secondary mirror (e.g., configured as shown).

Further with regard to SARAS in respect to some example implementations, solar-array detector surface areas (varying in size from tiny picosats up to and including the International Space Station—essentially any size is useful) are already present on many spacecraft. A variety of strong audio-frequency modulated terrestrial sources may (and likely should) be detectable from LEO altitudes.

Besides RAS detection, solar power arrays with SARAS hold the potential to be used for attitude determination, both day and night and to receive low data-rate uplinks from distant lasercom transmitters. Solar arrays have previously been used for daytime attitude determination by looking at the array current flow. See Boshuizen. By utilizing the methodologies and technologies described herein, night time attitude determination may also be possible, for example, by detecting city lights (60 Hz) and lightning storm impulse activity. SARAS may also prove useful for Space Situational Awareness (SSA) and Rendezvous and Proximity Operations (RPO) as a tool for detecting internal and nearby satellite vibrations such as antenna deployments and thruster firings, nearby glinting space debris along with the presence and characterization of rendezvous and inspector satellite activity. Refueling leaks, bearing vibrations and other activity could potentially be aurally detected during on-orbit servicing. There are also some interesting acoustic detection possibilities using SARAS on planetary rovers related to weather and geophysical phenomena.

SARAS Interface

Figure 18:
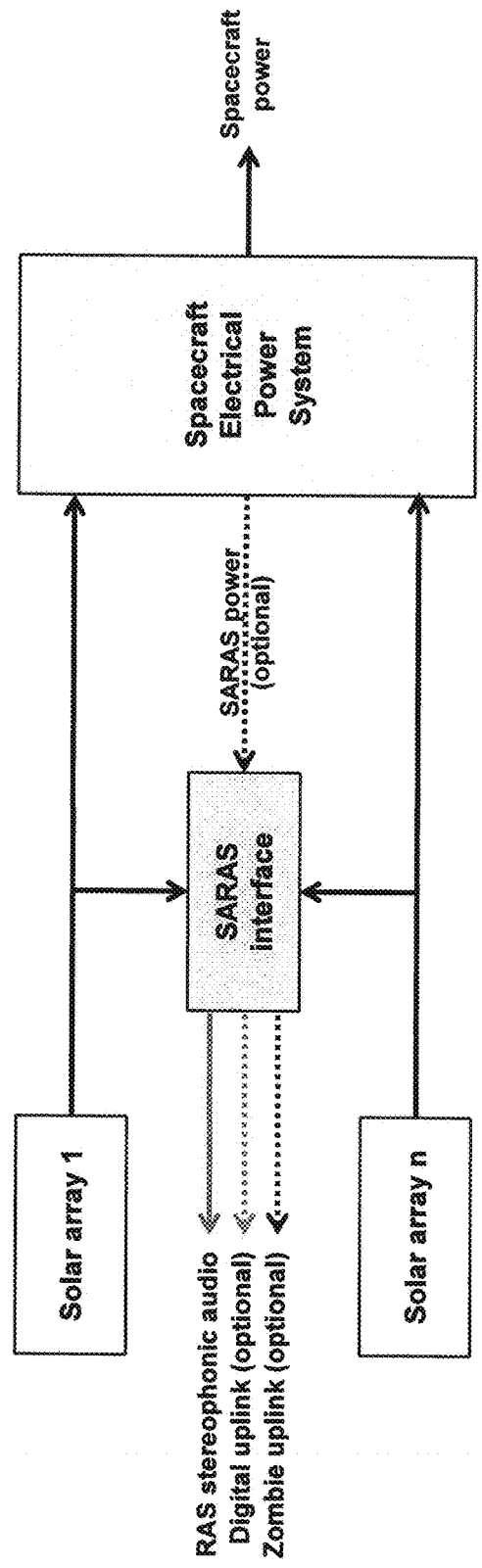
FIG. 18 is a SARAS block diagram, which shows a solar array interface module ("SARAS interface")

Adding SARAS capability to a spacecraft requires the addition of a relatively simple solar array interface module 1800, as depicted in FIG. 18. This module connects directly to the solar arrays and outputs the recovered audio signal. As part of this, the SARAS interface can directly and independently scavenge DC power from the solar array. As shown in FIG. 18, in this example embodiment, the module 1800 provides an interface between solar arrays 1810 (denoted: Solar array 1 . . . Solar array n) and the Spacecraft Electrical Power System 1820, the SARAS interfaces additionally being configured to generate RAS stereophonic audio, Digital uplink (optional), and Zombie uplink (optional).

Figure 19:
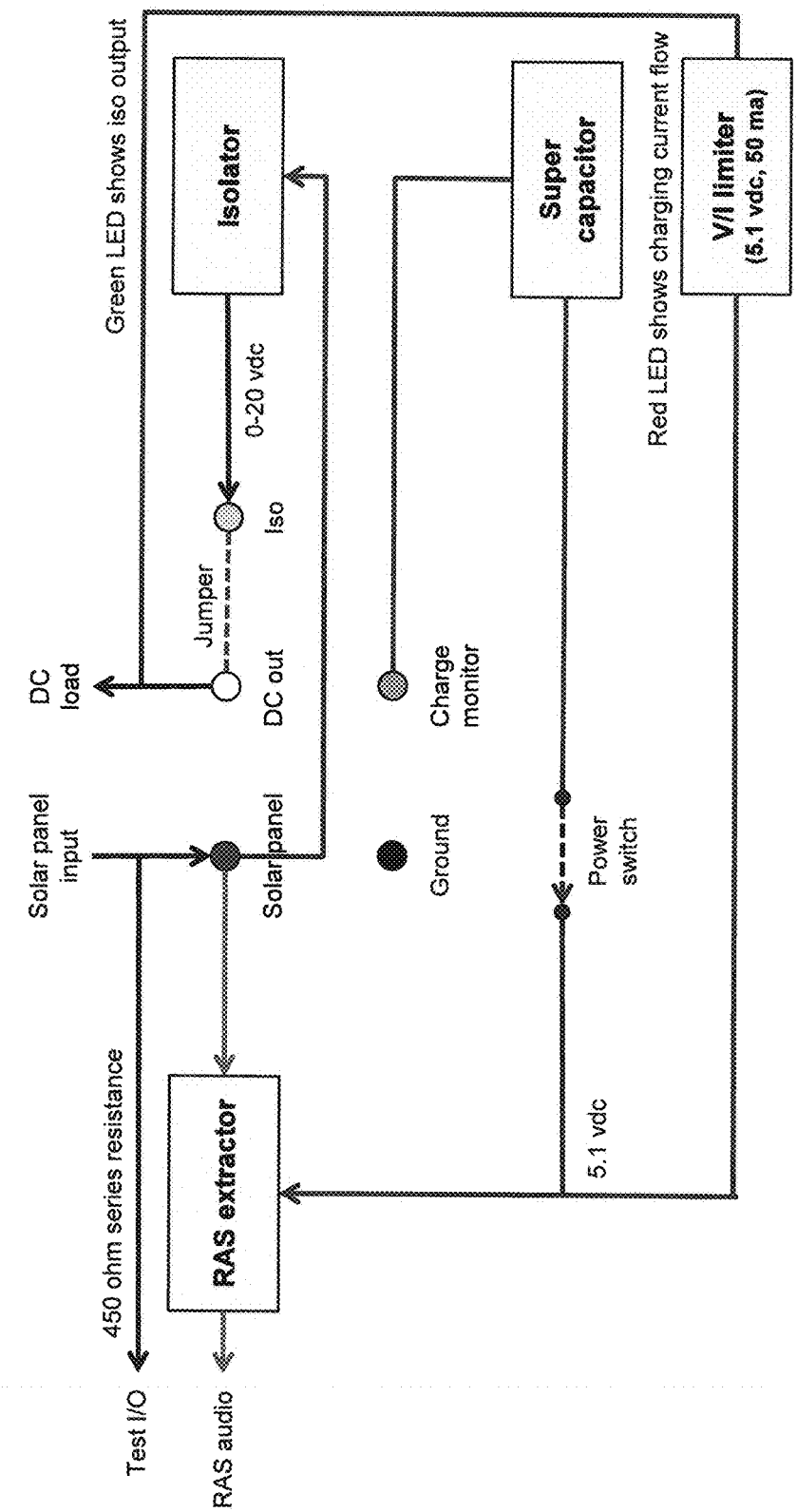
FIG. 19 is a circuit diagram of an example SARAS (test) interface unit with power scavenging electronic circuitry.

SARAS observables using conventional spacecraft solar arrays
  Natural terrestrial observables: Lightning, meteors, space debris reentry, (maybe) aurora
  Man made terrestrial observables: City lights, (maybe) fireworks, laser propagation tests
  Internal situational awareness: antenna and boom deployments, thruster firings, debris shedding, impacts
  Space situational awareness (SSA): rendezvous & proximity operations (RPO), deployment operations
SARAS as a low bit rate optical communication receiver
  Optical com: ground (laser uplink), nearby satellites (LED uplink)—could replace a RF command uplink for a picosat
  Zombie uplink: Ground based lasercom uplink to provide an omnidirectional backup command link & CPU reboot The SARAS interface power requirements are low and tend to be radiation-tolerant due to relatively simple circuitry and low data rates. The SARAS interface can include power scavenging electronic circuitry and/or electronics that extract the multichannel audio signals. FIG. 19 is a circuit diagram of example SARAS (test) interface unit with power scavenging electronic circuitry 1900 including a RAS extractor 1910, an Isolator 1912, a Super capacitor 1914, and a V/I limiter 1916 (e.g., 5.1 vdc, 50 ma), configured as shown. The power scavenging electronics are or can be generally very simple, typically an isolation resistor (between Iso and DC out) to reliably insure low current drain followed by a battery or supercapacitor charging circuit (such as shown in FIG. 19). Charging circuitry functional requirements can include, for example:

Cannot short out the solar arrays or otherwise cause a spacecraft failure
  Charger cannot produce audio frequency interference or EMI Referring still to FIG. 19, the electronic unit (denoted "RAS extractor") that extracts an audio signal from the solar array, in general terms, is essentially a low noise preamplifier connected directly to the solar array. The array output also passes through an isolation diode (denoted "Isolator") to the spacecraft power system. The diode is already present in the spacecraft power system to prevent reverse current flow through the solar array. This diode isolates the solar array from the power system at night so that solar array output is only passed to the preamplifier. During daytime the sensitivity is reduced as the spacecraft current load also attenuates any audio frequency signal components.

Multiple audio channels are extracted by using multiple preamplifiers, each attached to a different solar array.

SARAS can be powered via scavenging but this is not necessary or preferred in all cases. It can be powered by any other power source including the standard satellite power distribution system. Scavenging advantages: Independence of spacecraft power for emergency recovery; and simpler spacecraft interface. Spacecraft power advantages: better power management; and power switched off when SARAS is not needed.

Figure 20:
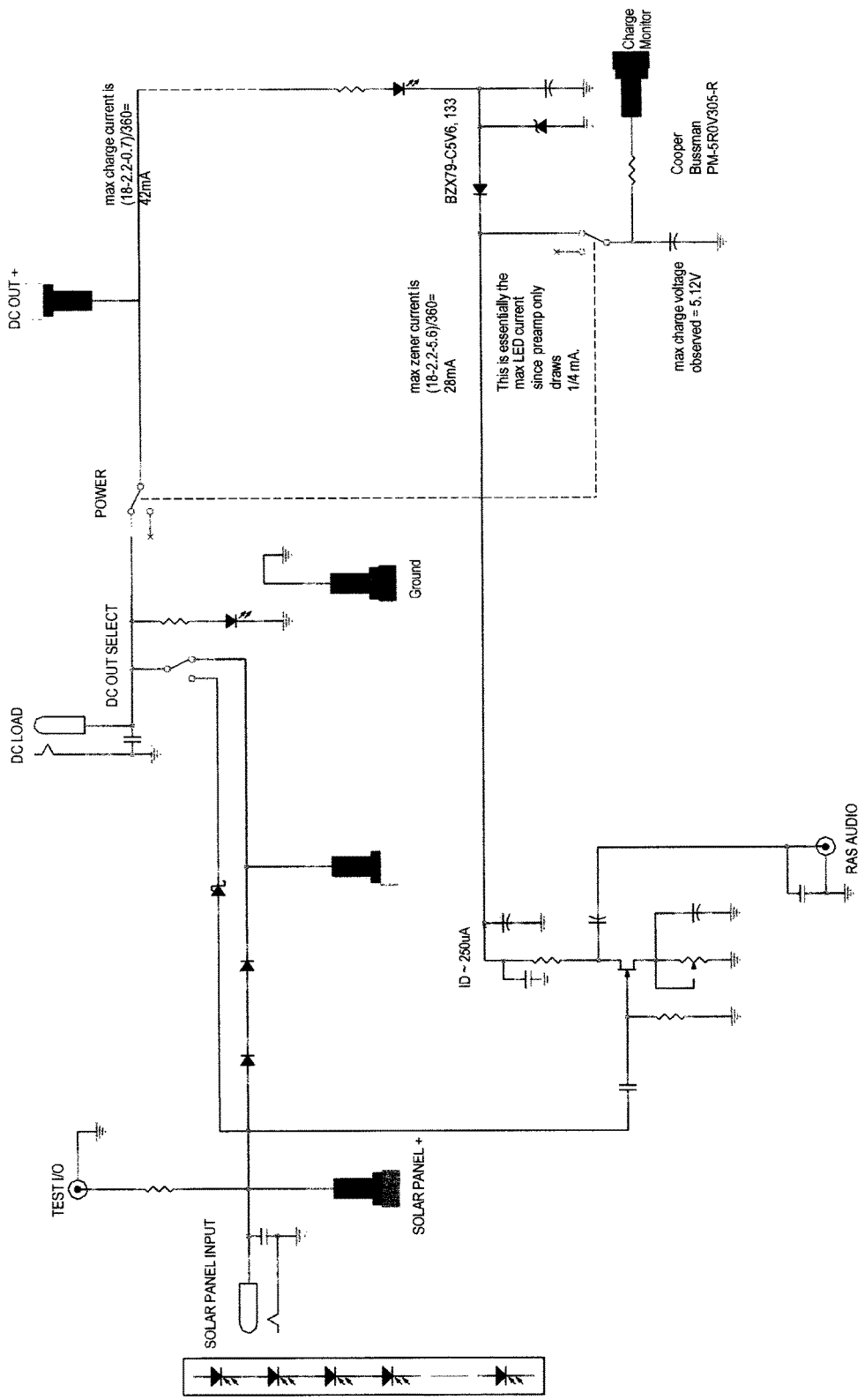
FIG. 20 shows SARAS interface unit circuitry.

SARAS interface unit circuitry can be provided, for example, as shown in FIG. 20. In this example embodiment/implementation, the preamplifier is at the bottom left center (circuitry including Q3). The power scavenging circuitry is at the right side (R16, D24, D25, D27, and C23). The power is stored in the supercapacitor C26 (e.g., 3F, 5.0$v$). The diode D17, or the diodes D19 and D20 (in series as shown), are used to isolate the solar panel at night from the load. The switch (SW2) selects between the different diodes (diode paths) providing different voltage drops, respectively, for test support.

The SARAS interface can be extended to include an independent tone or other audio decoder to extract a low bit-rate digital uplink from a terrestrial or space-based modulated laser. The resulting low data-rate command uplink can be for general use. One interesting example is to provide a simple way to command solar-powered tumbling nano- or picosats while also eliminating the need for antennas, receivers and other RF command-uplink hardware. This would be of even more interest with laser-propelled spacecraft such as the "Breakthrough Starshot" project (see: https://breakthroughinitiatives.org/Concept/3). Because SARAS can be self-powered, uses simple robust circuitry and provides an independent uplink capability for a tumbling spacecraft, this technology may be useful for recovering zombie satellites.

Figure 20A:
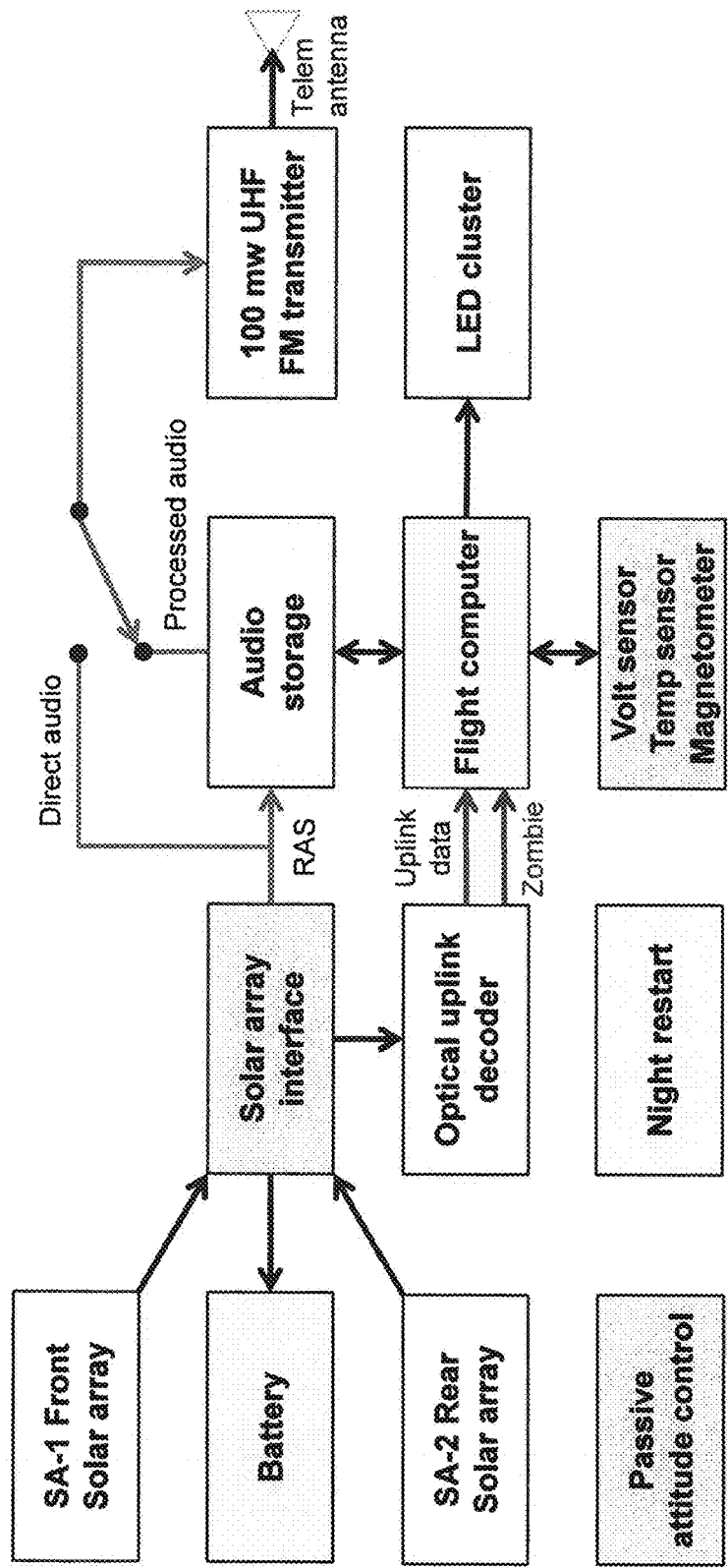
FIG. 20A is a diagram showing an example of how a solar array interface can be provided to (integrated with) a CubeSat and components thereof.

FIG. 20A is a diagram showing an example of how a solar array interface can be provided to (integrated with) a CubeSat and components thereof. The resulting solar array interface-augmented system/device (in this example, denoted "SARASat ¼U CubeSat") includes solar arrays (denoted "SA-1 Front Solar array" and "SA-1 Front Solar array"), a battery, a passive attitude control (module or other subsystem), a solar array interface, an optical uplink decoder, a night restart (module or other subsystem), an audio storage (device), a flight computer, sensor/detection devices (in this example: volt sensor, temp sensor, magnetometer), a transmitter (in this example, denoted "100 mw UHF FM transmitter), and a visual indicator (e.g., LED cluster), configured as shown.

The following are miscellaneous notes regarding SARASat ¼U CubeSat (FIG. 20A):
1. Baseline SARASAT dimensions are 100×100×25 mm=¼ Ucubesat
2. Natural terrestrial observables: Lightning, meteors, space debris reentry, aurora?
3. Man made terrestrial observables: city lights, fireworks?, laser propagation tests
4. Space situational awareness (SSA): initial deployment, rendezvous operations, inspector satellite detection
5. Optical com: ground (laser SA receive, LED xmit), nearby satellites (LED SA receive, LED xmit), zombie
6. Possible EPS components: SpectrolabXTJ, TASC, TrisolXWings, MAX1771, LTC3106
7. Possible RF components: Radiometrix, AxsemAX5043 RF, Silicon Labs EZR32LG or SI4463

SARAS (and Spacecraft/Satellite Solar Arrays): Adapting Spacecraft or Satellite Solar Arrays for Use as Detectors/Sensors and/or Receivers Thus, in example embodiments and implementations, a method for obtaining or providing listening or detection of audio frequency modulated optical energy, the method includes: adapting a spacecraft or satellite or other (terrestrial, planetary, etc.) solar array with an interface including electronics operatively connected to individual or groups of elements of the array to provide the solar array with remote acoustic sensing capability responsive to audio frequency modulation of an optical signal, the interface additionally being configured to generate outputs providing, or that facilitate obtaining, information content extracted from sensed audio frequency modulated optical signals, said information content corresponding to that of the sensed audio frequency modulated optical signals. The outputs are or include an acoustic signal or acousto-optic signature. The spacecraft or satellite solar array includes or can include solar panels. The methodologies and technologies described herein can be used with large spacecraft solar arrays (FIG. 21A) such as those on the International Space Station (ISS). In example embodiments and implementations, the method further includes utilizing the solar array and the interface, together as a remote acoustic sensor (RAS)-based detector/sensor and/or as a receiver, in a process or action involving one or more of: detection of planetary emissions, nearby rendezvous proximity operations (RPO), nearby inspector satellite detection, self-generated noise sensing, lightning storm detection, space situational awareness (SSA), providing a low data rate optical uplink, and zombie satellite recovery. The solar array is or can be part of a solar power station, or part of a solar powered system such as a remote weather station. In example embodiments and implementations, the method further includes utilizing the solar array and the interface, together as a remote acoustic sensor (RAS)-based detector/sensor and/or as a receiver, in a process or action involving one or more of: detection of planetary emissions; nearby rendezvous proximity operations (RPO); nearby inspector satellite detection; self-generated noise sensing such as spacecraft antenna and solar panel deployments, solar sail vibrations, reaction wheel activity, thruster firings and similar; lightning storm detection; space situational awareness; providing a low data rate optical uplink; and zombie satellite recovery. In example embodiments and implementations, the method further includes utilizing the solar array and the interface, together as a remote acoustic sensor (RAS)-based detector/sensor and/or as a receiver, in a process or action involving one or more of: in the case of high altitude balloons, detection of balloon membrane vibrations using reflected or transmitted light; in the case of solar powered aircraft, detection of wing vibrations and localized atmospheric wake turbulence; and providing a night time low data rate optical communication capability.

Thus, in example embodiments and implementations, an apparatus for obtaining or providing listening or detection of audio frequency modulated optical energy, includes: a detection/sensing device of a (small-sized) spacecraft or satellite (e.g., CubeSat), the detection/sensing device being configured to include or utilize a simple solar panel array, a telescope array (e.g., photovoltaic concentrator array) or a RAS photodetector array (and additional interfaces as described herein) to provide high sensitivity detection/sensing functionality in a small package (that is, notwithstanding the relatively small scale of the spacecraft or satellite).

Thus, in example embodiments and implementations, an apparatus for obtaining or providing listening or detection of audio frequency modulated optical energy, includes: a vehicle (e.g., a planetary rover) equipped with, modified, retrofitted or otherwise (re-)configured to include or utilize RAS and SARAS (devices/technologies) for listening to both local sounds and remote (more distant) sounds, respectively.

SARAS (and LightSail): External and Internal SARAS Observations

The recent 2015 Lightsail-A and upcoming 2017 Lightsail-2 3U CubeSat missions could have been an interesting and ideal test case for demonstrating SARAS technology. Ecliptic Enterprises Corporation is the prime contractor for both LightSail CubeSats, a private effort that is entirely funded by members and donors of The Planetary Society. Ridenoure, R., et. al, "LightSail Program Status: One Down, One to Go," Paper SSC15-V-03, 29th Annual AIAA/USU Conference on Small Satellites, Logan, Utah (2015), which is hereby incorporated by reference. Each LightSail spacecraft is outfitted with a square-shaped, four-quadrant 32 m$^2$ deployable solar sail system. LightSail A was launched into low Earth orbit May 2015 for a 24-day mission. After a flight computer crash and reboot, the CubeSat was finally able to deploy its solar sail, which increased drag causing the satellite to reenter the Earth's atmosphere several days later. LightSail 2 is scheduled for launch in early 2017.

Figure 21B:
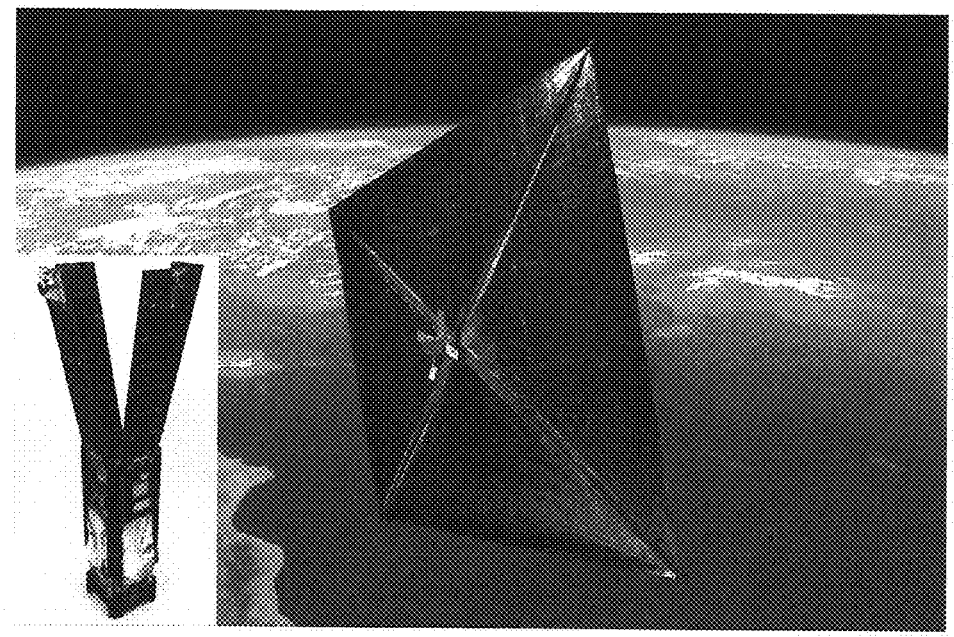
FIG. 21B shows a LightSail-A CubeSat.

The addition of a SARAS interface and audio downlink to the Lightsail CubeSat (FIG. 21B shows a LightSail-A CubeSat) could have provided additional acoustic information in an audio bandwidth downlink channel. The large solar-illuminated solar sail can alternately be considered to be very large and extremely sensitive microphone membrane. Solar membrane glints along with terrestrial night activity could have supported a variety of SARAS experiments. Solar sail deployment sounds would have been heard, with sunlight or self-illuminated glints modulated by audio-frequency resonances, binding, stiction, motor pulses and other mechanical phenomena. Any audio frequency flutter or vibration of the large solar sail membrane (FIG. 21B) has the potential to produce RAS-detectable optical modulations. With stereophonic sensing by using different solar sail quadrants (FIG. 21B), particular regions on the sail producing specific sounds can be localized. After solar sail membrane deployment, it's possible that micrometeorites, space dust or solar-wind impacts may be audible, followed later by a variety of stereophonic sounds during the atmospheric reentry process. The RAS audio can be compressed and downlinked in a much narrower bandwidth than video using amateur radio technology to provide wide real-time geographical coverage. In the case of spacecraft, meteor or other high-speed atmospheric re-entries, it is likely that plasma audio frequency-modulated optical and radio emissions would also be present and would be detectable using either optical or RF RAS techniques. Thus, SARAS (and LightSail) have significant potential for providing both External SARAS observations and Internal SARAS observations:

External SARAS observations
   Natural: Lightning, meteors, aurora
   Man made: City lights, fireworks, nearby space objects (SSA)
Internal SARAS observations
   Solar sail deployment sounds
   Attitude control system sounds (including intentional sounds)
   Micrometeorites & space debris impacts
   Atmospheric reentry sounds During the Lightsail A mission, the flight control computer failed due to a software bug. See Ridenoure. The spacecraft then became a zombiesat as there was no way to reboot the flight control computer. Fortunately a random cosmic ray hit (the satellite electronics) a few days later which did eventually reboot the computer, allowing the mission to continue. SARAS, by virtue of its simple electronics powered directly and independently by the solar array, may provide a useful alternative approach and at least in relation to (volitionally/proactively) resetting the flight computer, the electrical power system or a RF communications uplink. Here, a ground-based audio-frequency modulated laser could have been used to command the spacecraft reset. The Lightsail A solar arrays are illuminated over a wide range of angles so a reboot command may be possible even while the spacecraft is rapidly tumbling.

RASSat Spacecraft Design

Figure 23:
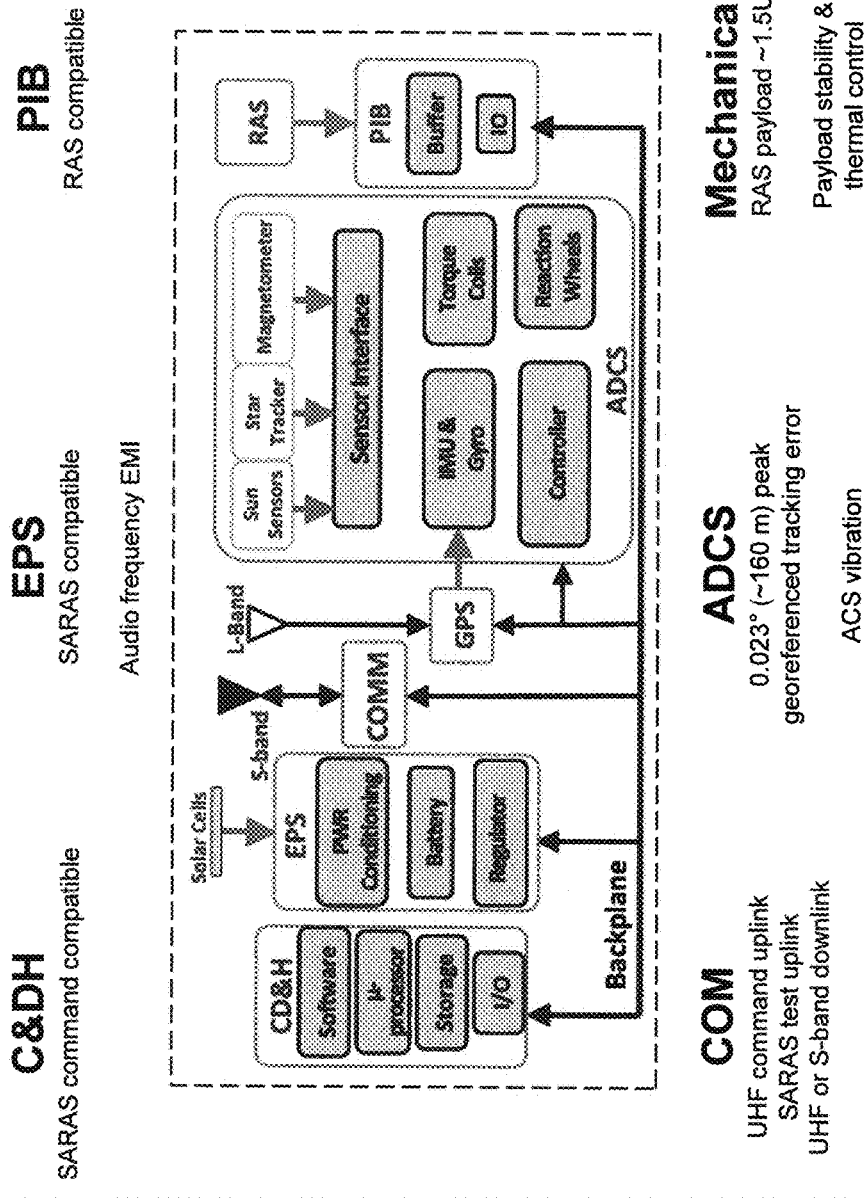
FIG. 23 is a block diagram of an example RASSat satellite bus.

A RASSat spacecraft bus can be based, for example, on a series of 3U CubeSats developed at Montana State University (MSU) including the successful Technology Readiness Level (TRL) 9 (1.5U) FIREBIRD bus currently delivering orbital measurements of relativistic electrons in support of its National Science Foundation (NSF) mission (see Klumpar, D. M., et al., "Flight System Technologies Enabling the Twin-CubeSat FIREBIRD-II Scientific Mission," Paper SSC15-V-06, 29th Annual AIAA/USU Conference on Small Satellites, Logan, Utah (2015), which is hereby incorporated by reference) and the IT-SPINS bus currently in development (See https://ssel.montana.edu/itspins.html, which is hereby incorporated by reference). An overview of the RASSat spacecraft interconnect architecture between the bus, RASSat sensor payload, and attitude control elements is shown in FIG. 23. The RASSat satellite bus 2300 (denoted in dashed lines), in this example embodiment, has or is provided with a Backplane 2302, a Command and Data Handling Subsystem (C&DH) 2310 (that includes Software, µ-processor, Storage, I/O), an Electrical Power System (EPS) 2320 (that includes PWR Conditioning, Battery, Regulator), a COMM (S-band interface), a GPS 2330 (including L-Band interface), an Attitude Determination and Control Subsystem (ADCS) 2340 (that includes Sensor Interface with Sun Sensors, Star Tracker and Magnetometer; the Sensor Interface also including IMU & Gyro, Controller, Torque Coils, and Reaction Wheels), and a Payload Interface Board (PIB) 2350 (that includes Buffer and I/O), configured as shown. The RAS sensor payload interfaces to the spacecraft for data handling and for receiving switched regulated power via the Payload Interface Board (PIB). Spacecraft systems support pointing control and knowledge via the Attitude Determination and Control Subsystem (ADCS). Power collection, conditioning and storage is handled by the Electrical Power System (EPS). The GPS receiver provides position and absolute timing.

By way of example, these subsystems (further discussed in the sections below) are integrated into a mechanical structure as dynamically-balanced 3U spacecraft with star tracker, dual Sun sensors, and a UHF (or S-band) antenna deployed perpendicular to the 3-axis stabilized nadir-pointing spacecraft.

Mechanical Subsystem

In at least some example embodiments/implementations, RASSat is fully compliant with the Cal Poly 3U CubeSat design specification, and is designed for deployment compatibility with the most commonly used CubeSat carrier/deployer systems. The primary RASSat spacecraft structure includes (or consists of) a 3U CubeSat solid-wall structure, e.g. from Pumpkin (modified for RASSat). Standard mounts can be used to mount the spacecraft subsystem elements. Custom mounts and cut-outs are utilized for the sensor payload module and UHF dipole deployer. Sufficient interstitial volume and mass margin are provided to accommodate the addition of vernier mass elements during static spacecraft load balancing. Other than the twin 'carpenter's ruler' UHF dipole antennas, no deployables are required. Antennas are stowed during launch in an external wrap-around configuration and restrained by a nylon filament (or the like) which is severed by melting upon autonomous operation once deployed a safe distance from the carrier/deployer system.

Command and Data Handling Subsystem (C&DH)

At the heart of the spacecraft bus is the CD&H system, which includes dual 32-MHz microchip PIC-24 processors, and 8 GB of non-volatile flash memory for bus data, payload data, stored command sequences and system status information. The CD&H implements an external watchdog (implemented within the EPS and further described below) for latch-up mitigation, and internally tracks system state history to aid operational recovery from inadvertent resets. The MSU-designed Space Flight Computer (SFC) includes/contains, for example, a 64-Gb (8-GByte) NAND flash storage for bus and payload data. The RAS payload operates at significantly higher data rates than the particle detectors on FIREBIRD, yet the dual processors have ample margin for processor load and memory utilization. The RAS camera data rate is ~30 to 60 Mbps while recording a scene. This being so, a 20-second long scene for example could easily produce a 1-Gb downlink file if the full high-speed video is stored on board for later transmission. Mitigations for this are discussed below. In example embodiments and implementations, video is processed and stored in the payload module.

Flight Software

The flight software design also leverages FIREBIRD/IT SPINS heritage code and, in this example, further includes (mission specific) code for control of the RAS payload and support for zombie restart tests. The flight software has the ability to store and execute sequences of commands that are time-tagged for boot up, spacecraft/payload commissioning, and normal mission operations. Command tables are initially loaded before launch and can be uploaded and saved for future execution during the mission based on time or telemetry cues. C&DH flight software can be implemented, for example, in the C language as an application in the Micrium μLC/OS-II operating system. The flight software is designed to be highly modular and configurable.

On each boot-up, the flight software executes the first stored sequence in memory. This boot sequence configures the spacecraft by executing other configuration sequences. If a change to the spacecraft configuration needs to be made on-orbit, a replacement sequence may be uploaded for execution on subsequent boots.

Additionally, the C&DH flight software includes a telemetry monitor (TLMMON) module, which allows alarm limits to be set for specific telemetry points. If the alarm is exceeded, a command sequence may be started or halted, depending on the configuration. The TLMMON is used to enter safe mode if the battery voltages drops too low and end GPS data runs if the GPS temperature exceeds a critical limit. The TLMMON module principally relies on the telemetry manager (TLMMGR) module, which is responsible for routing telemetry within the spacecraft. When new telemetry is received from a subsystem, the TLMMGR module routes it to the configured output, such as COMM, the Ground Support Equipment (GSE) port, or memory. TLMMGR is also used to route telemetry to specific outputs (e.g., at a configured cadence or in some other controlled/timed manner).

Electrical Power System (EPS)

The Electrical Power System (EPS) includes (or consists of), for example: solar panels, Li-ion batteries and a power storage and distribution system (e.g., such as the FIREBIRD and IT SPINS system [***CITATION re "FIREBIRD and IT SPINS" system(s), if available]). This so-called Phoenix EPS is based on a direct energy-transfer system; the battery pack is directly connected to the solar arrays via protection diodes. RASSat's body-mounted panels host 27 Emcore triple-junction cells that, in turn, charge a set of two Li-ion batteries to supply the spacecraft with 8.4 V of unregulated power. The EPS provides two switchable 3.3V and 5V rails in addition to three switchable unregulated bus lines and disables all spacecraft loads until the required 30-min period after ejection from the carrier/deployer system.

The EPS power control functionality provides high-efficiency direct energy transfer from all solar array inputs (e.g., from all four of an array having four solar cells) and includes a shunt to dissipate excess energy in the system while operating in conjunction with battery charge regulators and overcharge protection circuitry. The latter circuit disconnects the battery cells from the system bus whenever the bus exceeds a set (or otherwise determined) voltage. If the battery is fully charged and the solar arrays are still providing power, the batteries are disconnected from the system and the solar array is used to power the entire spacecraft.

Another feature of the Phoenix EPS is the hardware WatchDog Timer (WDT). This WDT is implemented using basic logic gates that count up to 12 hours then power cycle the entire spacecraft for 10 seconds. This 12-hour reset is used to resolve any single-event upsets due to radiation strikes or software bugs (errors).

The SARAS circuitry interfaces directly to the solar arrays, is self-powered and produces multichannel audio signals along with low rate-data recovery, both of which are passed to the RAS package. SARAS is sensitive to internal spacecraft audio-frequency vibrations as may be caused by momentum wheels.

In an example embodiment/implementation, the RAS sensor payload module draws ~2 Watts during standby and ~3.5 watts during signal acquisition and recording. Other significant power use is likely from the ADCS (~1.5 to 3.5 Watts) and downlink transmitter (~2-3 Watts).

Communication Subsystem (COMM)

Sensor module data drives the RASSat COMM performance requirements. The RAS payload generates high-definition 1080p30 or 720p30 video stream with compressed stereo audio at 30 to 60 Mbps and with a typical 30-second scene recording duration. The data is stored locally in the sensor payload module producing a 1-Gb scene data file. This data size can be decreased by reducing the frame rate and image size. Reducing 30 fps to 3 fps, cropping to a 25% image area and shortening the scene to 10 seconds would reduce the file size by a factor of 120; thus, 8.3 Mb of video plus 1.28 Mb of RAS audio (10 seconds of single channel RAS data at 8 Ksps/16 bit resolution) would need to be downlinked. The RAS detector can produce four audio channels with 24-bit resolution at a 48-KHz sample rate (4.6 Mbps). For the example demonstration mission described here this could significantly be reduced down to one RAS channel at 8 KHz/16-bit resolution (128 Kbps) and even further if compressed.

The heritage communications subsystem comprises an AstroDev Lithium UHF half-duplex radio operated at 19.2 kbps and a UHF-deployed dipole. This radio is at TRL 9, having been successfully used on numerous CubeSat missions. A preliminary link budget using MSU's existing ground station and a 1 W transmitter on the spacecraft (see Table 6) shows and supports the conclusion that there is sufficient power margin for both the uplink and downlink. This setup has been demonstrated to work nominally during FIREBIRD mission operations. This transmitter could downlink a 8.3 Mb file in 7.2 minutes. But other radios such as S-band should be considered so as to return a more complete data set. Higher bandwidth transmitters capable of supporting operational RASSat missions include the SpaceQuest TX-2400M S-Band transmitter (up to 5.6 Mbps) and the TUI SWIFT™ family of software-defined radios operating at either UHF or S-band frequencies.

Attitude Determination and Control Subsystem (ADCS)

In example embodiments and implementations, RASSat has or is configured to provide point and track functionality/capability, e.g., the ability to point and track fixed or slowly moving objects on Earth's surface during an overflight. ADCS operational and other requirements can include, for example, the ADCS requirements of other medium-resolution optical remote-sensing satellites. In an example embodiment/implementation, the RASSat camera horizontal field of view is 0.34° (2.4 km) with a 0.23° (1.6 km) RAS field of view. The spacecraft should ideally be able to point an order of magnitude better providing a peak georeferenced pointing error on the order of 0.023° (~160 m). The RASSat ADCS pointing and control requirements are met by the Blue Canyon Technologies' 0.5U XACT 3-axis, stellar-based CubeSat ADCS (See http://bluecanyontech.com/portfolio-posts/attitude-control-systems/), capable of providing better than 0.007° pointing accuracy in each of 3-axes and has a slew rate capability of >10°/second. The XACT star-tracker-based system masses at 0.91 kg and uses 2-3 Watts (mode-dependent) in operation.

Thus, in example embodiments and implementations, a device for obtaining or providing listening includes: an interface (including electronics) configured such that when operatively connected to individual or groups of elements of one or more solar arrays (or cells, photodetectors, or other optical sensor device), respectively, the interface and the solar array(s) together function, responsive to sensed audio-frequency light intensity fluctuations of an optical signal received by (incident upon) said solar array(s), as a remote acoustic sensor (RAS)-based device (e.g., a RAS-based detector/sensor and/or receiver). In example embodiments and implementations, the interface when operatively connected to the solar array(s) facilitates a process or an action involving one or more of: detection of planetary emissions; nearby rendezvous proximity operations (RPO); nearby inspector satellite detection; self-generated noise sensing such as spacecraft antenna and solar panel deployments, solar sail vibrations, reaction wheel activity, thruster firings and similar; lightning storm detection; space situational awareness (SSA); providing a low data rate optical uplink; and zombie satellite recovery.

Thus, in example embodiments and implementations, a method for obtaining or providing listening includes: utilizing one or more solar arrays and a solar array interface (including electronics) operatively connected to individual or groups of elements of the solar array(s), respectively, the interface and the solar array(s) being configured to function, responsive to sensed audio-frequency light intensity fluctuations of an optical signal received by (incident upon) said solar array(s), together as a remote acoustic sensor (RAS)-based device (e.g., a RAS-based detector/sensor and/or receiver). In example embodiments and implementations, the method further includes using circuitry of the interface to scavenge power from the solar array to provide an alternative power source for the electronics. In example embodiments and implementations, the method further includes utilizing an audio downlink of (or associated with) the solar array interface to provide acoustic information (extracted from sensed audio frequency modulated optical signals) in an audio bandwidth downlink channel. In example embodiments and implementations, the method further includes storing the acoustic information on the spacecraft and/or further processing the acoustic information (e.g., such as the zombie case).

Thus, in example embodiments and implementations, a device for providing a backup command link to a spacecraft includes: for a spacecraft having one or more solar arrays, a solar array remote acoustic sensing (SARAS) interface (including electronics) configured such that when operatively connected to individual or groups of elements of said solar array(s), respectively, the SARAS interface and the solar array(s) together function, responsive to sensed audio-frequency light intensity fluctuations of an optical signal received by (incident upon) said solar array(s), as a lasercom receiver, the SARAS interface having a self-powered (multichannel) audio signal extractor and a (digital) command decoder configured respectively to extract and process command information from an optical command signal incident upon said solar array(s) to control the spacecraft independent of whether spacecraft power is available (and independent of whether the spacecraft has operational command uplink capability). In example embodiments and implementations, the SARAS interface is configured to restore operational command uplink capability to the spacecraft in response to receiving a zombie restart command.

Thus, in example embodiments and implementations, a method of remotely commanding a spacecraft, the method includes: for a spacecraft having one or more solar arrays and a solar array remote acoustic sensing (SARAS) interface (including electronics) operatively connected to individual or groups of elements of the solar array(s), respectively, the SARAS interface and the solar array(s) being configured to function as a lasercom receiver responsive to sensed audio-frequency light intensity fluctuations of an optical signal received by (incident upon) said solar array(s), the SARAS interface having a self-powered multichannel audio signal extractor and a (digital) command decoder, commanding the spacecraft by directing a (low data rate) optical command signal incident upon said solar array(s), the optical command signal including command information extracted by the signal extractor and processed by the command decoder to control the spacecraft independent of whether spacecraft power is available (and independent of whether the spacecraft has operational command uplink capability). In example embodiments and implementations, commanding the spacecraft includes utilizing a ground-based lasercom uplink to provide a (an omnidirectional) backup command link to the spacecraft. In example embodiments and implementations, commanding the spacecraft includes utilizing a ground-based audio-frequency modulated laser to generate the optical command signal. In example embodiments and implementations, commanding the spacecraft includes generating the optical command signal such that the command information includes one or more of a CPU reboot command, a flight computer reset command, a spacecraft reset command, and a zombie restart command (that restores operational command uplink capability).

RASSat Mission Design

For purposes of this discussion, the baseline mission design is assumed to be for a RASSat technology-demonstration mission in LEO, starting with RASSat deployment from the ISS via the well-proven pathway to orbit offered by Nanoracks. (http://nanoracks.com/) The RASSat Mission Control Center is assumed to be at MSU (~40 deg. North latitude). Such an orbit (and orbit lifetime) satisfies the top-level RASSat mission and system objectives defined above.

For the tech-demo mission design, several RAS observing scenarios were defined to facilitate further mission analysis:

Repeatedly observe two specific geographic locations on the ground, one featuring natural phenomena of interest and the other human-made phenomena. The respective locations chosen were Mauna Loa in Hawaii (occasionally experiencing active eruptions and lava flows) and Disneyland in Anaheim, Calif. (featuring ~15-minute fireworks shows every evening at 9:30).

Repeatedly observe locations on water surfaces where the glint from the reflected disc of the Sun can be captured.

Observe other space objects (e.g., ISS) on a targets-of-opportunity to better characterize RAS for SSA applications.

Observations of Terrestrial Phenomena

Commissioning of the spacecraft will consume no more than three weeks. Following this initial check-out phase, a nominal 6-month primary mission duration is assumed. Should orbital-lifetime predictions support it, an extended mission phase of a few weeks or months could be considered.

A typical orbit achieved was modeled after an ISS CubeSat deployment: a circular orbit that decayed from 415 km altitude to 365 km altitude in six months, covering+/−51.6 deg. latitude every 92-minute orbit. Orbits were modeled based on actual CubeSat deployments from the Nanoracks launcher during July, 2015.

Although the satellite has line-of-sight access to the targets, valid access was constrained to those that were in an average 0.25 deg. field of view, at least 30 seconds long, had the satellite at least 45° above the horizon, and had the target no more than 45° off nadir. Additionally, the maximum slew was constrained to a rate to 10°/second (although the maximum observed was about 5°/second). When constrained that the target sites must be in direct sunlight, over a six-month period there were about 64 times the RAS sensor could collect on Mauna Loa, HI and about 80 on Anaheim, Calif. (These results are from a point solution, and would vary somewhat with different initial conditions when leaving the ISS.) The results are similar when the targets are constrained to be in penumbra or umbra, with 66 collect opportunities on Mauna Loa and 96 on Anaheim.

When looking at the Sun's glint off a body of water, there are fewer opportunities than simple observation because the angle from the camera off the surface to the Sun has to be so precise. Glints were observed from the Chesapeake Bay (about 4,500 square miles) and from Lake Huron (about 23,000 square miles). With collections constrained to a minimum duration of 10 seconds, over 6 months there were 13 times to observe the glint on the Chesapeake Bay, and 120 opportunities to observe on Lake Huron.

TABLE 6

RASSat downlink power budget.

| Parameter | Nominal | Favorable | Adverse |
| --- | --- | --- | --- |
| Frequency (MHz) | 437.000 | 437.000 | 437.000 |
| Distance (km) | 600.000 | 400.000 | 1000.000 |
| Transmitter power (dBm) | 30.000 | 34.000 | 28.000 |
| Antenna circuit loss (dB) | −1.000 | −1.000 | −1.000 |
| Antenna gain (dBi) | 3.000 | 3.000 | 3.000 |
| Antenna pointing loss (dB) | −6.000 | −6.000 | −6.000 |
| EIRP (dBm) | 26.000 | 30.000 | 24.000 |
| Free space loss (dB) | −140.820 | −137.299 | −145.257 |
| Atmospheric attenuation (dB) | −0.600 | −0.400 | −1.000 |
| Receive power density (dBm/m$^2$) | −115.420 | −107.699 | −122.257 |
| Polarization loss (dB) | −3.000 | −3.000 | −3.000 |
| Receive antenna gain (dBi) | 18.000 | 22.000 | 16.000 |
| Pointing loss (dB) | 0.000 | 0.000 | 0.000 |
| Receiver circuit loss (dB) | −1.000 | −1.000 | −1.000 |
| Receiver input (dBm) | −101.420 | −89.699 | −110.257 |
| Noise spectral density (No) (dBm/Hz) | −174.000 | −184.400 | −164.000 |
| Channel bandwidth (Hz) | 25000 | 25000 | 25000 |
| Channel noise power (dBm) | −130.021 | −140.421 | −120.021 |
| Channel SNR (dB) | 28.600 | 50.722 | 9.763 |
| Shannon channel capacity (bits/sec) | 237569 | 421237 | 84702 |

Observations Supporting Space Situational Awareness

Space Situational Awareness (SSA) is the requisite knowledge to predict, deter, avoid, operate through, recover from, and/or attribute cause to the loss, disruption, and/or degradation of space services and capabilities. A main objective of SSA is to provide decision-making processes with a timely and accurate body of evidence of space object and event related behavior(s) attributable to space threats and hazards. To meet and satisfy SSA needs, the rigorous and comprehensive detection, tracking, identification, characterization, and classification of space objects and events is desired. At present, most space objects and events are understood in terms of their location and effect, and some of these are understood in terms of their physical characteristics as inferred from radars and telescopes.

The fluctuation of reflected or emitted radiation of space objects is currently used for detection, tracking, identification, characterization, and classification. If this is photon scatter, the term "light curve" or more technically, photometry, is typically used for the time-history of the observed photon flux. Photometric signatures tend to be collected at a rate of 1 Hz. This provides insight into space object size, shape, orientation, and material properties but is extremely challenging because a large inverse problem (i.e., using the results of actual observations to infer the values of parameters characterizing the system under investigation) needs to be solved.

If the photometry is collected hypertemporally (e.g. ~40 KHz), the information content in the light curve could then be converted into an equivalent mechanical wave (acoustic signature) which the human brain is good at characterizing with more refinement than optical signatures alone. Thus, the potential benefit of RAS derives from the development and maintenance of a database on all detectable space objects in terms of this acousto-optic signature. The specifics of how space objects behave as an interpreted sound could provide an order-of-magnitude or greater richness with which to uniquely identify, describe, and predict them and their behavior against threat and hazard risks. Moreover, this acousto-optic characterization and classification would allow for more rapid and meaningful detection and tracking in the presence of unresolved data.

The University of Arizona's Space Object Behavioral Sciences (SOBS) initiative (See http://sobs.arizona.edu) is attempting to quantify the Earth-orbiting human-made space object population as an ecosystem populated with classes and species of space objects, and this acousto-optic signature could be used as a form of class/specie-dependent fingerprint to further aid in the development of scientific taxonomies of this population. Targets of opportunity are or can be defined as part of the mission-design process, building windows of time into the observational plan to allow for pointing RASSat's sensors at objects of interest such as ISS, arriving/departing ISS cargo and crew vehicles, other LEO satellites passing at relatively close range, re-entering objects, rockets ascending from launch to orbit, etc. Each observation would be new and pathfinding and would add to the overall SSA database.

RASSat Integration, Testing and Launch Operations

The RASSat sensor payload module is first fully integrated and tested (functionally and environmentally) before being integrated with the RASSat bus. Flight qualification of the RASSat payload module requires optical testing in addition to the thermal, vacuum, vibration and electromagnetic compatibility testing. A visual/aural scene generator operating either with collimation optics or in a far-field mode produces calibrated sensor stimuli, and test equipment (including custom built test fixtures used to test the RASSat payload) and bus emulators serve to check out (e.g., perform various diagnostic tests) and validate payload-to-bus interfaces.

Integration and testing of the RASSat bus involve a process now very typical for 3U CubeSats, i.e., considerable subsystem and system-level functional tests in a 'flat-sat' arrangement, followed by system integration, system-level vibration and thermal-cycling tests, sometimes thermal-vacuum tests, various RF and sensor-calibration tests, and often one or more 'Day-in-the-life' tests.

The launch process can involve, for example, a proven method for getting 3U CubeSats into orbit, such as that routinely demonstrated by Nanoracks for placing CubeSats into the ISS orbit by deploying them from the end of the ISS robotic arm following transfer to ISS onboard a scheduled cargo resupply vehicle.

As in other imaging systems, larger telescope apertures will provide better acoustic detectability and resolution of more distant objects. Some of the stronger RAS signals such as lightning, fireworks and certain cultural activity should be readily observable even with the small RASSat. More sounds could be heard with a larger telescope typical of the small 1-m class Earth-imaging satellites such as those produced by Terra Bella (formerly Skybox Imaging). Another development option would be to add a RAS module to Terra Bella or other similar existing Earth remote-sensing satellites having video capabilities. Likely observable natural sounds include lightning, sprites, meteors, breaking ice flows, waterfalls, ocean surf and forest fires. Possibly observable natural sounds may include volcanos, aurorae, tornadoes, extreme weather, insect and bird swarms. Likely observable cultural sounds include city lights, fireworks, aircraft and other vehicle beacons and military activity. Possibly acoustically observable objects are vehicles, crowds, spinning objects, air and water flow, ship wakes, airports, amusement parks and similar.

Figure 22:
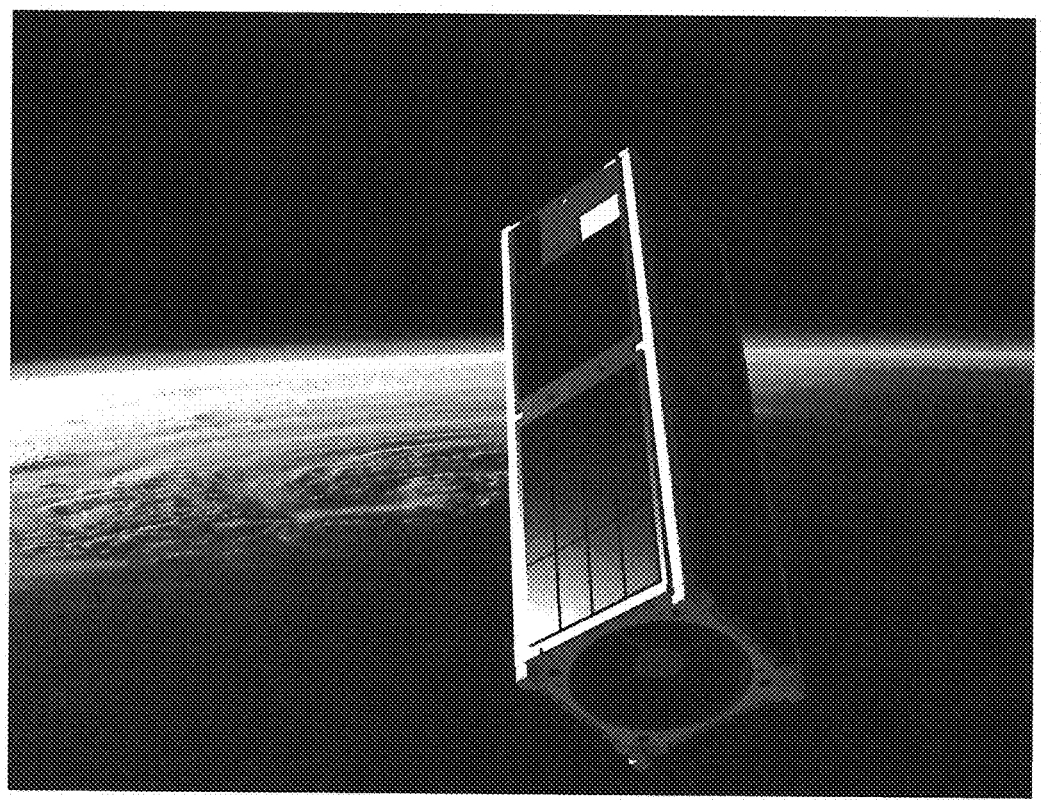
FIG. 22 shows an example RASSat in operation.

FIG. 22 shows an example RASSat in operation. This view shows the main telescope at the bottom pointing toward the terrestrial target, maybe in this case a night time fireworks display. The camera would provide a highly telescopic video view while RAS would provide multichannel audio of different parts of the scene. The side panels are Solar arrays.

Figure 24A:
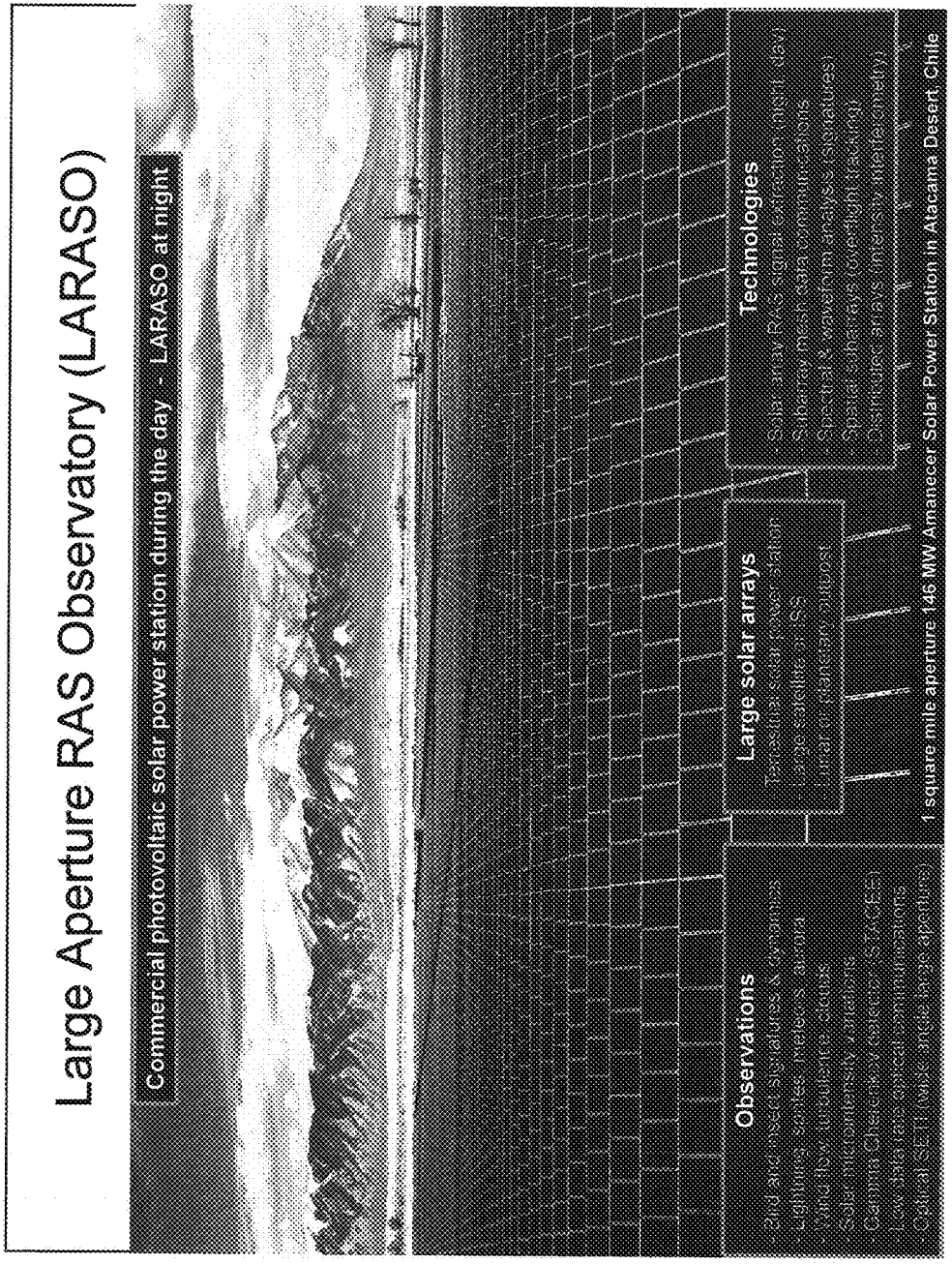
FIG. 24A shows a commercial photovoltaic solar power station during the day.
Figure 24B:
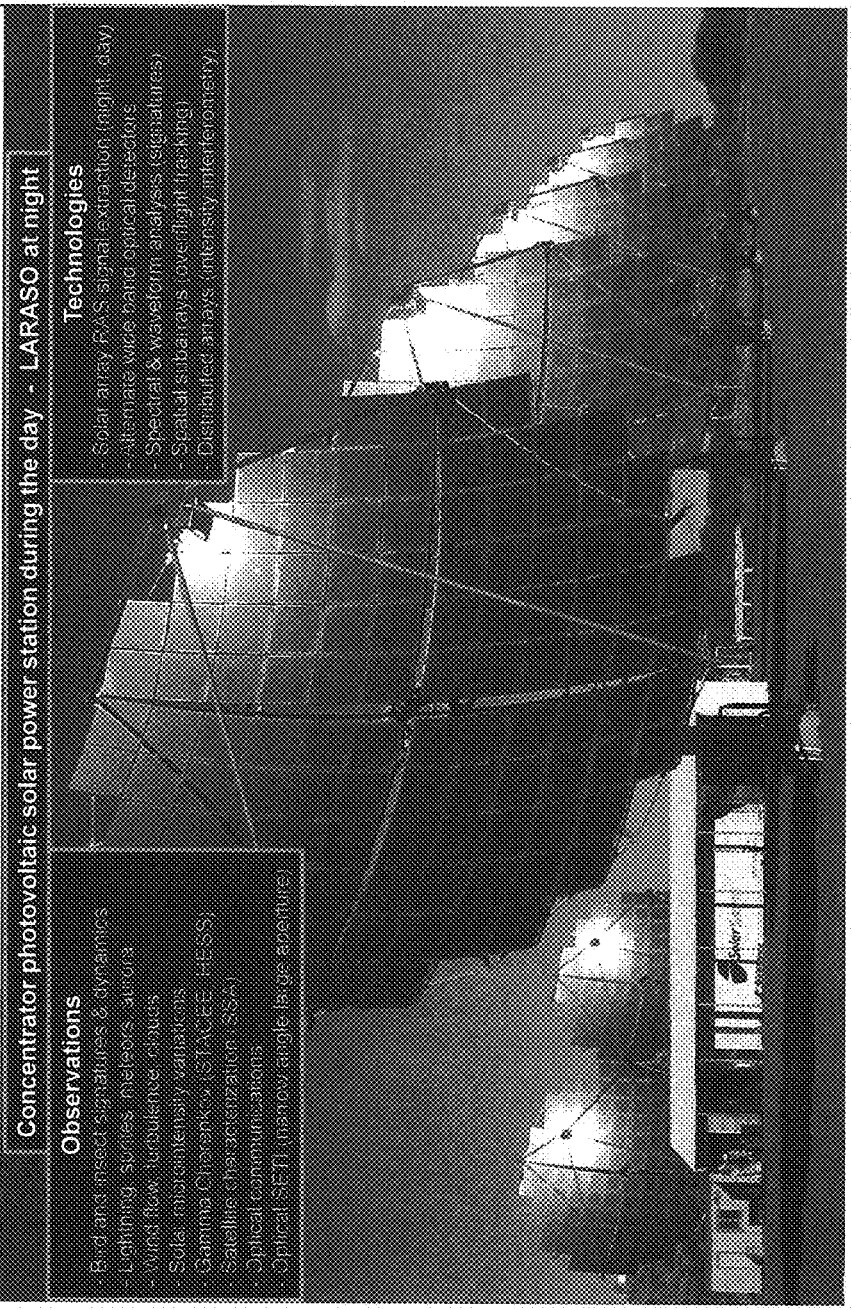
FIG. 24B shows the commercial photovoltaic solar power station (of FIG. 24A) converted for operation—at night—as a Large Aperture RAS Observatory (LARASO)

SARAS (and Solar Power Stations): Converting Large Solar Power Stations to Include Remote Acoustic Sensing Capabilities There are a variety of large solar power stations. Some of these are large (1 square mile) photovoltaic solar arrays. These form photoelectric sensor arrays with very large apertures but with hemispherical sensitivity. Each sub array (array of/among the arrays) is or can be provided with a SARAS interface that would extract audio from audio frequency modulated optical signals sensed by that particular sub array. The interface units include, for example, a mesh radio network to return the audio signals to a central location. The different arrays can be processed separately providing the ability to spatially resolve acoustic sources near a sub array (i.e., of the power station). For example, it would be possible to track insect motion from array to array. See FIGS. 24A and 24B which respectively show a commercial photovoltaic solar power station during the day and that same commercial photovoltaic solar power station (of FIG. 24A) converted for operation—at night—as a Large Aperture RAS Observatory (LARASO).

Figure 25:
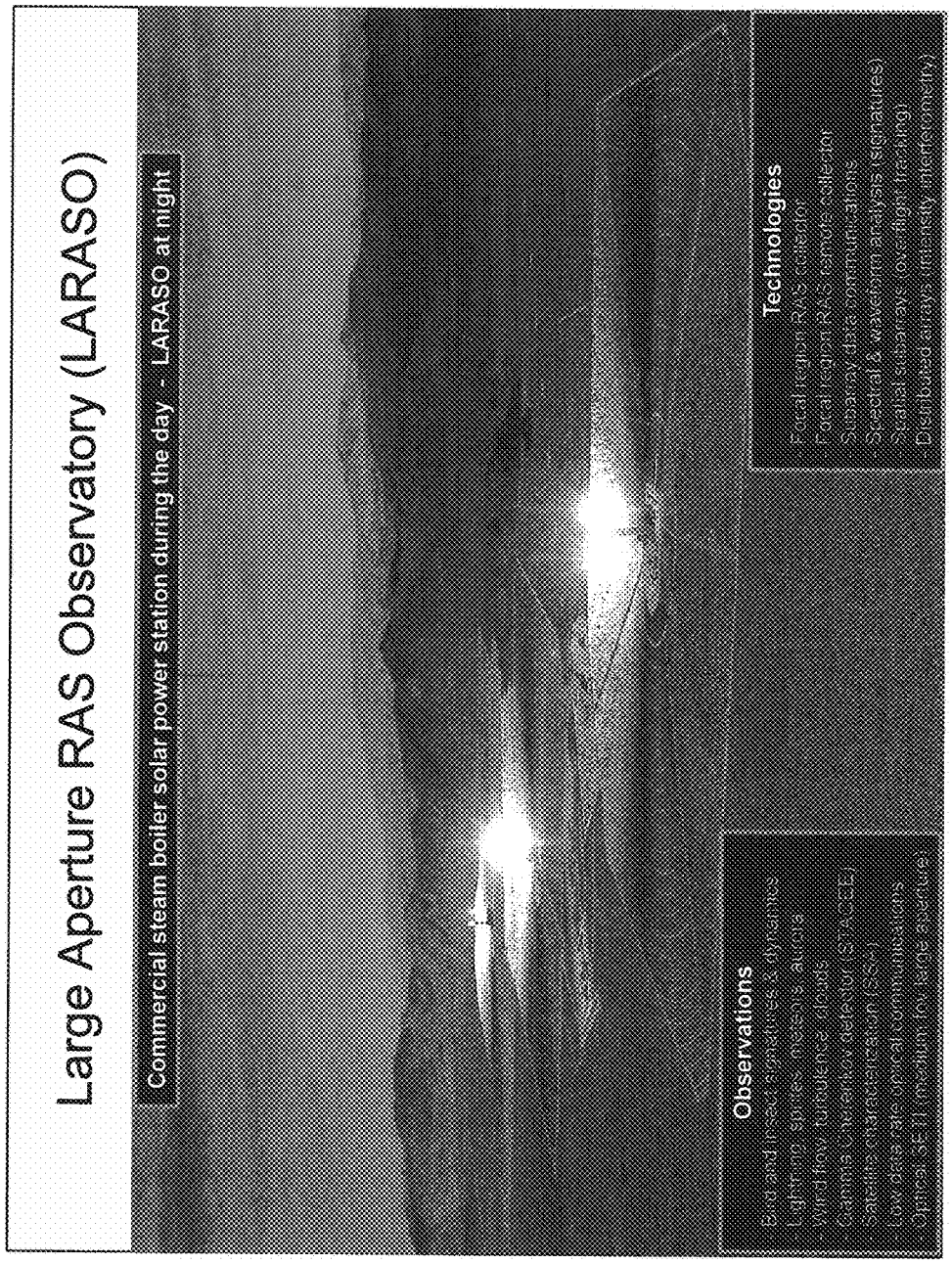
FIG. 25 shows a commercial steam boiler solar power station during the day, converted for operation—at night—as a Large Aperture RAS Observatory (LARASO).

Other solar power stations use very large parabolic mirrors to focus Sun light onto a steam boiler or other power conversion device. Solar cells or other photosensitive detectors are placed at the focal point (typically at night). This forms a large aperture RAS detector. Compared to an aperture telescope (e.g., having a 61-inch aperture), it should be possible to provide much larger apertures using modified solar power stations such as the Ivanpah facility near Las Vegas. See FIG. 25 which shows a commercial steam boiler solar power station during the day, converted for operation—at night—as a Large Aperture RAS Observatory (LARASO).

Solar cells are a type of photodetector that is normally optimized for power production. A solar array is an array of solar cells. Most commercial solar cells/arrays are limited to a brightness of a bit more than 1 Sun (~1000 watts/square meter). Some solar cells have been specifically designed to operate at much higher incident illumination levels, up to intensities of several hundred Suns or more. These are concentrator solar cells and are what are used in solar power stations that have concentrating optics. See for example: https://en.wikipedia.org/wiki/Concentrator_photovoltaics.

The small 30 element concentrator array shown in FIG. 16 uses GaAs solar cells at the focus of the 2 inch diameter cassegrain reflectors. There are other types of solar power stations that use optical concentrators but with non photo-voltaic power conversion, such as steam driven turbines, etc. See for example: https://en.wikipedia.org/wiki/Concentrated_solar_power.

In example embodiments and implements of the present invention, an approach to adding SARAS to such solar power stations is to add standard solar cells somewhere near, but outside of the primary concentrator focal region and only focus non solar energy there. There are many possible (operational) variations. One example is a large heliostat arrays focused onto a steam boiler unit. An example is the Ivanpah solar power plant along highway 15 near the California/Nevada border. See: http://www.brightsourceenergy.com/ivanpah-solar-project.

During the day, the focused solar energy power is very high at the boiler. One SARAS approach would be to put a ring of solar panels below or above the boiler and focus the helostats onto the solar panel ring only at night. The helostats focus the Sun onto the boiler during the day and refocus the night time observing target onto the adjacent solar panels. An example application would be to image geosynchronous satellites onto the solar panel ring as a means to detect satellite acoustic activity.

SARAS provides the following advantages in the context of large solar power stations.

Bird and insect signatures & dynamics—Detect and characterize flying wildlife as they fly near the solar power station. Can track activity from array to array for spatial information Lightning, sprites, meteors, aurora Wind flow, turbulence, clouds Solar microintensity variations (maybe)

Gamma Cherenkov detector (STACEE) (maybe)

Satellite detection and characterization—(parabolic mirror versions)

Low data rate optical communications

Optical search for extraterrestrial intelligence (SETI)—Photovoltaic array: wide angle detection (maybe), Parabolic collector: can be directional Some potential SARAS applications are indicated below:

Small SARAS terrestrial and planetary applications

Add insect and bird sensing and characterization to a remote solar powered weather station Use a miniaturized version of SARAS for microscopic life detection and characterization Add lighting, rain, wind and fire sensing and characterization to a remote solar powered weather station Atmosphere flow sensing in the air column between the Sun and solar panel (Earth and planetary)

Underwater sensors: wave activity, marine life

Solar optical collector versions for conventional directional RAS observations

Satellite SARAS applications

SARASAT—a ¼ U cubesattechnology demonstrator

Add SARAS to conventional satellites for sensing solar array, antenna and other deployment vibrations Observe rocket thruster firings and other venting activity Low data rate omnidirectional backup lasercomcommand uplink for cubesatsand other satellites Space Situational Awareness (SSA)—Sensing and characterizing objects near a spacecraft Solar sail satellite deployment, ACS activity, debris impacts and reentry acoustic activity Space debris sensing in the optical column between the Sun and satellite (motion may be too fast for audio?)

Large Aperture RAS Observatory (LARASO)

Insect, bird, aircraft and weather sensing and characterization

Gamma Cherenkov detector, similar to STACEE & Hanbury Brown & Twiss intensity interferometer Low data rate optical communication receiver High sensitivity micrometeorite detection Space Situational Awareness (SSA)—Satellite mechanical vibration detection Geographically distributed SARAS intensity interferometry Optical SETI (omnidirectional, but can be made directional using intensity interferometry with multiple sites)

Intensity interferometry as referred to herein is a variation of the original photon correlation intensity interferometry work done by Hanbury Brown and Twiss. The limited solar array audio frequency bandwidth and lack of spectral control prevents direct photon correlation so, as described herein, source intensity fluctuations or modulations are relied on (utilized).

Thus, in example embodiments and implementations, a method for obtaining or providing listening, the method including: for a solar power station including satellite and space variants having solar arrays, adapting one or more sub arrays of said solar arrays to include remote acoustic sensing capabilities by providing each of said sub array(s) with a solar array remote acoustic sensing (SARAS) interface having electronics operatively connected to individual elements of said sub array(s), respectively, responsive to and configured to detect audio frequency modulation of an optical signal, the SARAS interface(s) additionally being configured to generate outputs providing, or that facilitate obtaining, information content extracted from sensed audio frequency modulated optical signals, said information content corresponding to that of the sensed audio frequency modulated optical signals. The outputs are or include an acoustic signal or acousto-optic signature. The power station solar arrays includes or can include photovoltaic solar arrays. In example embodiments and implementations, the method further includes: utilizing or controlling a mesh radio network of the SARAS interfaces to return audio signals including the information content to a central location. In example embodiments and implementations, the method further includes: separately processing outputs of said sub arrays for spatially resolving acoustic sources near one of said sub arrays. In example embodiments and implementations, the solar power station, spacecraft or solar powered equipment is a photovoltaic solar power station (during the day) (the power station solar arrays including photovoltaic solar arrays), and the method further includes: utilizing the solar arrays or sub array(s) thereof and the SARAS interface(s), together as a remote acoustic sensor (RAS)-based detector/sensor (and/or receiver), in a process or action involving one or more of: satellite detection and characterization; bird and insect signatures and dynamics; lightning, sprites, meteors, aurora; wind flow, turbulence, clouds; solar microintensity variations; Gamma Cherenkov (STACEE, HESS); Satellite characterization involving or faciliting Space Situational Awareness (SSA); optical communications; optical search for extraterrestrial intelligence (SETI) utilizing narrow angle large aperture(s); solar array RAS signal extraction during night and/or day time; alternate wide band optical detectors; spectral and waveform analysis of acousto-optic signatures; overflight tracking utilizing Spatial subarrays of said (sub)arrays; and intensity interferometry utilizing distributed arrays of said solar arrays.

Alternate wide band optical detectors would support the Gamma Cherenkov (STACEE, HESS).

With regard to overflight tracking utilizing spatial subarrays of said (sub)arrays, as objects move in front of the solar array, the motion can be tracked between subarrays.

With regard to intensity interferometry utilizing distributed arrays of said solar arrays: Due to the audio frequency bandwidth limitation of the solar cells, directional information for the emission requires a large spatial separation to be able to resolve direction. In general, a 186 mile separation would be required to produce a 1 millisecond difference in arrival time for a signal arriving horizontally, down to a 0 millisecond difference for a signal arriving from the zenith. Directional information can be obtained by using widely separated solar power stations and cross correlating the outputs. The existing Cherenkov systems use fast rise time detectors so that a small detector area can still provide directional information.

In example embodiments and implementations (of the method for obtaining or providing listening), the method further includes utilizing parabolic mirrors or collectors (at night) to focus said optical signal onto the solar arrays (or other power conversion device) of the steam boiler solar power station.

In example embodiments and implementations (of the method for obtaining or providing listening), the solar power station is a steam boiler solar power station (during the day), the steam boiler solar power station including or utilizing parabolic mirrors or collectors, and the method further includes utilizing the solar arrays or sub array(s) thereof and the SARAS interface(s), together as a remote acoustic sensor (RAS)-based detector/sensor (and/or receiver), in a process or action involving one or more of: satellite detection and characterization; bird and insect signatures and dynamics; lightning, sprites, meteors, aurora; wind flow, turbulence, clouds; Gamma Cherenkov detector (STACEE); satellite characterization involving or faciliting Space Situational Awareness (SSA); low data rate optical communications; optical search for extraterrestrial intelligence (SETI) utilizing medium field-of-view (fov) large aperture(s); focal region RAS collector; focal region RAS remote collector; subarray data communications; spectral and waveform analysis of acousto-optic signatures; overflight tracking utilizing Spatial subarrays of said (sub)arrays; and intensity interferometry utilizing distributed arrays of said solar arrays.

As previously noted, other example embodiments and implementations involve technologies and methodologies for providing a microscopic implementation of a solar cell or photodetector (e.g., configuring planetary landers with microscopic RAS technology) that detects audio rate optical modulations.

Thus, in example embodiments and implementations, an apparatus for obtaining or providing listening or detection of audio frequency modulated optical energy includes a microscopic or miniature (in size) detection device configured to be responsive to audio rate optical modulations caused by microfauna and/or other microscopic life. In example embodiments and implementations, the detection device is further configured to extract of otherwise obtain or provide audio tones from the audio rate optical modulations. In example embodiments and implementations, the detection device is operatively configured with, or in relation to, a culture cell or other container, substrate or the like suitable for obtaining microfauna and/or other microscopic life observations (e.g., audio information).

Although the present invention has been described in terms of the example embodiments above, numerous modifications and/or additions to the above-described embodiments would be readily apparent to one skilled in the art. It is intended that the scope of the present invention extend to all such modifications and/or additions.

What is claimed is:

1. A method for using at least one solar array to receive audio-frequency modulated data, comprising:
   using said at least one solar array to receive at least one optical signal and to convert said at least one optical signal into at least one electrical signal, said at least one optical signal including said audio-frequency modulated data;
   extracting via an extraction circuit said audio-frequency modulated data from said at least one electrical signal, an input of said extraction circuit being connected to an output of said at least one solar array to receive said at least one electrical signal;
   using a power circuit connected via at least one isolator to said output of said at least one solar array to power said extraction circuit, said power circuit comprising an energy storage device, wherein said at least one solar array is used to charge said energy storage device, said energy storage device being used to power said extraction circuit when said power provided by said at least one solar array is insufficient to power said extraction circuit; and
   outputting said extracted data, said extracted data being used, at least indirectly, to perform at least one action;
   wherein said at least one isolator prevents any substantial flow of current from said power circuit to said output of said at least one solar array.

2. The method of claim 1, wherein said step of extracting said audio-frequency modulated data from said at least one optical signal further comprises extracting audio data from said at least one optical signal, said audio data being used to generate at least one sound on at least one electroacoustic transducer.

3. The method of claim 2, wherein said step of using said at least one solar array to receive at least one optical signal further comprises using at least a first solar array to receive at least a first optical signal and at least a second solar array to receive at least a second optical signal, wherein said first optical signal includes first audio-frequency modulated data, said second optical signal includes second audio-frequency modulated data, and said first and second audio-frequency modulated data is used to generate a stereophonic sound.

4. The method of claim 3, wherein said isolator comprises at least one diode.

5. The method of claim 1, wherein said step of extracting said audio-frequency modulated data from said at last one optical signal further comprises extracting command data from said optical signal, one of said command data and decoded command data being used to perform said at least one action.

6. The method of claim 1, wherein said at least one action is determining an orientation of a spacecraft that comprises said at least one solar array.

7. The method of claim 1, wherein said energy storage device comprises at least one of a battery and a capacitor.

8. A system for receiving audio-frequency modulated data, comprising:
   at least one solar array configured to receive at least one optical signal and to convert said at least one optical signal into at least one electrical signal, said at least one electrical signal including said audio-frequency modulated data;
   at least one solar array remote acoustic sensing (SARAS) interface connected to an output of said at least one solar array to receive said at least one electrical signal and configured to extract said audio-frequency modulated data from said at least one electrical signal, said extracted data being output from said SARAS interface;
   at least one isolator connected to said output of said at least one solar array; and
   a power circuit comprising at least one energy storage device, said power circuit configured to power said SARAS interface, said power circuit being connected to said output of said at least one solar array via at least said at least one isolator, wherein said at least one solar array is further configured to charge said at least one energy storage device;
   wherein said at least one isolator substantially prevents current from flowing from said power circuit to said output of said at least one solar array;
   wherein said output of said at least one solar array is both an input to said SARAS interface and powers said SARAS interface via said power circuit, where said SARAS interface is powered by said at least one energy storage device when said power provided by said solar array is insufficient to power said SARAS interface.

9. The system of claim 8, wherein said at least one isolator comprises at least one diode.

10. The system of claim 8, wherein said extracted data comprises audio data.

11. The system of claim 10, wherein said at least one solar array comprises at least a first solar array configured to receive at least a first optical signal and at least a second solar array configured to receive at least a second optical signal, said first optical signal includes first audio-frequency modulated data, said second optical signal includes second audio-frequency modulated data, and said first and second audio-frequency modulated data is used to generate a multi-channel acoustical output.

12. The system of claim 11, wherein said at least one SARAS interface comprises at least a first SARAS interface configured to extract said first audio-frequency modulated data from said first optical signal and at least a second SARAS interface configured to extract said second audio-frequency modulated data from said second optical signal.

13. The system of claim 8, wherein said extracted data comprises command data.

14. The system of claim 13, further comprising a decoder configured to decode said command data and a processor, said processor using said decoded command data to perform at least one action.

15. The system of claim 14, wherein said at least one action is determining an attitude of said system.

16. The system of claim 8, wherein said at least one solar array comprises at least two solar arrays mounted on a multi-sided structure, a first one of said at least two solar arrays facing away from said multi-sided structure in a first direction, and a second one of said at least two solar arrays facing away from said multi-sided structure in a second direction, said second direction being different from said first direction.

17. The system of claim 8, wherein said at least one energy storage device comprises at least one capacitor.

18. The system of claim 8, wherein said at least one energy storage device comprises at least one battery.

19. The system of claim 8, further comprising a spacecraft electrical power system, wherein said spacecraft electrical power system includes said at least one energy storage device.

20. A method for using at least one solar cell to receive audio-frequency modulated data, comprising:
using said at least one solar cell to receive at least one optical signal and to convert said at least one optical signal into at least one electrical signal, said at least one electrical signal including said audio-frequency modulated data;
using an extraction circuit to extract said audio-frequency modulated data from said at least one electrical signal, said audio-frequency modulated data comprising at least one of audio data and command data, said audio data being used to generate at least one sound, said command data being used to perform at least one action; and
using said at least one solar cell to charge at least one power storage device, said power storage device being used to power said extraction circuit when said at least one solar cell is insufficient to power said extraction circuit;
wherein an output of said solar cell is provided to both said extraction circuit, as an input, and to a power circuit via at least one isolator, which powers said extraction circuit, said power circuit comprising at least said power storage device;
wherein said at least one isolator is placed between at least said power circuit and said output of said at least one solar cell and functions to at least prevent substantial current flow from said power circuit to said output of said at least one solar cell.

\* \* \* \* \*